US011672169B2

(12) United States Patent
Mochizuki et al.

(10) Patent No.: US 11,672,169 B2
(45) Date of Patent: Jun. 6, 2023

(54) ORGANIC ELECTROLUMINESCENT ELEMENT

(71) Applicant: HODOGAYA CHEMICAL CO., LTD., Tokyo (JP)

(72) Inventors: Shunji Mochizuki, Tokyo (JP); Takeshi Yamamoto, Tokyo (JP); Naoaki Kabasawa, Tokyo (JP)

(73) Assignee: HODOGAYA CHEMICAL CO., LTD., Tokyo (JP)

( * ) Notice: Subject to any disclaimer, the term of this patent is extended or adjusted under 35 U.S.C. 154(b) by 497 days.

(21) Appl. No.: 16/480,913

(22) PCT Filed: Mar. 9, 2018

(86) PCT No.: PCT/JP2018/009163
§ 371 (c)(1),
(2) Date: Jul. 25, 2019

(87) PCT Pub. No.: WO2018/168674
PCT Pub. Date: Sep. 20, 2018

(65) Prior Publication Data
US 2021/0135116 A1 May 6, 2021

(30) Foreign Application Priority Data

Mar. 15, 2017 (JP) .............................. JP2017-049617

(51) Int. Cl.
H01L 51/00 (2006.01)
C09K 11/06 (2006.01)
H01L 51/50 (2006.01)

(52) U.S. Cl.
CPC .......... H01L 51/0059 (2013.01); C09K 11/06 (2013.01); H01L 51/0067 (2013.01);
(Continued)

(58) Field of Classification Search
None
See application file for complete search history.

(56) References Cited

U.S. PATENT DOCUMENTS

2006/0115680 A1  6/2006 Hwang et al.
2007/0293704 A1  12/2007 Kato et al.
(Continued)

FOREIGN PATENT DOCUMENTS

CN   101300214 A   11/2008
JP   7-126615 A    5/1995
(Continued)

OTHER PUBLICATIONS

WO2015190400 machine translation from Google patents downloaded Jan. 15, 2022.*
(Continued)

Primary Examiner — Clinton A Brooks
(74) Attorney, Agent, or Firm — Birch, Stewart, Kolasch & Birch, LLP

(57) ABSTRACT

An object of the present invention is to provide an organic EL element that has (1) high light emission efficiency and high power efficiency, (2) a low light-emission start voltage, (3) a low actual driving voltage, and (4) an especially long lifespan. According to the present invention, provided is an organic electroluminescent element, or organic EL element, having at least an anode, a hole injection layer, a first hole transport layer, a second hole transport layer, a light emitting layer, an electron transport layer, and a cathode, in this order, wherein the second hole transport layer contains an arylamine compound represented by the general formula (1) below, and the electron transport layer contains a pyrimidine derivative represented by the general formula (2) below.

(Continued)

Note that A in the general formula (2) represents a monovalent group represented by the structural formula (3) below.

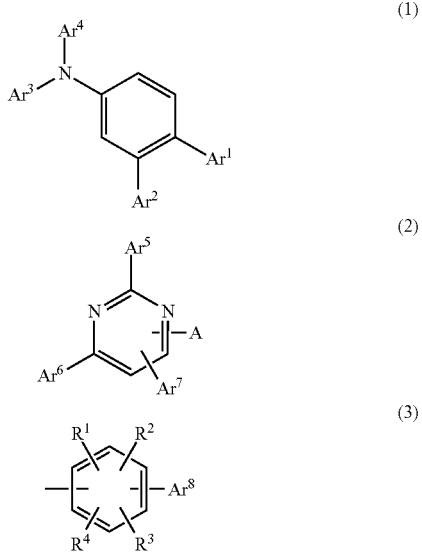

(1)

(2)

(3)

5 Claims, 54 Drawing Sheets

(52) U.S. Cl.
CPC ...... *H01L 51/0072* (2013.01); *H01L 51/0073* (2013.01); *H01L 51/0074* (2013.01); *H01L 51/0052* (2013.01); *H01L 51/5064* (2013.01); *H01L 51/5072* (2013.01)

(56) References Cited

U.S. PATENT DOCUMENTS

| | | |
|---|---|---|
| 2008/0076050 A1 | 3/2008 | Abe et al. |
| 2008/0093980 A1 | 4/2008 | Stoessel et al. |
| 2008/0124572 A1 | 5/2008 | Mizuki et al. |
| 2010/0015542 A1 | 1/2010 | Abe et al. |
| 2012/0228598 A1 | 9/2012 | Yokoyama et al. |
| 2017/0179398 A1 | 6/2017 | Yokoyama et al. |
| 2017/0186967 A1 | 6/2017 | Hayashi et al. |
| 2017/0317291 A1 | 11/2017 | Hayashi et al. |
| 2017/0358754 A1 | 12/2017 | Hayashi et al. |
| 2018/0006235 A1 | 1/2018 | Yokoyama et al. |
| 2018/0315928 A1 | 11/2018 | Hayashi et al. |
| 2019/0006591 A1 | 1/2019 | Yamaki et al. |

FOREIGN PATENT DOCUMENTS

| | | | |
|---|---|---|---|
| JP | 8-48656 A | 2/1996 | |
| JP | 3194657 B2 | 7/2001 | |
| JP | 2005-108804 A | 4/2005 | |
| JP | 2006-151979 A | 6/2006 | |
| JP | 4943840 B2 | 5/2012 | |
| JP | WO2015190400 * | 12/2015 | ........... C07D 401/10 |
| JP | WO2016/076384 A1 | 5/2016 | |
| JP | WO2017/022730 A1 | 2/2017 | |
| WO | WO 03/060956 A2 | 7/2003 | |
| WO | WO 2008/062636 A1 | 5/2008 | |
| WO | WO 2011/059000 A1 | 5/2011 | |
| WO | WO 2015/190400 A1 | 12/2015 | |
| WO | WO 2016/006629 A1 | 1/2016 | |
| WO | WO 2016/111254 A1 | 7/2016 | |
| WO | WO 2016/111269 A1 | 7/2016 | |
| WO | WO 2016/175211 A1 | 11/2016 | |

OTHER PUBLICATIONS

Extended European Search Report, dated Nov. 24, 2020, for European Application No. 18766856.1.
International Search Report (PCT/ISA/210) issued in PCT/JP2018/009163, dated Jun. 5, 2018.

* cited by examiner (1-13)

(1-15)

(1-16)

(1-17)

(1-18)

(1-25)

(1-26)

(1-27)

(1-28)

(1-29)

(1-30)

(1-67)

(1-68)

(1-69)

(1-70)

(1-71)

(1-72)

(1-145)

(2-19)

(2-20)

(2-21)

(2-22)

(2-23)

(2-24)

(2-37)

(2-38)

(2-39)

(2-40)

(2-41)

(2-42)

(2-55)

(2-56)

(2-57)

(2-58)

(2-59)

(2-60)

(2-85)

(2-86)

(2-87)

(2-88)

(2-89)

(2-90)

(2-91)

(2-92)

(2-93)

(2-94)

(2-95)

(2-96)

(4-14)

(4-15)

(4-16)

(4-17)

(4'-1)

(4'-2)

(5-1)　　　(5-2)

(5-3)　　　(5-4)

(5-5)　　　(5-6)

(5-7)

(5-8)

(5-9)

(5-10)

(5-11)

(5-12)

(5-13)

(5-14)

(5-15)

(5-16)

(5-17)

(5-18)

(5'-1)    (5'-2)

ORGANIC ELECTROLUMINESCENT ELEMENT

TECHNICAL FIELD

The present invention relates to an organic electroluminescent element, and more particularly relates to an organic electroluminescent element (hereinafter referred to simply as "organic EL element") in which a specific arylamine compound and a specific pyrimidine derivative are used.

BACKGROUND ART

Organic EL elements are self-emissive elements, are brighter than liquid crystal elements, have excellent display viewability, and can provide a clear display. For these reasons, active studies have been carried out on organic EL elements.

In 1987, C. W. Tang et al. of Eastman Kodak Company succeeded in developing a practical organic EL element by adopting a stacked layer structure in which various functions for light emission are assigned to different materials. The developed organic EL element is configured by stacking a layer of a fluorescent body capable of transporting electrons and a layer of an organic substance capable of transporting holes. This organic EL element achieves a high luminance of 1,000 cd/m$^2$ or higher at a voltage of 10 V or less by injecting positive charges and negative charges into the fluorescent body layer and producing light emission therein (see Patent Literatures 1 and 2).

Many improvements have been heretofore made to organic EL elements. For example, it is commonly known that high efficiency and durability can be achieved by subdividing the functions assigned to respective layers of the stacked layer structure and providing an anode, a hole injection layer, a hole transport layer, a light emitting layer, an electron transport layer, an electron injection layer, and a cathode on a substrate.

To further increase light emission efficiency, attempts have been made to utilize triplet excitons, and the utilization of phosphorescent light emitting compounds has been investigated. Furthermore, elements that utilize light emission based on thermally activated delayed fluorescence (TADF) have also been developed. In 2011, Adachi et al. from Kyushu University realized an external quantum efficiency of 5.3% with an element that uses a thermally activated delayed fluorescence material.

The light emitting layer can also be prepared by doping a charge transporting compound, generally called a host material, with a fluorescent compound, a phosphorescent light emitting compound, or a material that radiates delayed fluorescence. The selection of the organic materials in an organic EL element greatly affects the characteristics of that element, such as efficiency and durability.

In an organic EL element, the charges injected from both electrodes recombine in the light emitting layer, thereby producing light emission, and how efficiently the charges of both the holes and the electrons are passed on to the light emitting layer is of importance. Therefore, an element that exhibits excellent carrier balance is required. Also, by improving hole injectability and improving electron blockability, that is, the ability to block electrons injected from the cathode, the probability of holes and electrons recombining is increased, and furthermore, excitons generated in the light emitting layer are confined thereto. By so doing, it is possible to obtain high light emission efficiency. Therefore, the functions to be fulfilled by the hole transport material are important, and a hole transport material having high hole injectability, high hole mobility, high electron blockability, and high durability against electrons has been in demand.

Moreover, with regard to element lifespan, heat resistance and amorphousness of the materials are also important. A material with low heat resistance thermally decomposes due to heat produced during element driving, even at low temperatures, and the material deteriorates. A material with low amorphousness causes crystallization of a thin film to occur even in a short period of time, and the element deteriorates. Thus, high heat resistance and satisfactory amorphousness are required of the materials to be used.

N,N'-diphenyl-N,N'-di(α-naphthyl)benzidine (NPD) and various aromatic amine derivatives are known as hole transport materials that have been heretofore used in organic EL elements (see Patent Literatures 1 and 2). NPD has satisfactory hole transportability, but the glass transition point (Tg), which is an indicator of heat resistance, is as low as 96° C., and the element characteristics degrade due to crystallization under high-temperature conditions.

Moreover, among the aromatic amine derivatives disclosed in Patent Literatures 1 and 2, there are also compounds with an excellent hole mobility of 10$^{-3}$ cm$^2$/Vs or higher, but the electron blockability of these compounds is insufficient, which allows some electrons to pass through the light emitting layer, and therefore, no increase in light emission efficiency can be expected. Thus, materials that have higher electron blockability, higher stability as a thin film, and high heat resistance are needed to further increase the efficiency.

Furthermore, an aromatic amine derivative with high durability has also been reported in Patent Literature 3. However, the aromatic amine derivative disclosed in Patent Literature 3 is used as a charge transport material for an electrophotographic photosensitive body, and no mention is made of any examples of application to an organic EL element.

Arylamine compounds having a substituted carbazole structure have been suggested as compounds with improved properties such as heat resistance and hole injectability (see Patent Literatures 4 and 5). Although heat resistance, light emission efficiency, and the like of elements in which these compounds are used for a hole injection layer or hole transport layer have been improved, the results are still insufficient, and a further decrease in driving voltage and a further increase in light emission efficiency are required.

Thus, there is demand to increase the yield in element production and to improve the element characteristics of organic EL elements, for example, to realize elements in which holes and electrons can recombine with high efficiency and which have high light emission efficiency, a low driving voltage, and a long lifespan, by combining various materials with excellent hole injectability and transportability, electron injectability and transportability, stability of a thin film, durability, and the like.

CITATION LIST

Patent Literatures

Patent Literature 1: JP H8-048656A
Patent Literature 2: Japanese Patent No. 3194657
Patent Literature 3: Japanese Patent No. 4943840
Patent Literature 4: JP 2006-151979A
Patent Literature 5: WO 2008/62636
Patent Literature 6: WO 2011/059000
Patent Literature 7: WO 2003/060956

Patent Literature 8: JP H7-126615A
Patent Literature 9: JP 2005-108804A

SUMMARY OF INVENTION

Problems to be Solved by the Invention

It is an object of the present invention to provide an organic EL element that has (1) high light emission efficiency and high power efficiency, (2) a low light-emission start voltage, (3) a low actual driving voltage, and (4) an especially long lifespan, by combining various materials for an organic EL element that have excellent hole injectability and transportability, electron injectability and transportability, electron blockability, stability in a thin film state, durability, and the like so that the materials can effectively exhibit their properties.

Means for Solving the Problems

To achieve the above-described object, the inventors of the present invention noted that arylamine-based materials have excellent hole injectability and transportability, stability of a thin film, and durability. The inventors also noted that pyrimidine derivatives have excellent electron injectability and transportability, stability of a thin film, and durability.

The inventors of the present invention found that, when a hole transport layer has a two-layer configuration, and an arylamine compound having a specific structure is selected as a material of a hole transport layer (second hole transport layer) that is adjacent to a light emitting layer, holes can be efficiently injected and transported to the light emitting layer. Furthermore, the inventors also found that, when a pyrimidine derivative having a specific structure is selected as a material of an electron transport layer, electrons can be efficiently injected and transported to the light emitting layer.

Then, the inventors further combined various materials with a combination of such an arylamine compound and such a pyrimidine derivative to examine combinations of materials that have better carrier balance, and intensively evaluated the characteristics of the elements. As a result, the present invention has been accomplished.

That is to say, according to the present invention, provided is an organic electroluminescent element, or organic EL element, having at least an anode, a hole injection layer, a first hole transport layer, a second hole transport layer, a light emitting layer, an electron transport layer, and a cathode, in this order, wherein the second hole transport layer contains an arylamine compound represented by the general formula (1) below, and the electron transport layer contains a pyrimidine derivative represented by the general formula (2) below:

[Chem. 1]

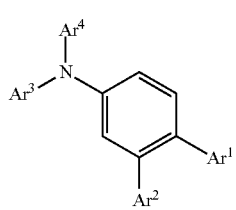

(1)

where $Ar^1$ to $Ar^4$ may be the same or different, and represent an aromatic hydrocarbon group, an aromatic heterocyclic group, or a condensed polycyclic aromatic group; and

[Chem. 2]

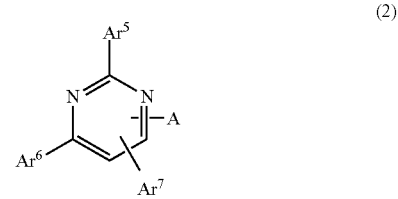

(2)

where $Ar^5$ represents an aromatic hydrocarbon group or a condensed polycyclic aromatic group, $Ar^6$ and $Ar^7$ may be the same or different, and represent a hydrogen atom, an aromatic hydrocarbon group, or a condensed polycyclic aromatic group, $Ar^6$ and $Ar^7$ do not both represent a hydrogen atom, and A represents a monovalent group represented by the following structural formula (3):

[Chem. 3]

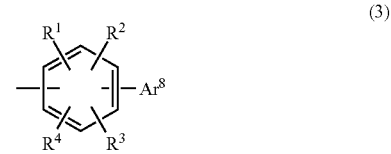

(3)

where $Ar^8$ represents an aromatic heterocyclic group, $R^1$ to $R^4$ may be the same or different, and represent a hydrogen atom, a heavy hydrogen atom, a fluorine atom, a chlorine atom, a cyano group, a trifluoromethyl group, an alkyl group having 1 to 6 carbon atoms, an aromatic hydrocarbon group, an aromatic heterocyclic group, or a condensed polycyclic aromatic group, and $R^1$ to $R^4$ and $Ar^8$ may be bonded to each other to form a ring via a single bond, a methylene group, an oxygen atom, or a sulfur atom.

Preferred embodiments of the organic EL element of the present invention are as follows.

1) The first hole transport layer contains a triarylamine compound having three to six triarylamine structures in a molecule, the triarylamine structures being linked via a divalent group having no heteroatom or a single bond.

2) The triarylamine compound represented by the following general formula (4) is a triarylamine compound that has four triarylamine structures in a molecule:

[Chem. 4]

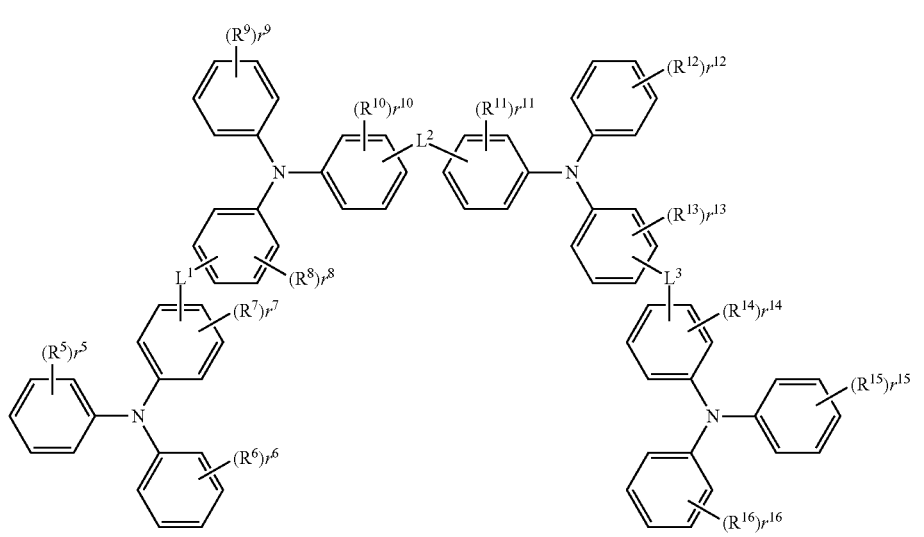

(4)

where $R^5$ to $R^{16}$ may be the same or different, and represent a heavy hydrogen atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a condensed polycyclic aromatic group, or an aryloxy group, $r^5, r^6, r^9, r^{12}, r^{15}$, and $r^{16}$ may be the same or different, and represent an integer of 0 to 5, $r^7, r^8, r^{10}, r^{11}, r^{13}$, and $r^{14}$ may be the same or different, and represent an integer of 0 to 4, when $r^5, r^6, r^9, r^{12}, r^{15}, r^{16}$ or is an integer of 2 to $5^7$, or when $r^7, r^8, r^{10}, r^{11}, r^{13}$, or $r^{14}$ is an integer of 2 to 4, the plurality of atoms or groups represented by the corresponding one of $R^5$ to $R^{16}$ which are bonded to the same benzene ring, may be the same or different, and may be bonded to each other to form a ring via a single bond, a methylene group, an oxygen atom, or a sulfur atom, and $L^1$ to $L^3$ may be the same or different, and represent a divalent group represented by any of the following structural formulae (B) to (G) or a single bond:

[Chem. 5]

(B)

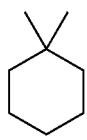

(C)

-continued

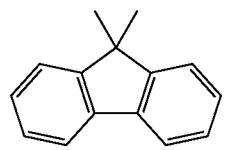

(D)

$—CH_2—$ (E)

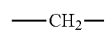

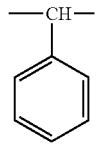

(F)

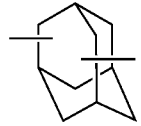

(G)

where n1 represents an integer of 1 to 3.

3) The first hole transport layer contains a triarylamine compound having two triarylamine structures in a molecule, the triarylamine structures being linked via a divalent group having no heteroatom or a single bond.

4) The triarylamine compound is represented by the following general formula (5):

[Chem. 6]

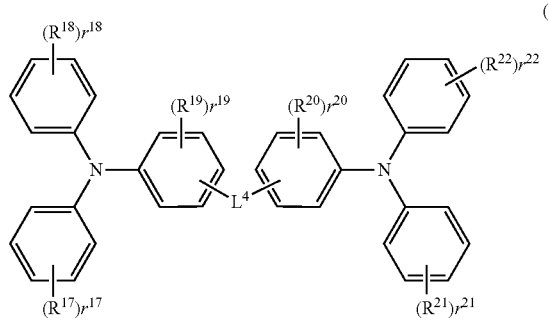

(5)

where $R^{17}$ to $R^{22}$ may be the same or different, and represent a heavy hydrogen atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a condensed polycyclic aromatic group, or an aryloxy group, $r^{17}$, $r^{18}$, $r^{21}$, and $r^{22}$ may be the same or different, and represent an integer of 0 to 5, $r^{19}$ and $r^{20}$ may be the same or different, and represent an integer of 0 to 4, when $r^{17}$, $r^{18}$, $r^{21}$, or $r^{22}$ is an integer of 2 to 5, or when $r^{19}$ or $r^{20}$ is an integer of 2 to 4, the plurality of atoms or groups represented by the corresponding one of $R^{17}$ to $R^{22}$ which are bonded to the same benzene ring, may be the same or different, and may be bonded to each other to form a ring via a single bond, a methylene group, an oxygen atom, or a sulfur atom, and $L^4$ represents a divalent group represented by any of the following structural formulae (C) to (G) or a single bond:

[Chem. 7]

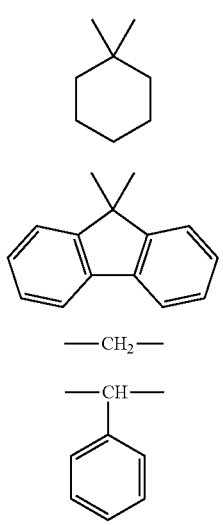

-continued

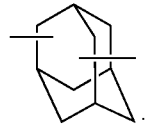

(G)

5) The pyrimidine derivative is represented by the following general formula (2a):

[Chem. 8]

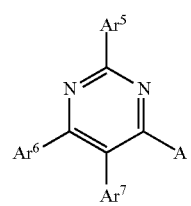

(2a)

where $Ar^5$ to $Ar^7$ and A are as defined in the general formula (2).

6) The pyrimidine derivative is represented by the following general formula (2b):

[Chem. 9]

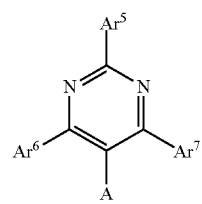

(2b)

where $Ar^5$ to $Ar^7$ and A are as defined in the general formula (2).

7) In the general formula (2), A is a monovalent group represented by the following structural formula (3a):

[Chem. 10]

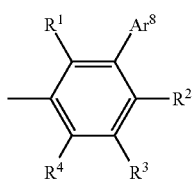

(3a)

where $Ar^8$ and $R^1$ to $R^4$ are as defined in the structural formula (3).

In this present specification, the alkyl group having 1 to 6 carbon atoms, the cycloalkyl group having 5 to 10 carbon atoms, the alkenyl group having 2 to 6 carbon atoms, the alkyloxy group having 1 to 6 carbon atoms, the cycloalkyloxy group having 5 to 10 carbon atoms, the aromatic hydrocarbon group, the aromatic heterocyclic group, the condensed polycyclic aromatic group, and the aryloxy group represented by $Ar^1$ to $Ar^8$ and $R^1$ to $R^{22}$ may have a substituent or may be unsubstituted unless otherwise specified. Similarly, when the groups represented by $Ar^1$ to $Ar^8$ and $R^1$ to $R^{22}$ have a substituent, the substituent may further have a substituent or may be unsubstituted unless otherwise specified. The methylene group that contributes to the ring formation may also have a substituent or may be unsubstituted unless otherwise specified.

Moreover, in the present specification, the "condensed polycyclic aromatic group" has no heteroatom.

Aliphatic hydrocarbon groups, such as an alkyl group, an alkenyl group, and an alkyloxy group, may be linear or branched unless otherwise specified.

Advantageous Effects of Invention

According to the present invention, an arylamine compound represented by the general formula (1) above is used as a constituent material of a hole transport layer, and, in a preferred embodiment, a triarylamine compound represented by the general formula (4) above or a triarylamine compound represented by the general formula (5) above is also used as a constituent material of the hole transport layer. The reason for this is that these compounds have high hole mobility.

According to the present invention, a pyrimidine derivative represented by the general formula (2) above is used as a constituent element of an electron transport layer of an organic EL element. The reason for this is that this pyrimidine derivative has excellent electron injectability and transportability.

According to the present invention, out of materials for an organic EL element that have excellent hole injectability and transportability, electron injectability and transportability, stability of a thin film, or durability, an arylamine compound having a specific structure and a compound having a pyrimidine ring structure having a specific structure are combined, with consideration given to the carrier balance, so that the functions of injecting and transporting holes and the functions of injecting and transporting electrons can be effectively performed. Therefore, compared with a conventional organic EL element, in the organic EL element of the present invention, the efficiency of transporting holes from the hole transport layer to the light emitting layer and the efficiency of transporting electrons from the electron transport layer to the light emitting layer are improved.

Thus, in the organic EL element of the present invention, the light emission efficiency is improved, the driving voltage is reduced, and the durability is improved. That is to say, an organic EL element is realized which has high efficiency, a low driving voltage, and an especially long lifespan.

Moreover, according to a preferred embodiment, the above-described arylamine compound, which is the material for the second hole transport layer, is combined with a triarylamine compound having a specific structure, which is used as the material of the first hole transport layer, to thereby achieve better carrier balance so that holes can be even more efficiently injected and transported to the light emitting layer. As a result, an organic EL element having high efficiency, a low driving voltage, and an even longer lifespan is realized. According to the preferred embodiment of the present invention, the light emission efficiency and the driving voltage of a conventional organic EL element can be improved, and furthermore, the durability can be significantly improved.

DESCRIPTION OF EMBODIMENTS

Figure 1:
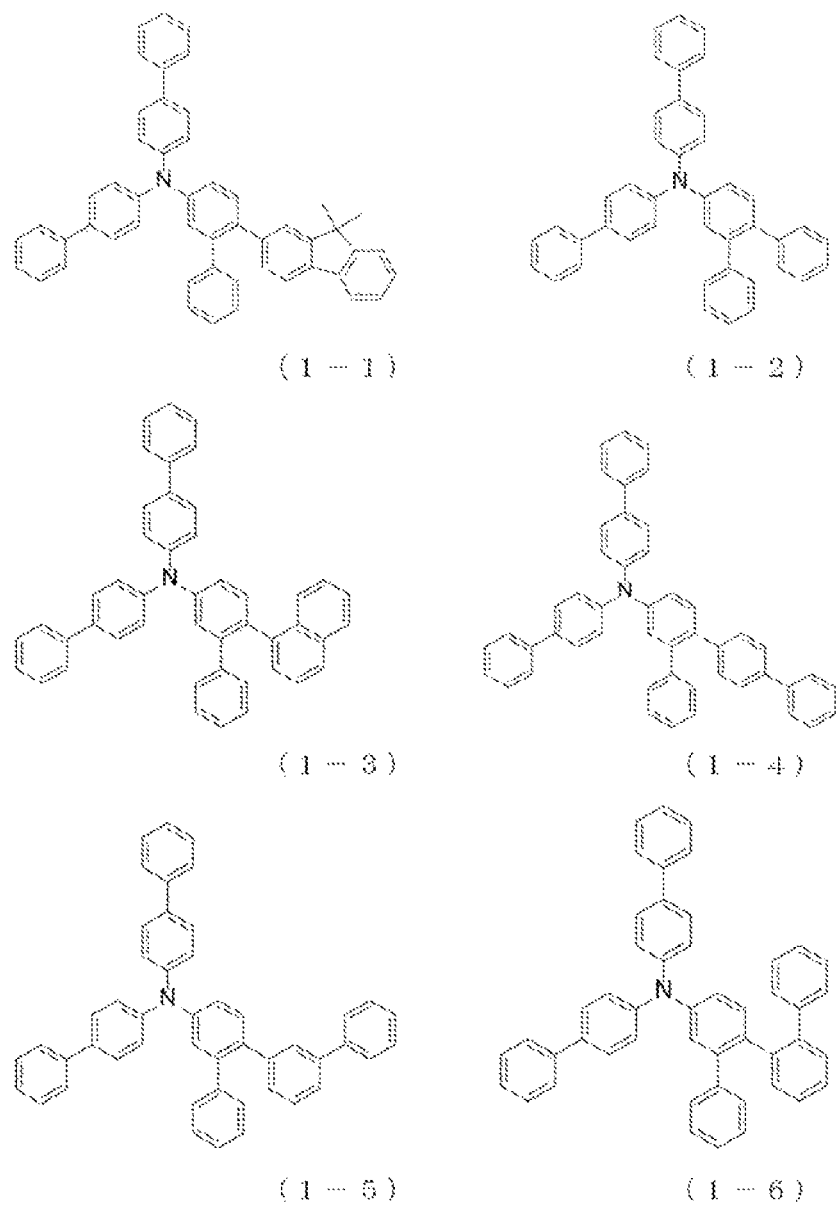
FIG. 1 shows the structural formulae of compounds 1-1 to 1-6, which are arylamine compounds I.
Figure 2:
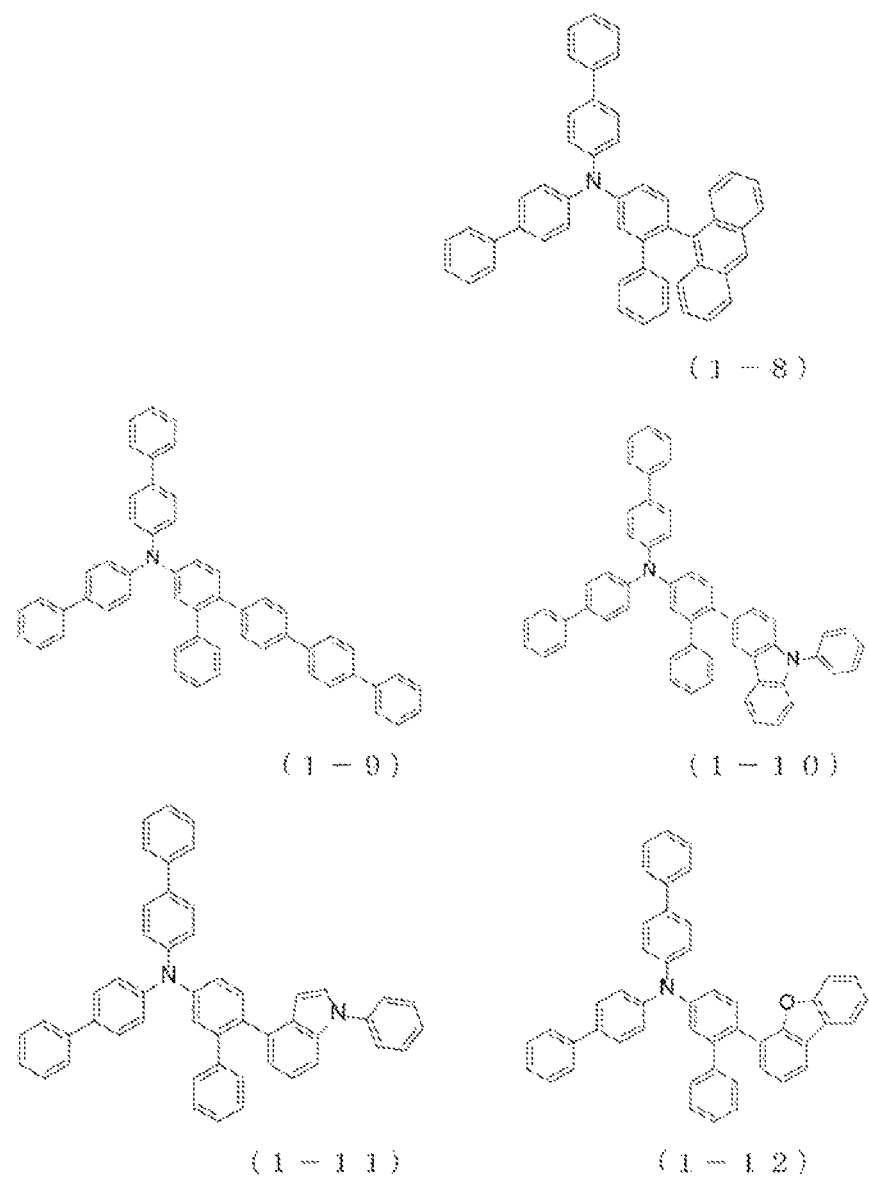
FIG. 2 shows the structural formulae of compounds 1-8 to 1-12, which are arylamine compounds I.
Figure 3:
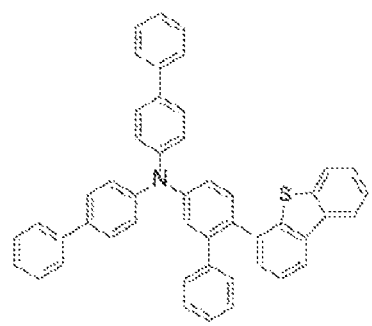
FIG. 3 shows the structural formulae of compounds 1-13 to 1-18, which are arylamine compounds I.
Figure 3:
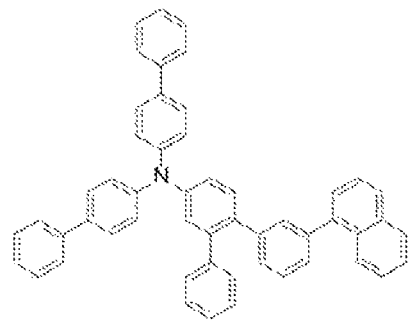
Figure 3:
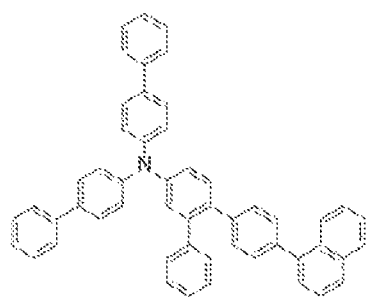
Figure 3:
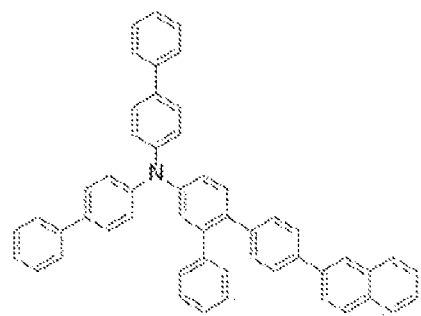
Figure 3:
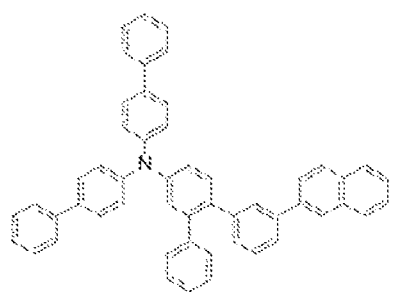
Figure 4:
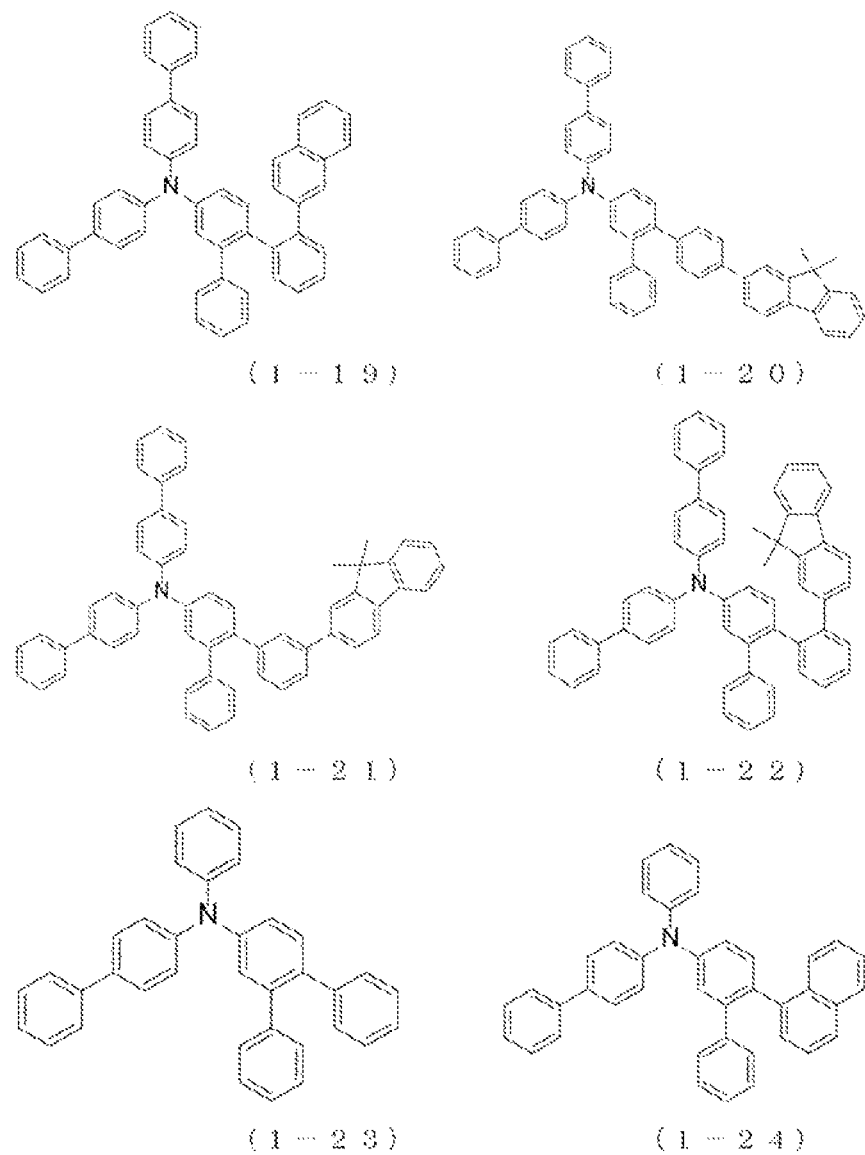
FIG. 4 shows the structural formulae of compounds 1-19 to 1-24, which are arylamine compounds I.
Figure 5:
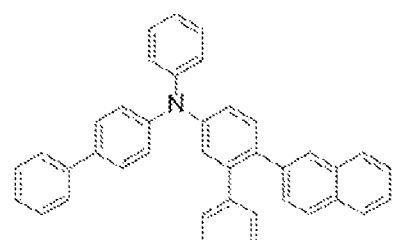
FIG. 5 shows the structural formulae of compounds 1-25 to 1-30, which are arylamine compounds I.
Figure 5:
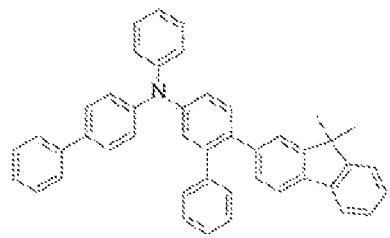
Figure 5:
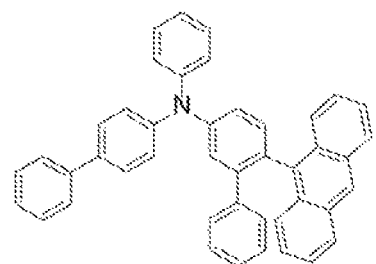
Figure 5:
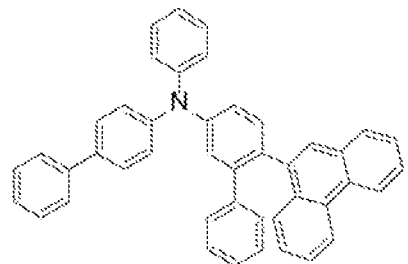
Figure 5:
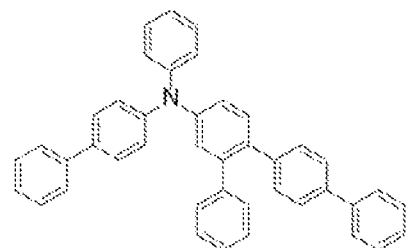
Figure 5:
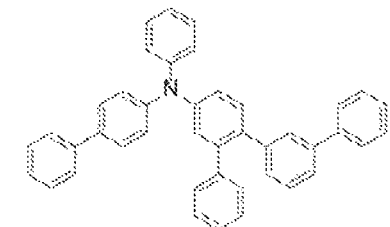
Figure 6:
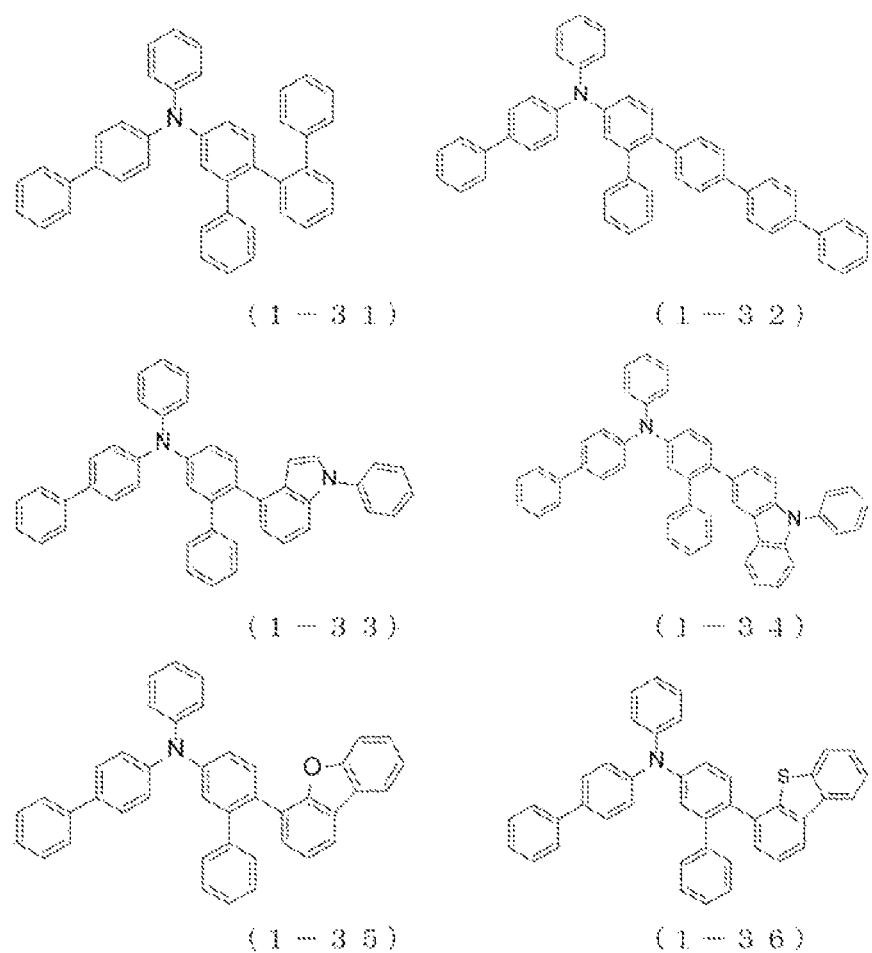
FIG. 6 shows the structural formulae of compounds 1-31 to 1-36, which are arylamine compounds I.
Figure 7:
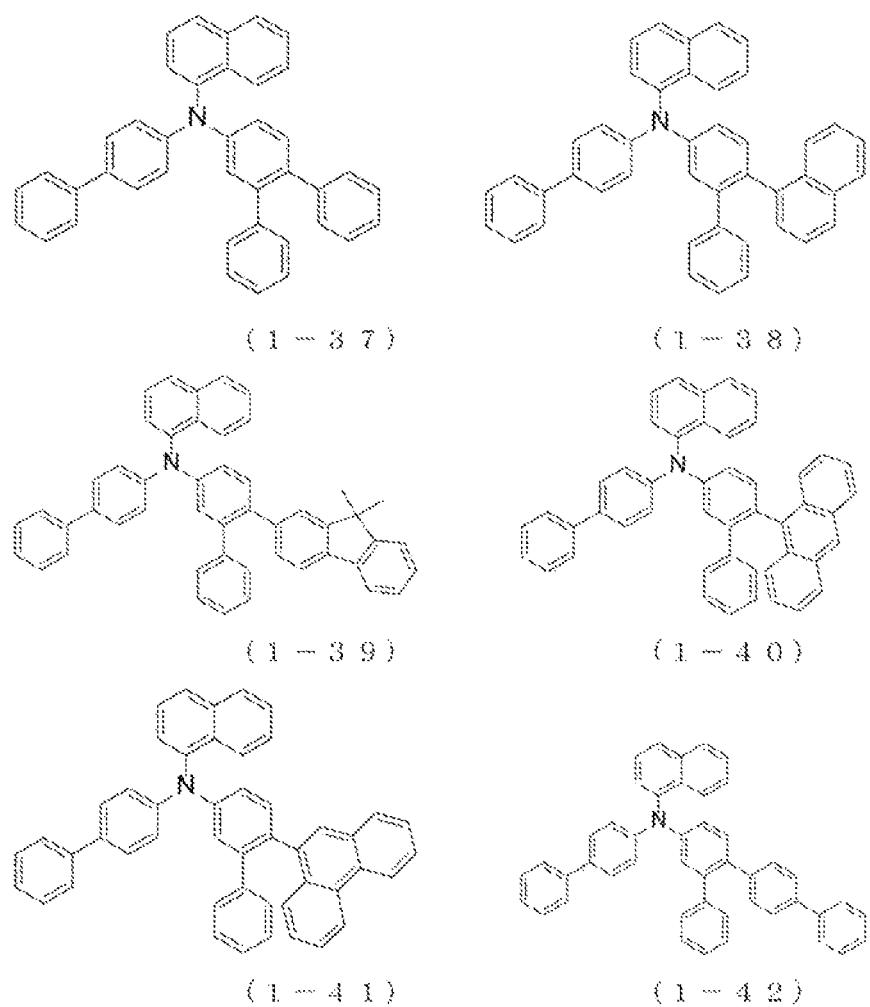
FIG. 7 shows the structural formulae of compounds 1-37 to 1-42, which are arylamine compounds I.
Figure 8:
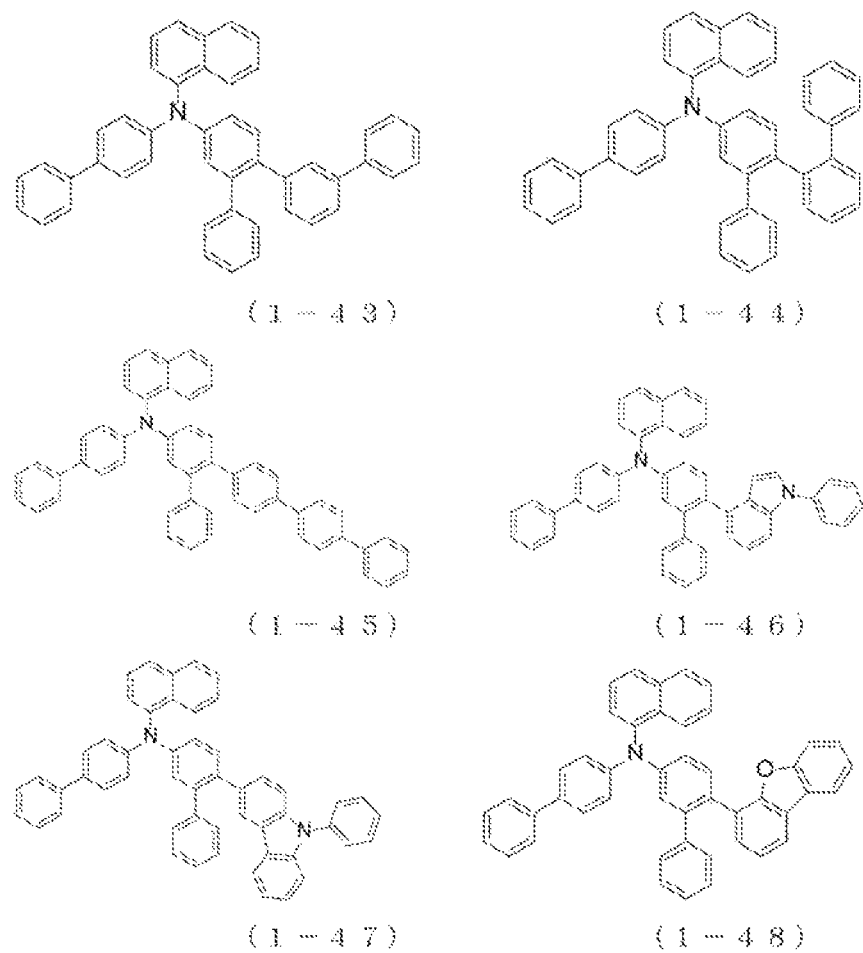
FIG. 8 shows the structural formulae of compounds 1-43 to 1-48, which are arylamine compounds I.
Figure 9:
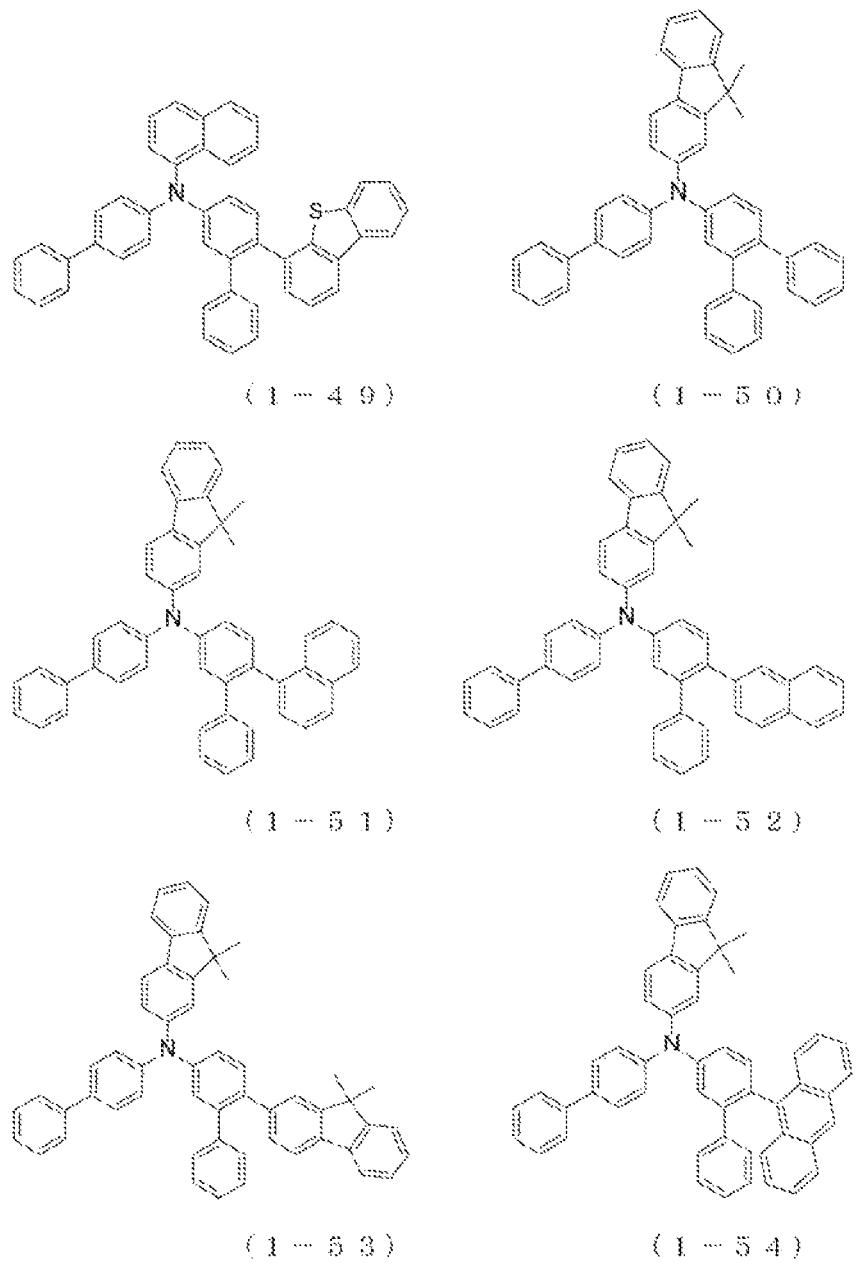
FIG. 9 shows the structural formulae of compounds 1-49 to 1-54, which are arylamine compounds I.
Figure 10:
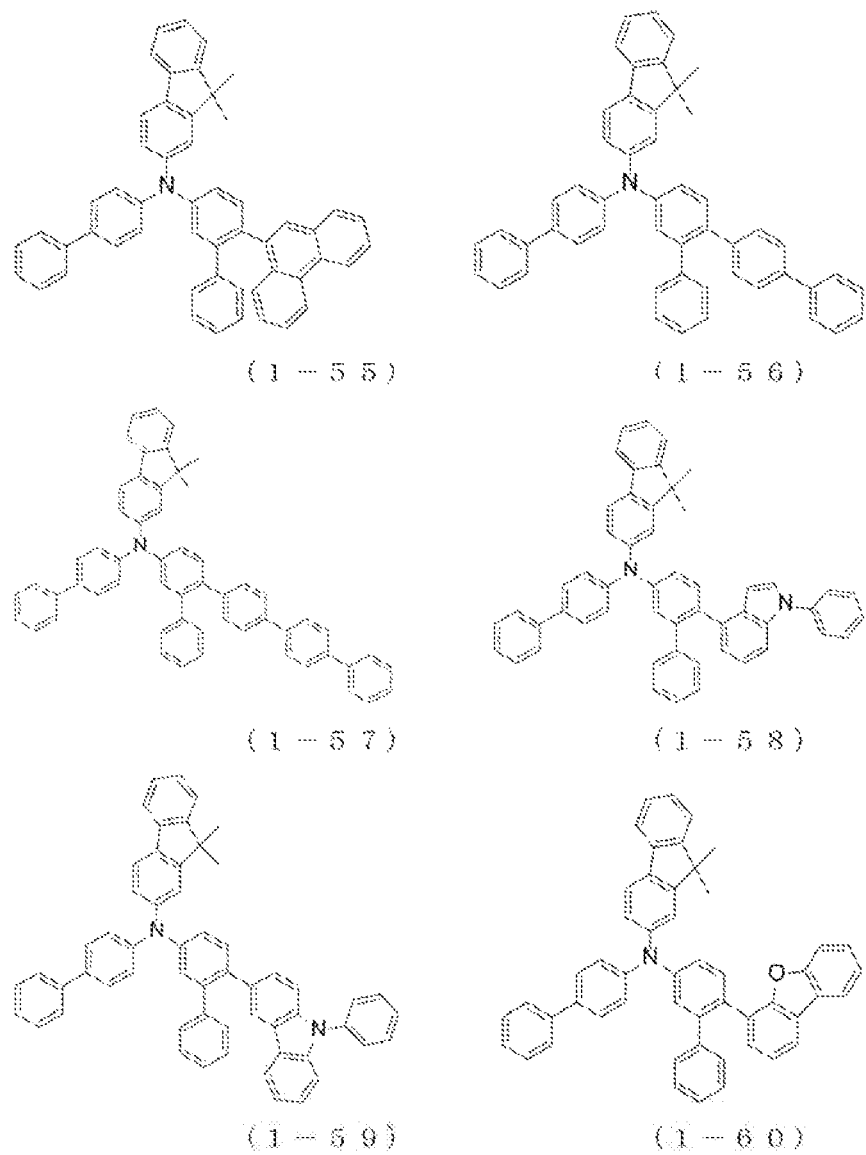
FIG. 10 shows the structural formulae of compounds 1-55 to 1-60, which are arylamine compounds I.
Figure 11:
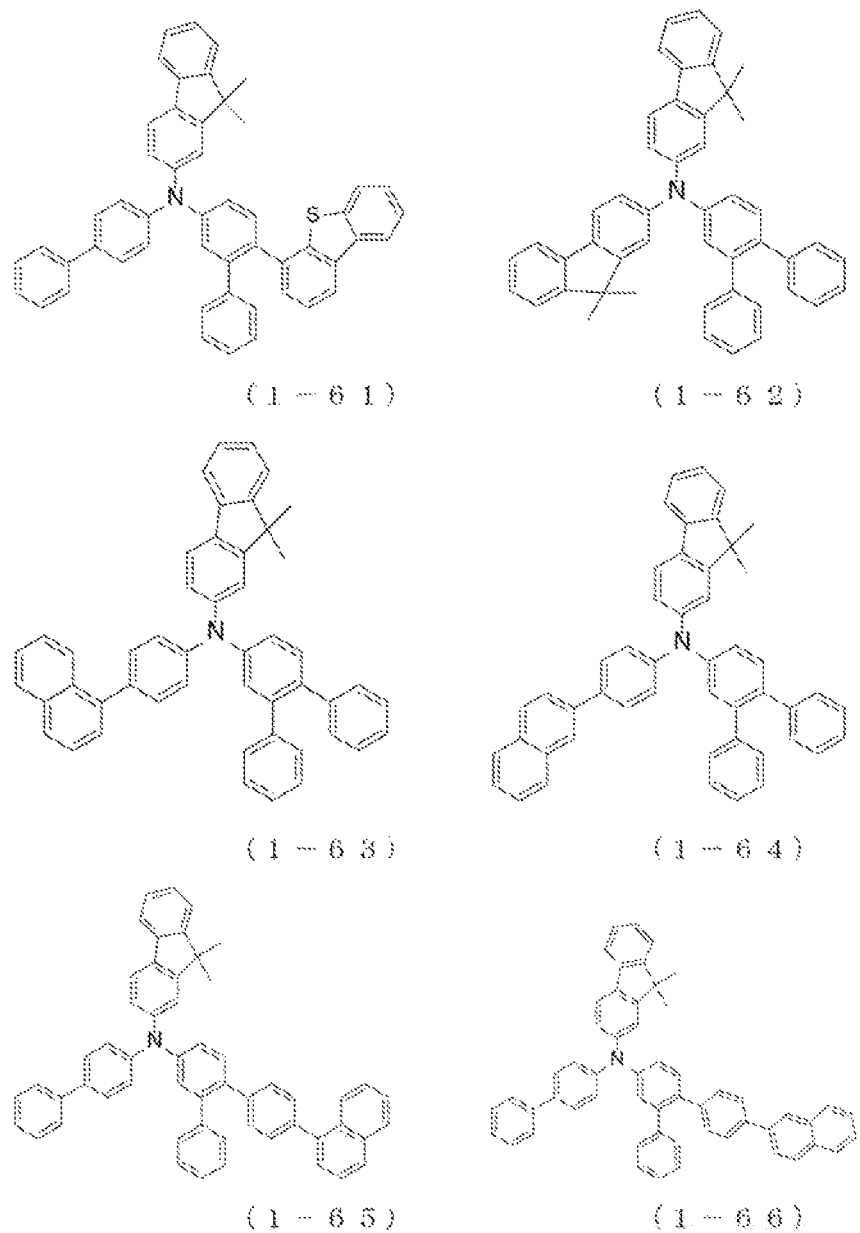
FIG. 11 shows the structural formulae of compounds 1-61 to 1-66, which are arylamine compounds I.
Figure 12:
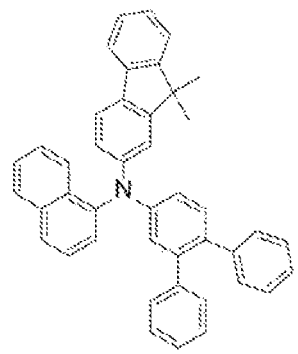
FIG. 12 shows the structural formulae of compounds 1-67 to 1-72, which are arylamine compounds I.
Figure 12:
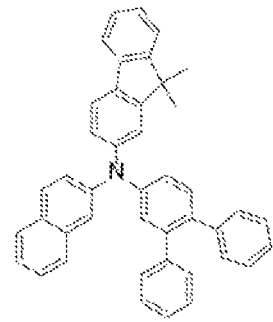
Figure 12:
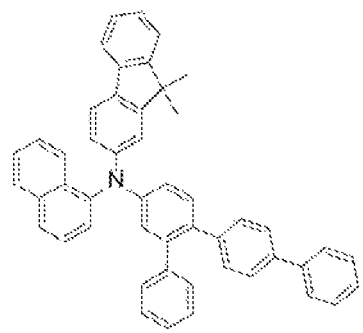
Figure 12:
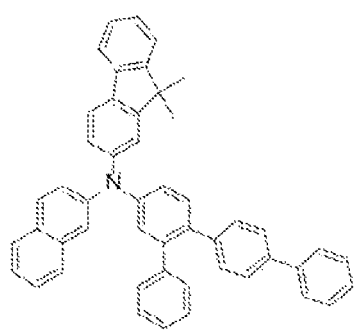
Figure 12:
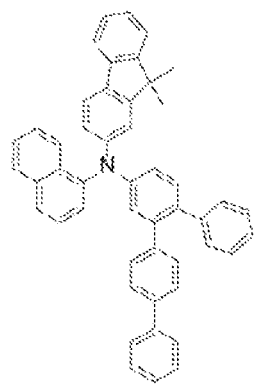
Figure 12:
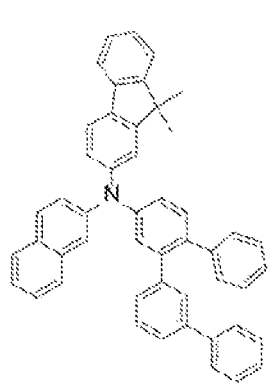
Figure 13:
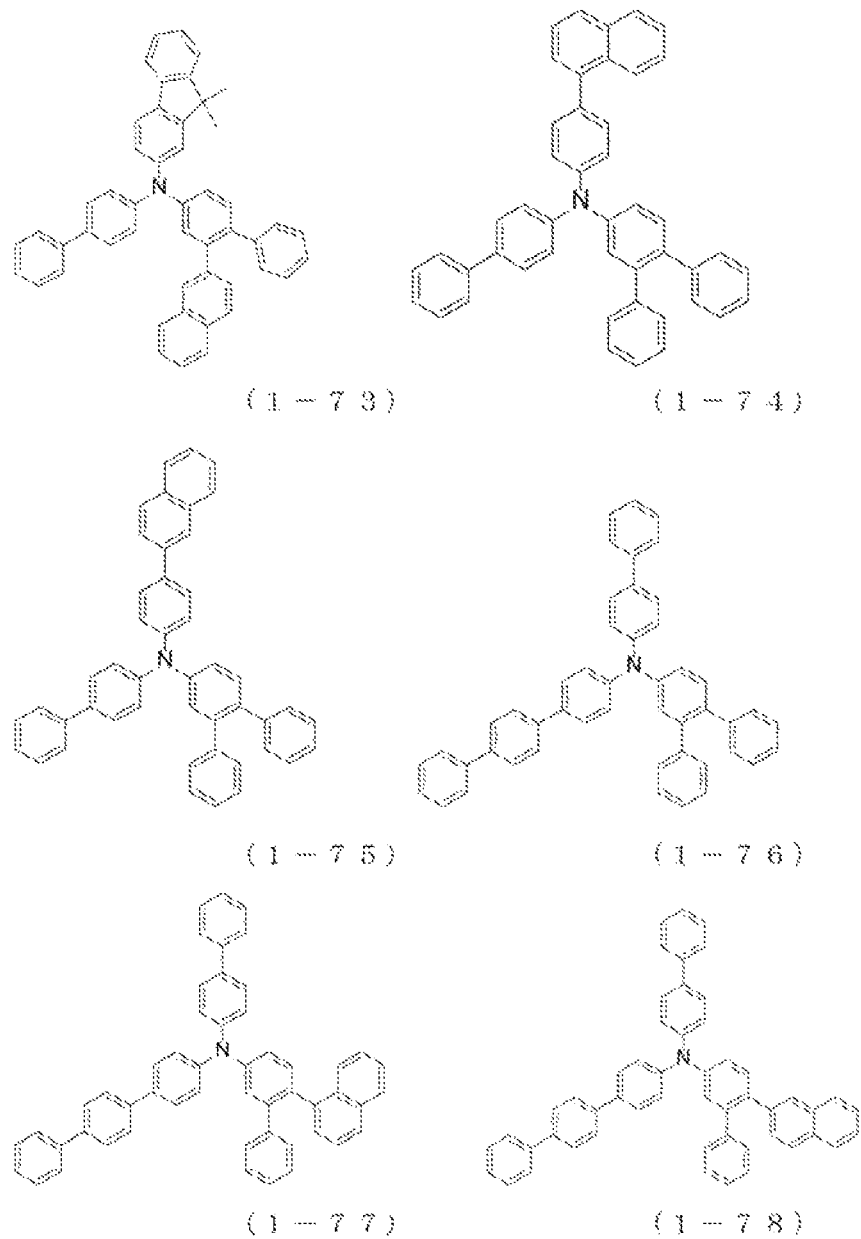
FIG. 13 shows the structural formulae of compounds 1-73 to 1-78, which are arylamine compounds I.
Figure 14:
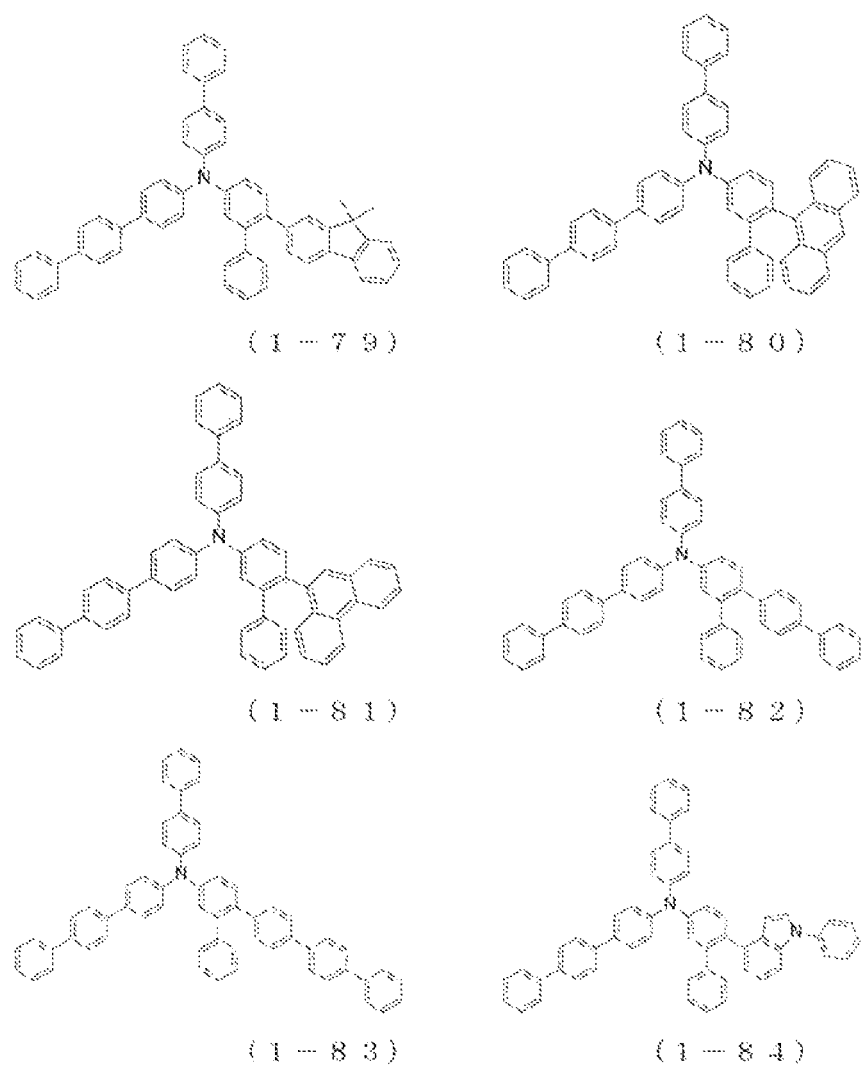
FIG. 14 shows the structural formulae of compounds 1-79 to 1-84, which are arylamine compounds I.
Figure 15:
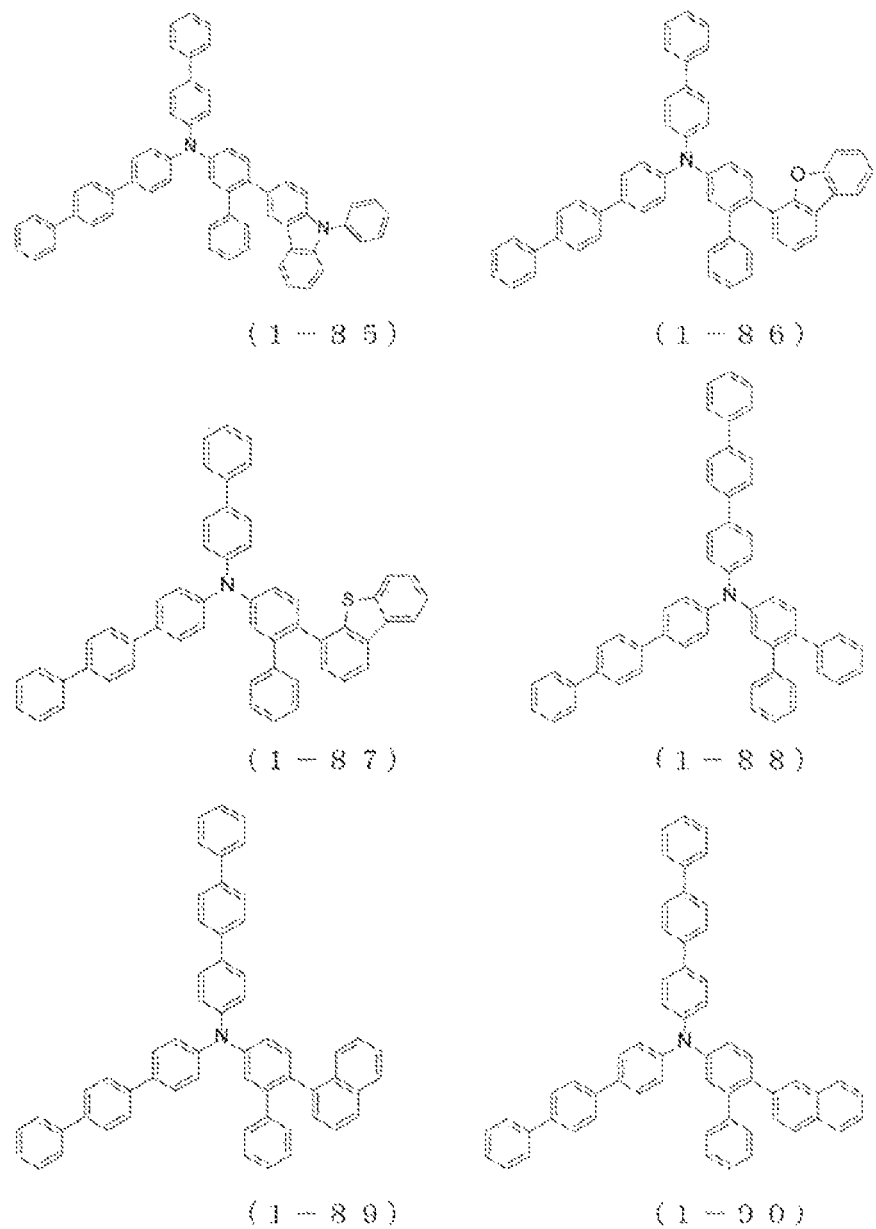
FIG. 15 shows the structural formulae of compounds 1-85 to 1-90, which are arylamine compounds I.
Figure 16:
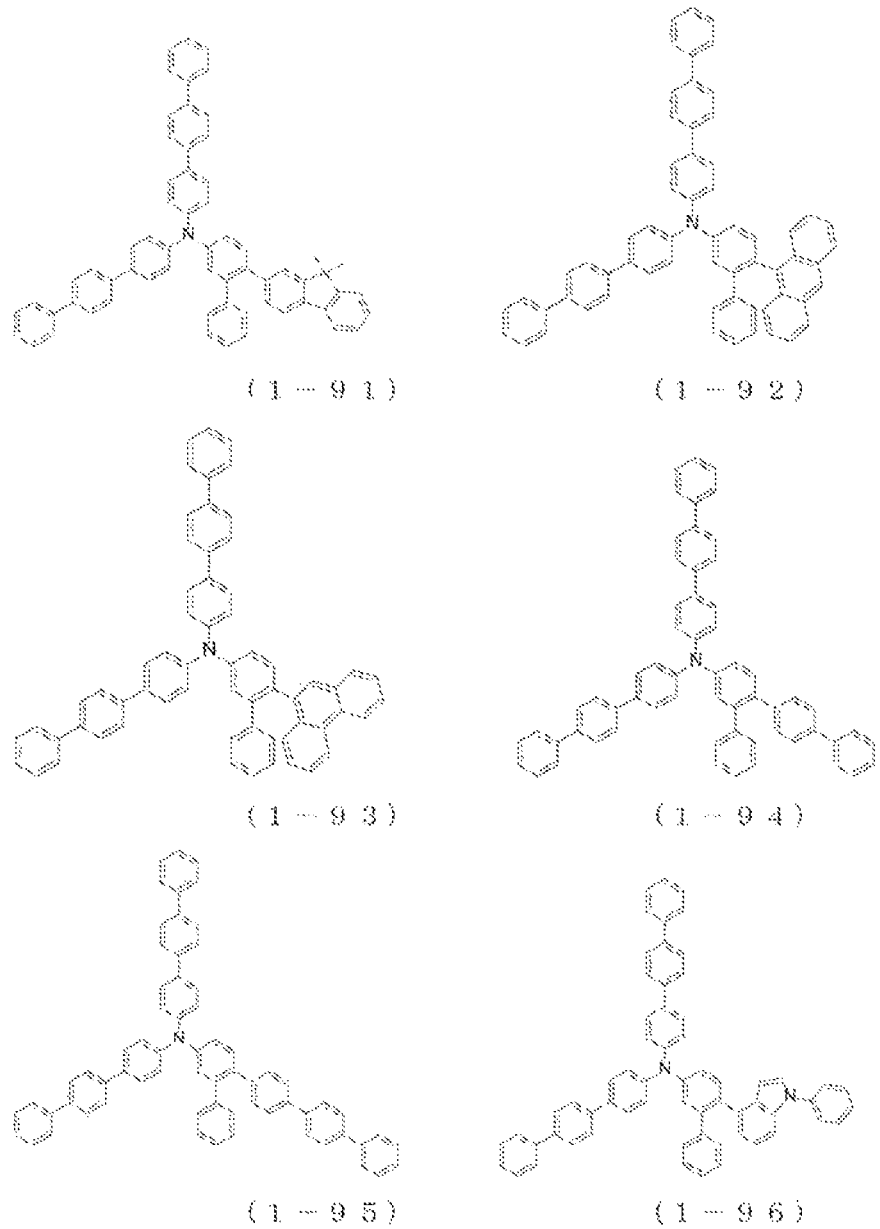
FIG. 16 shows the structural formulae of compounds 1-91 to 1-96, which are arylamine compounds I.
Figure 17:
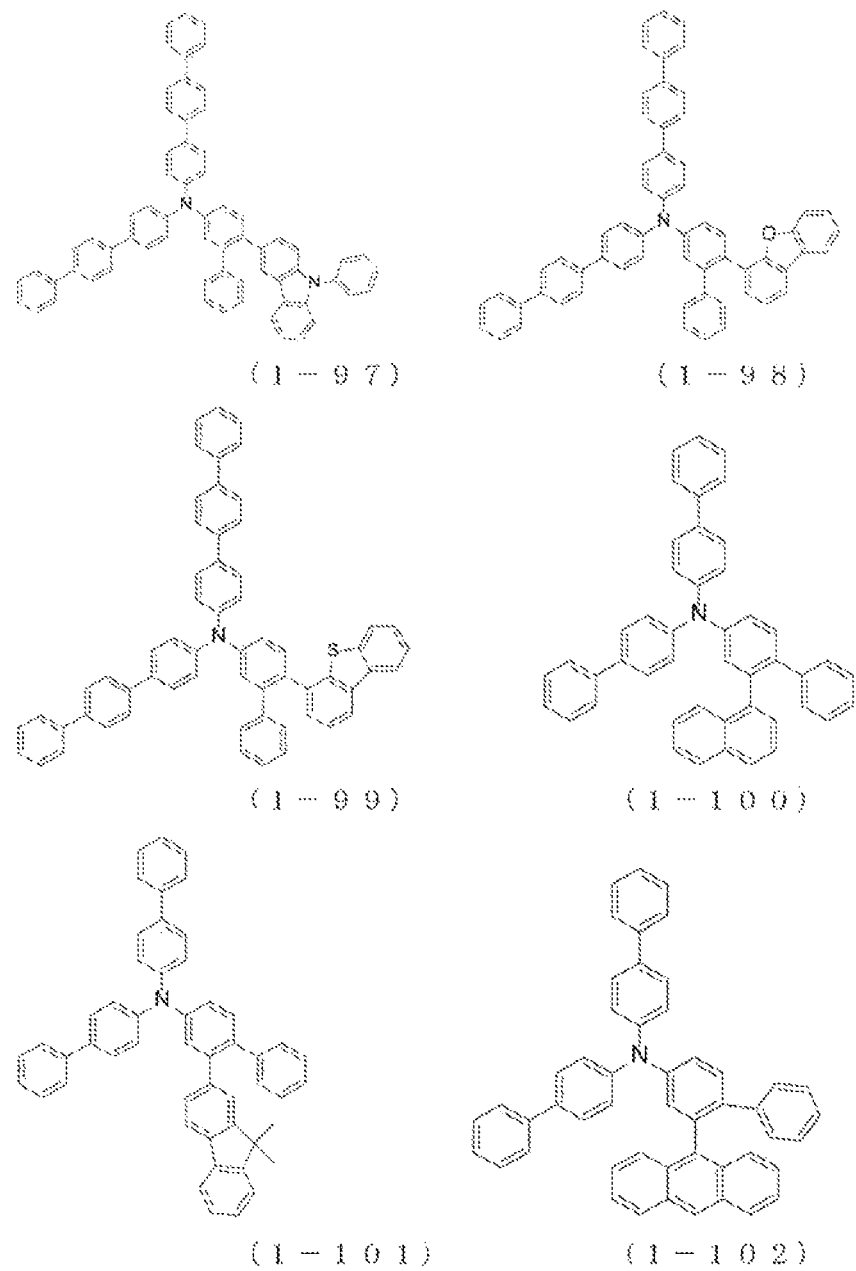
FIG. 17 shows the structural formulae of compounds 1-97 to 1-102, which are arylamine compounds I.
Figure 18:
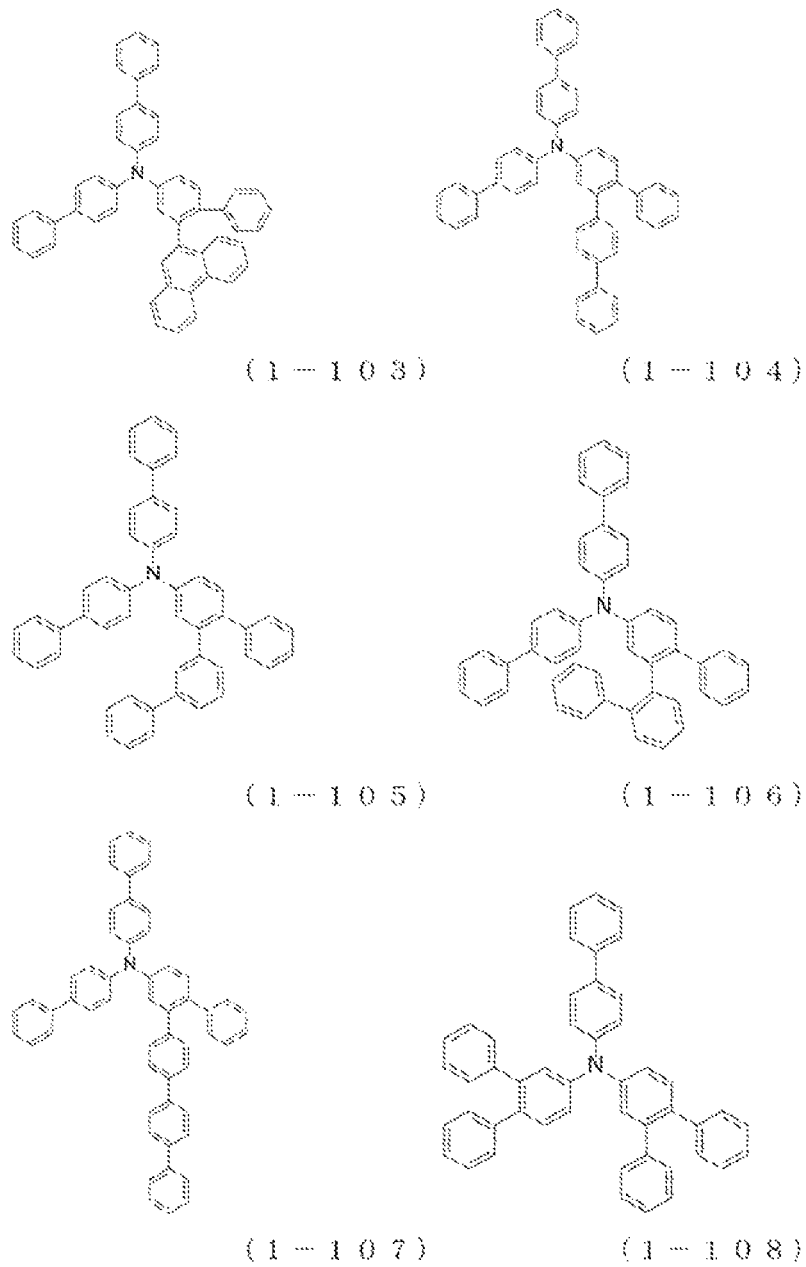
FIG. 18 shows the structural formulae of compounds 1-103 to 1-108, which are arylamine compounds I.
Figure 19:
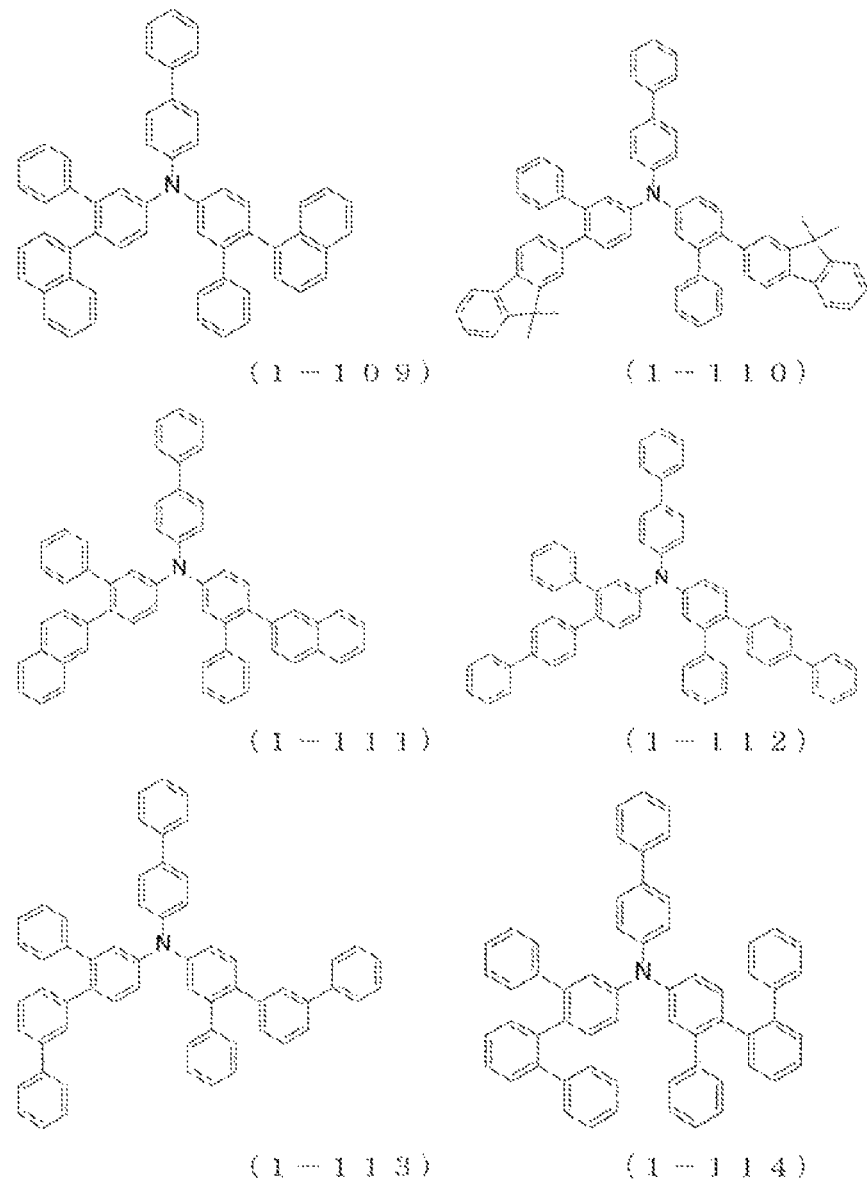
FIG. 19 shows the structural formulae of compounds 1-109 to 1-114, which are arylamine compounds I.
Figure 20:
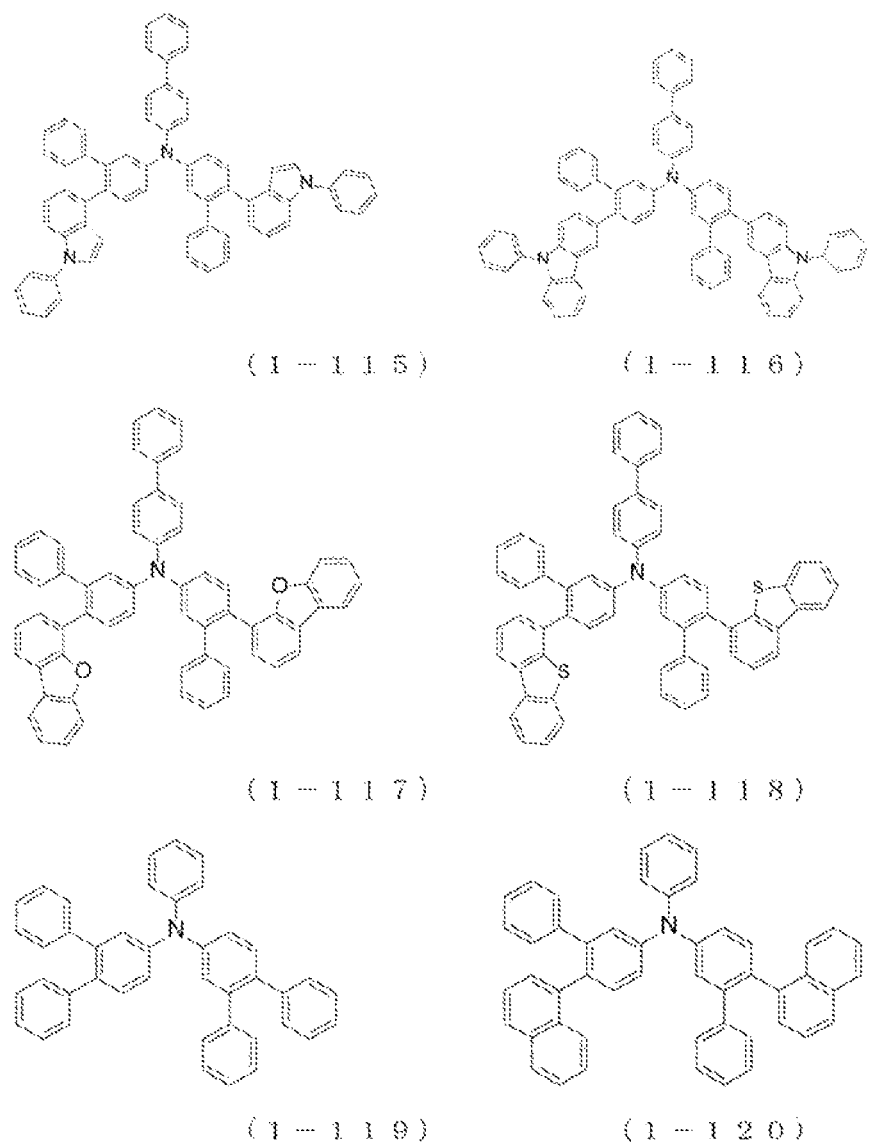
FIG. 20 shows the structural formulae of compounds 1-115 to 1-120, which are arylamine compounds I.
Figure 21:
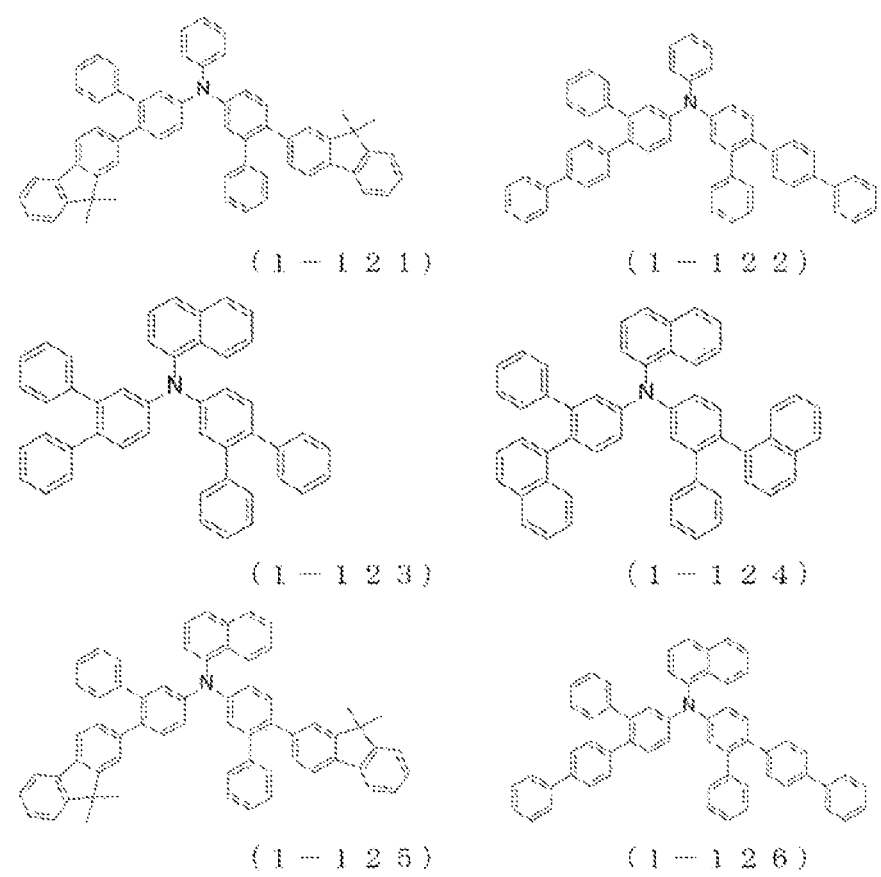
FIG. 21 shows the structural formulae of compounds 1-121 to 1-126, which are arylamine compounds I.
Figure 22:
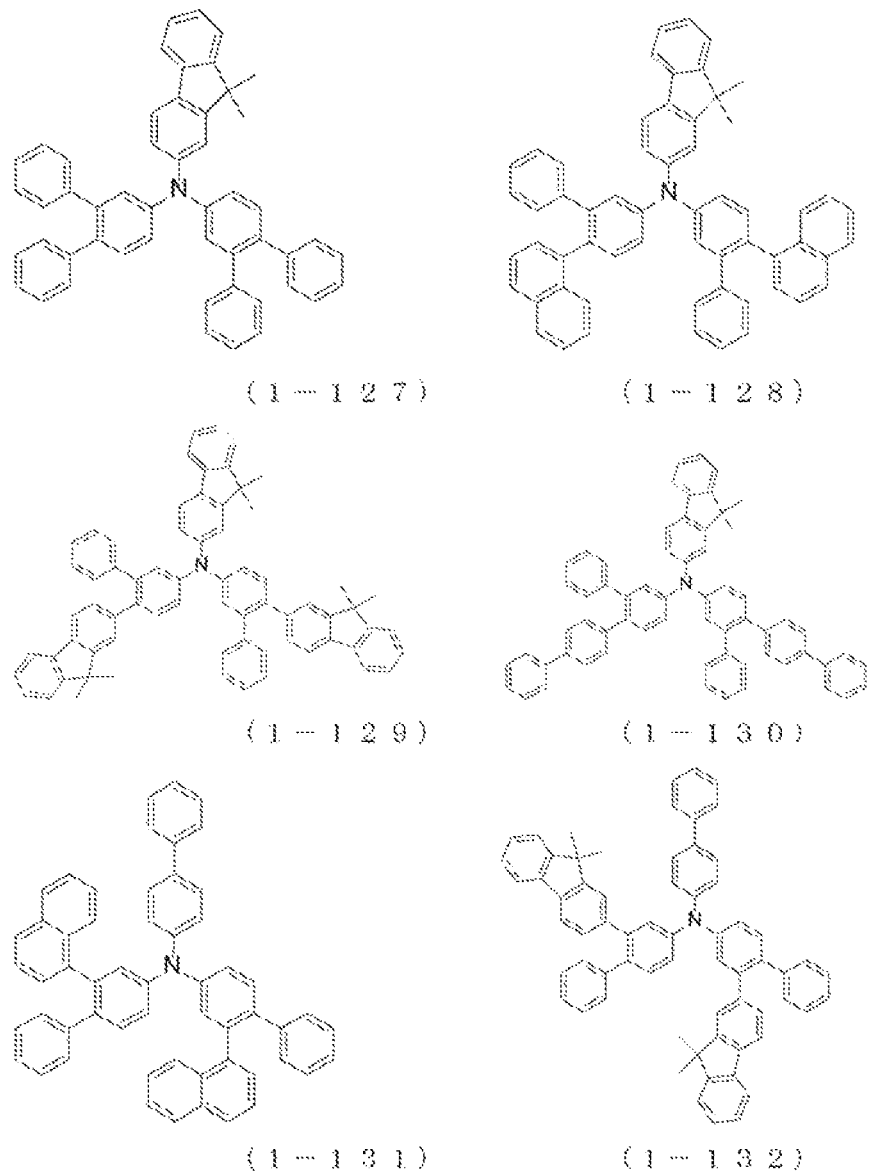
FIG. 22 shows the structural formulae of compounds 1-127 to 1-132, which are arylamine compounds I.
Figure 23:
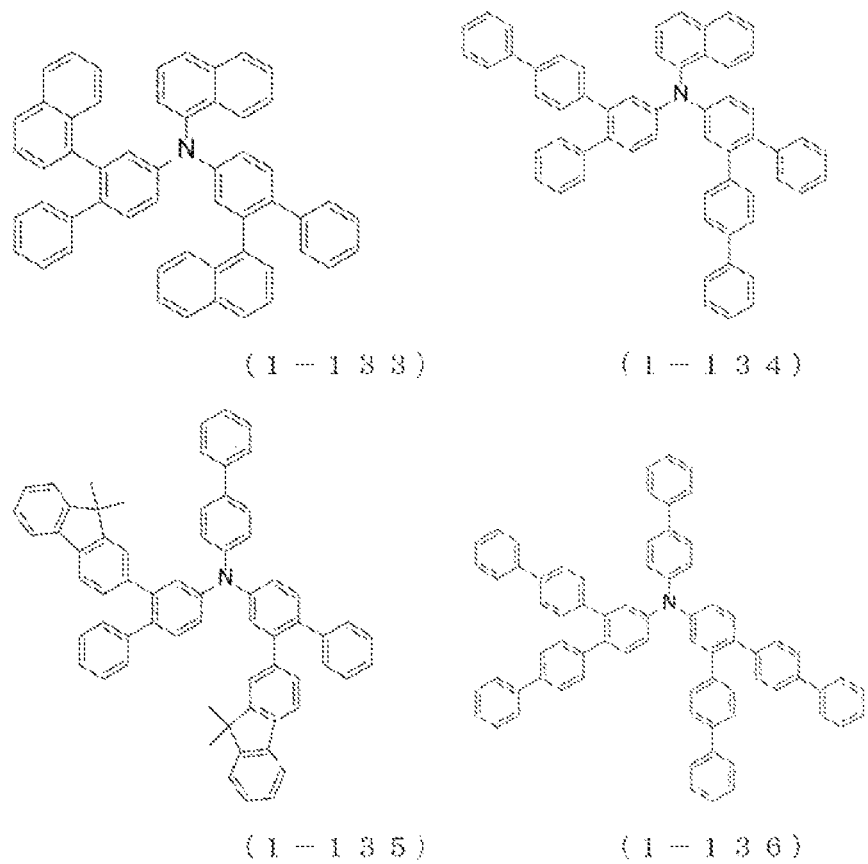
FIG. 23 shows the structural formulae of compounds 1-133 to 1-136, which are arylamine compounds I.
Figure 24:
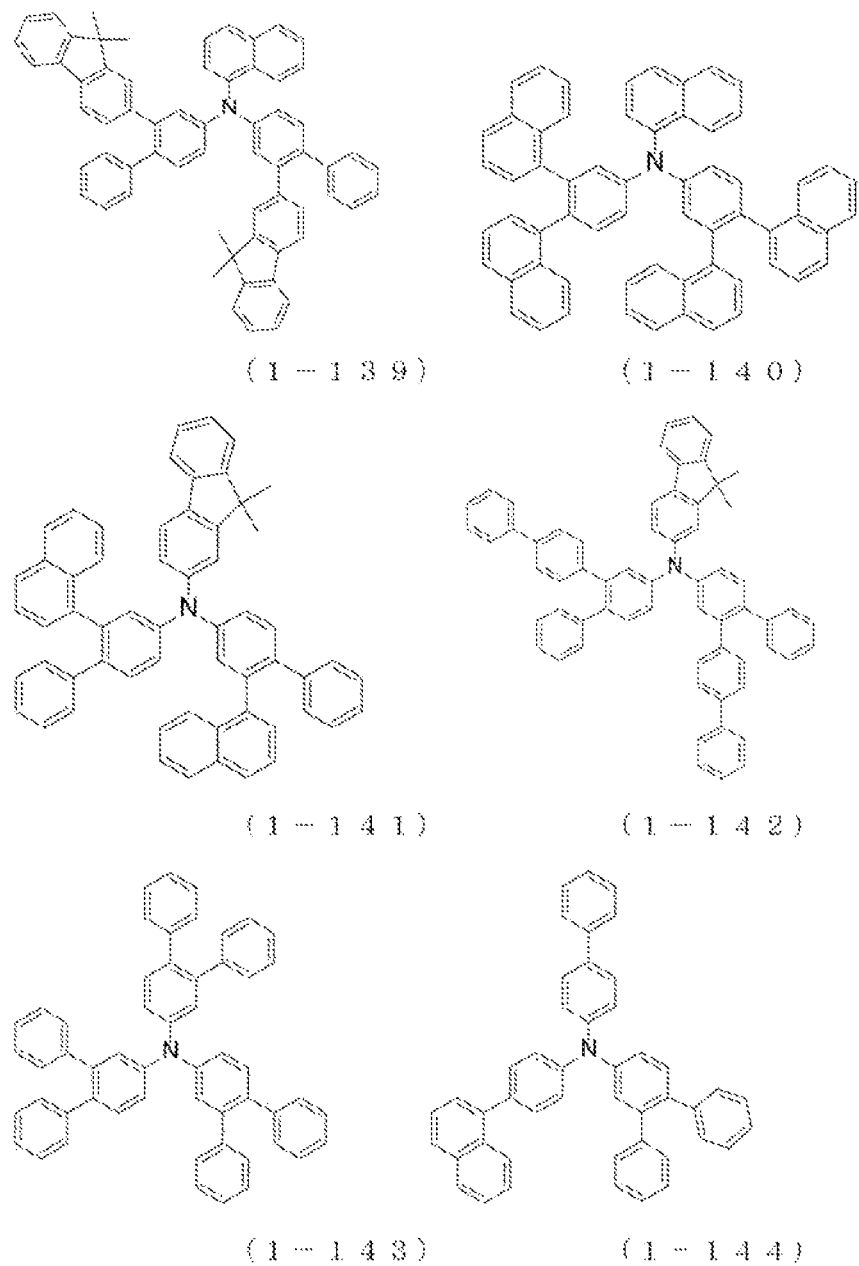
FIG. 24 shows the structural formulae of compounds 1-139 to 1-144, which are arylamine compounds I.
Figure 25:
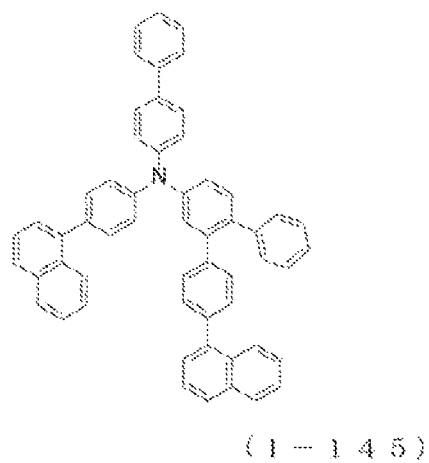
FIG. 25 shows the structural formula of a compound 1-145, which is an arylamine compound I.
Figure 26:
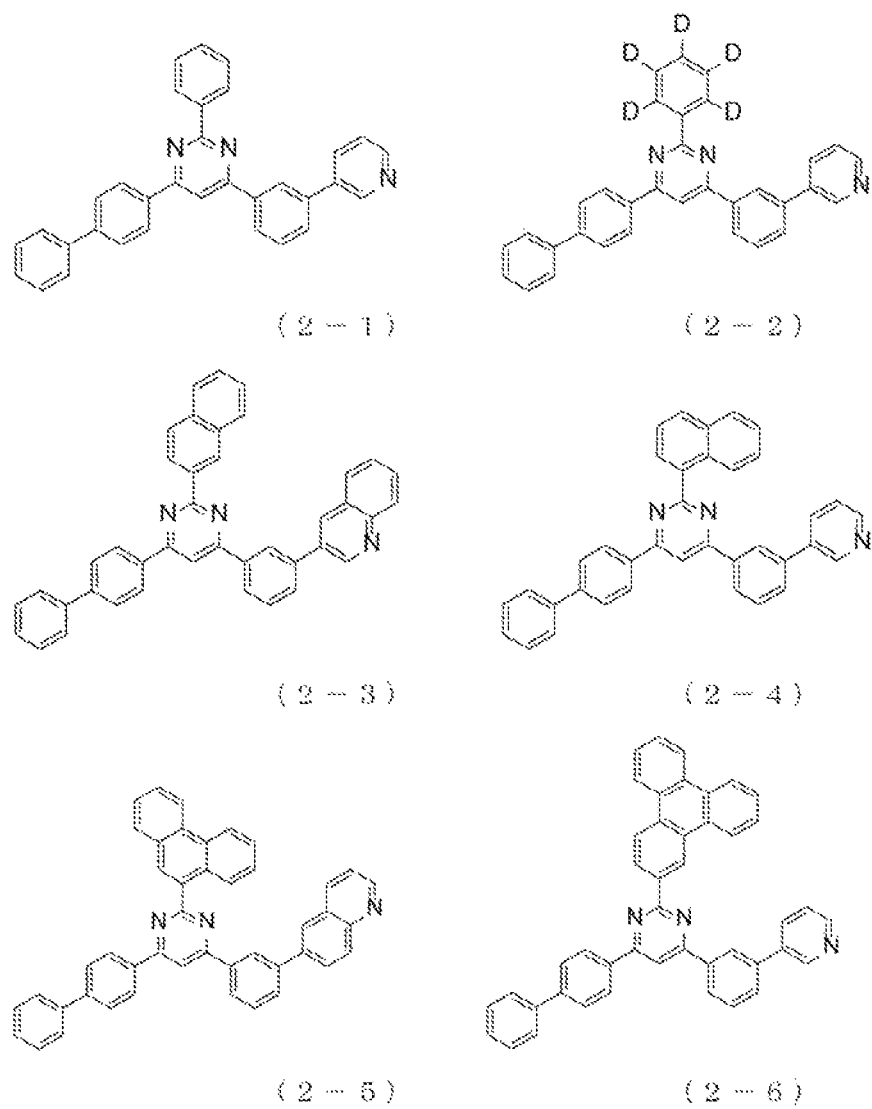
FIG. 26 shows the structural formulae of compounds 2-1 to 2-6, which are pyrimidine derivatives II.
Figure 27:
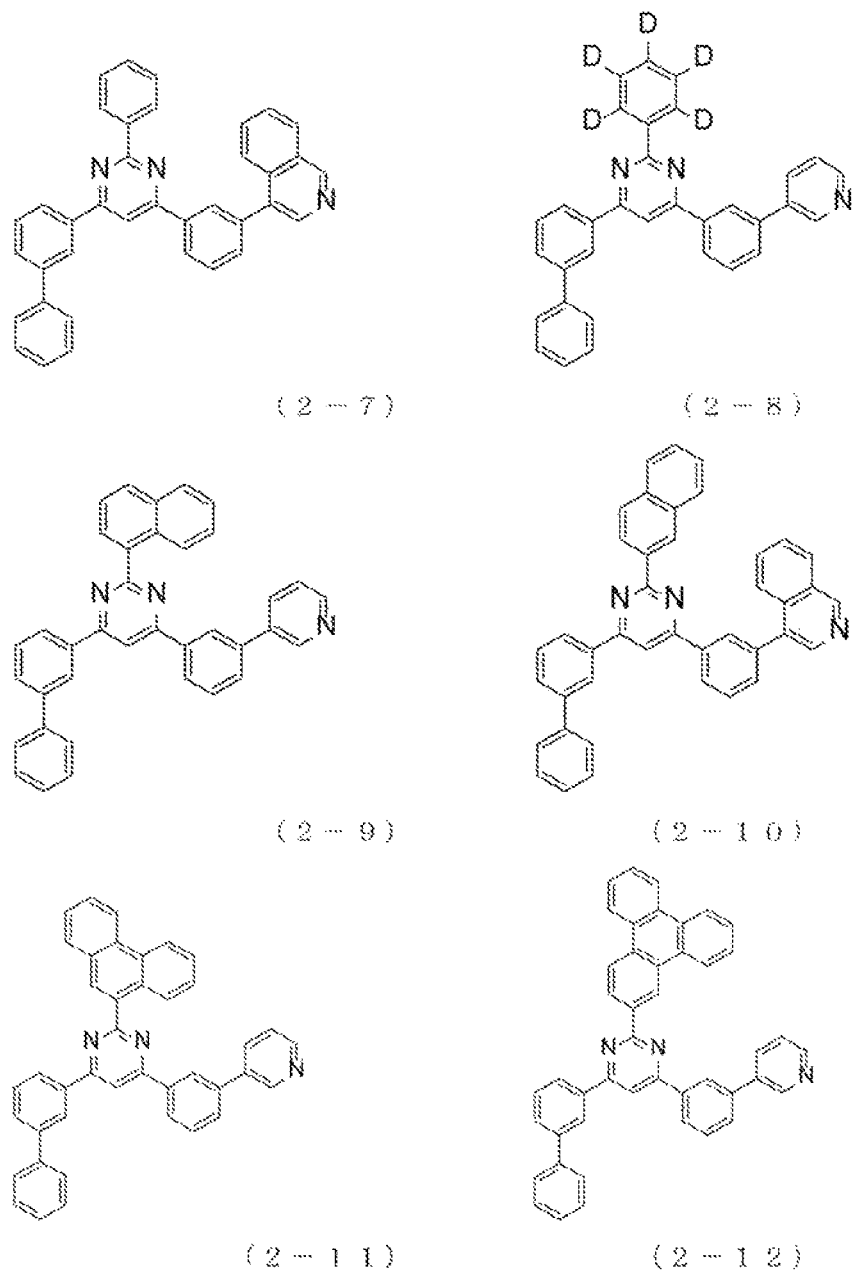
FIG. 27 shows the structural formulae of compounds 2-7 to 2-12, which are pyrimidine derivatives II.
Figure 28:
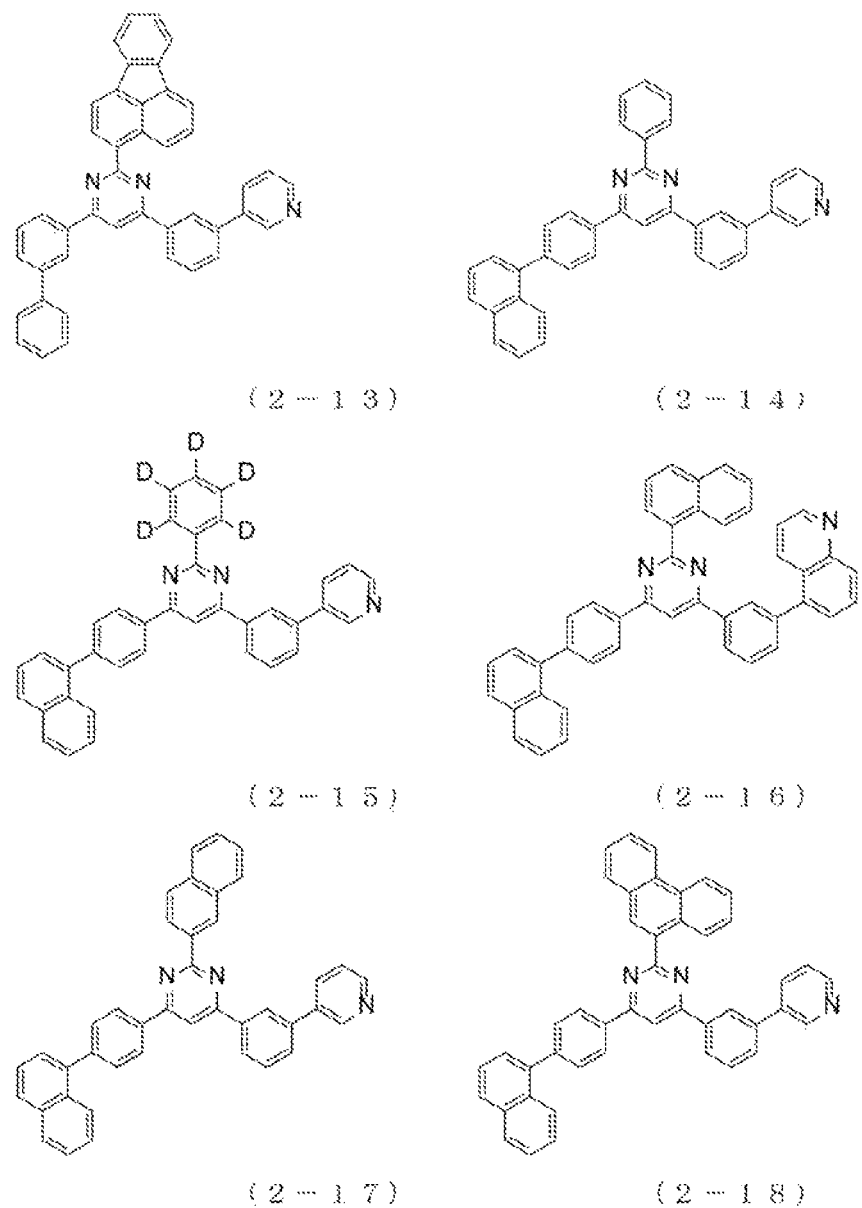
FIG. 28 shows the structural formulae of compounds 2-13 to 2-18, which are pyrimidine derivatives II.
Figure 29:
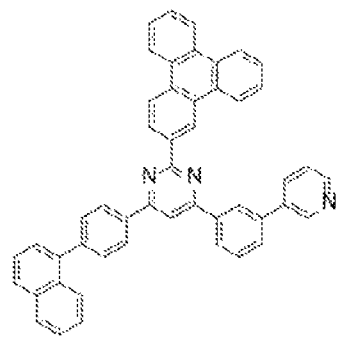
FIG. 29 shows the structural formulae of compounds 2-19 to 2-24, which are pyrimidine derivatives II.
Figure 29:
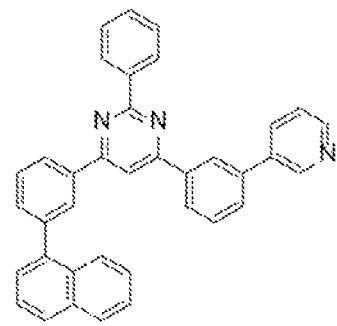
Figure 29:
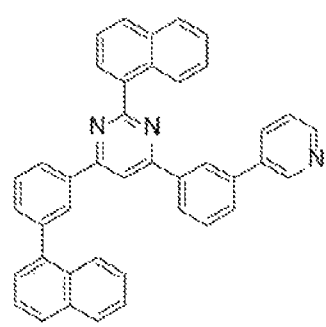
Figure 29:
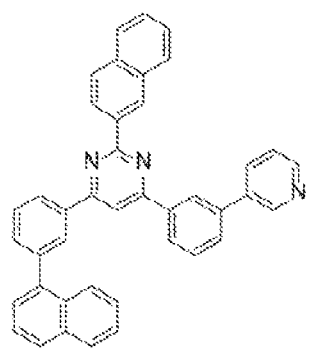
Figure 29:
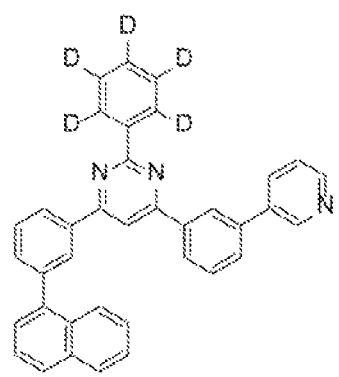
Figure 29:
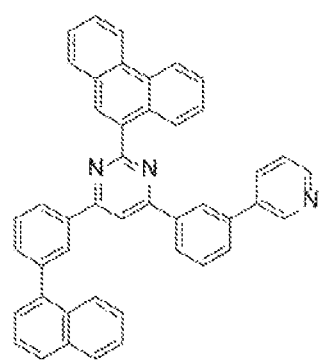
Figure 30:
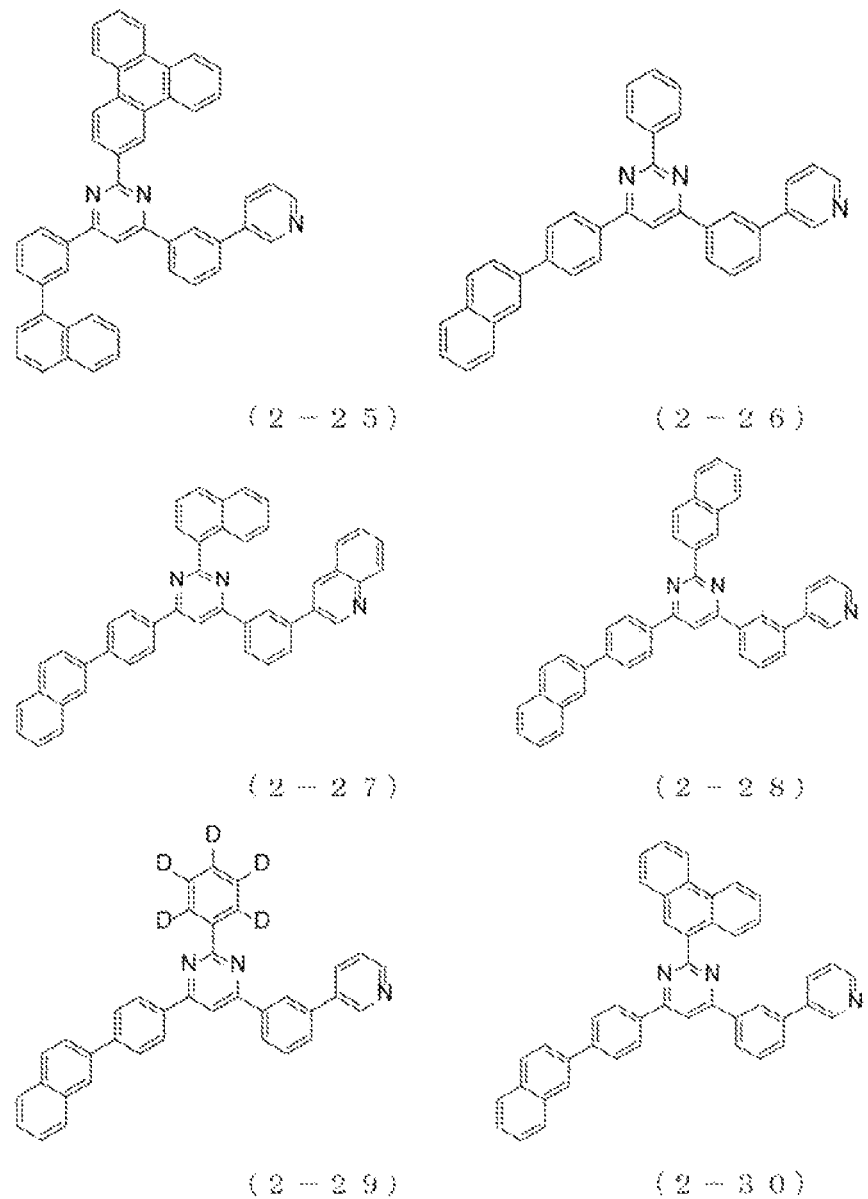
FIG. 30 shows the structural formulae of compounds 2-25 to 2-30, which are pyrimidine derivatives II.
Figure 31:
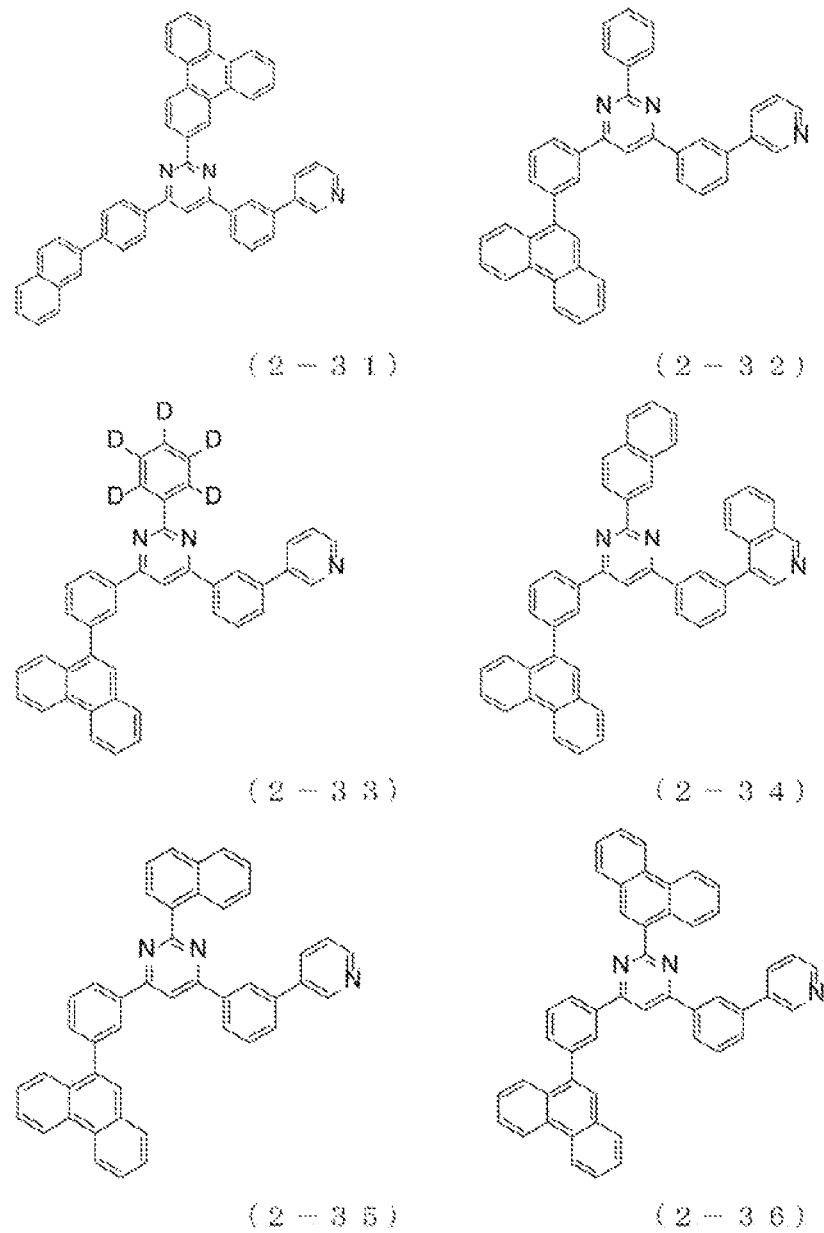
FIG. 31 shows the structural formulae of compounds 2-31 to 2-36, which are pyrimidine derivatives II.
Figure 32:
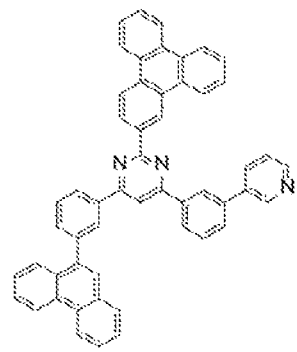
FIG. 32 shows the structural formulae of compounds 2-37 to 2-42, which are pyrimidine derivatives II.
Figure 32:
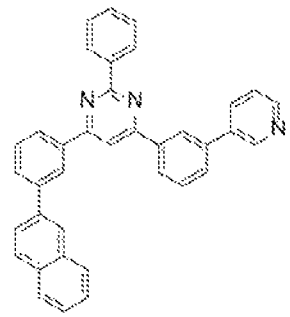
Figure 32:
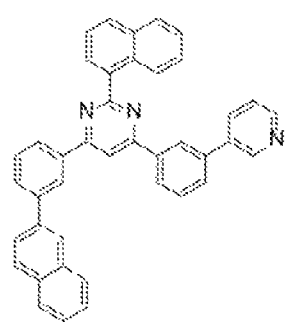
Figure 32:
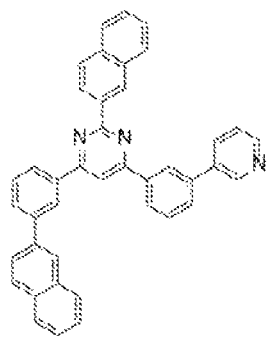
Figure 32:
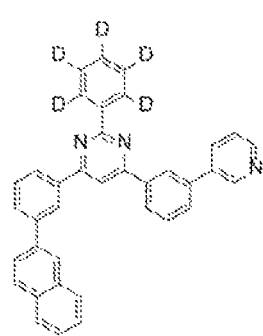
Figure 32:
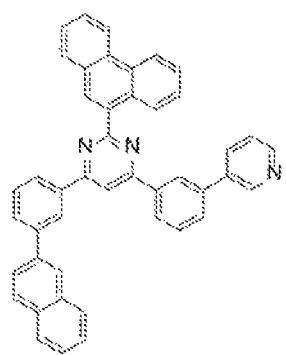
Figure 33:
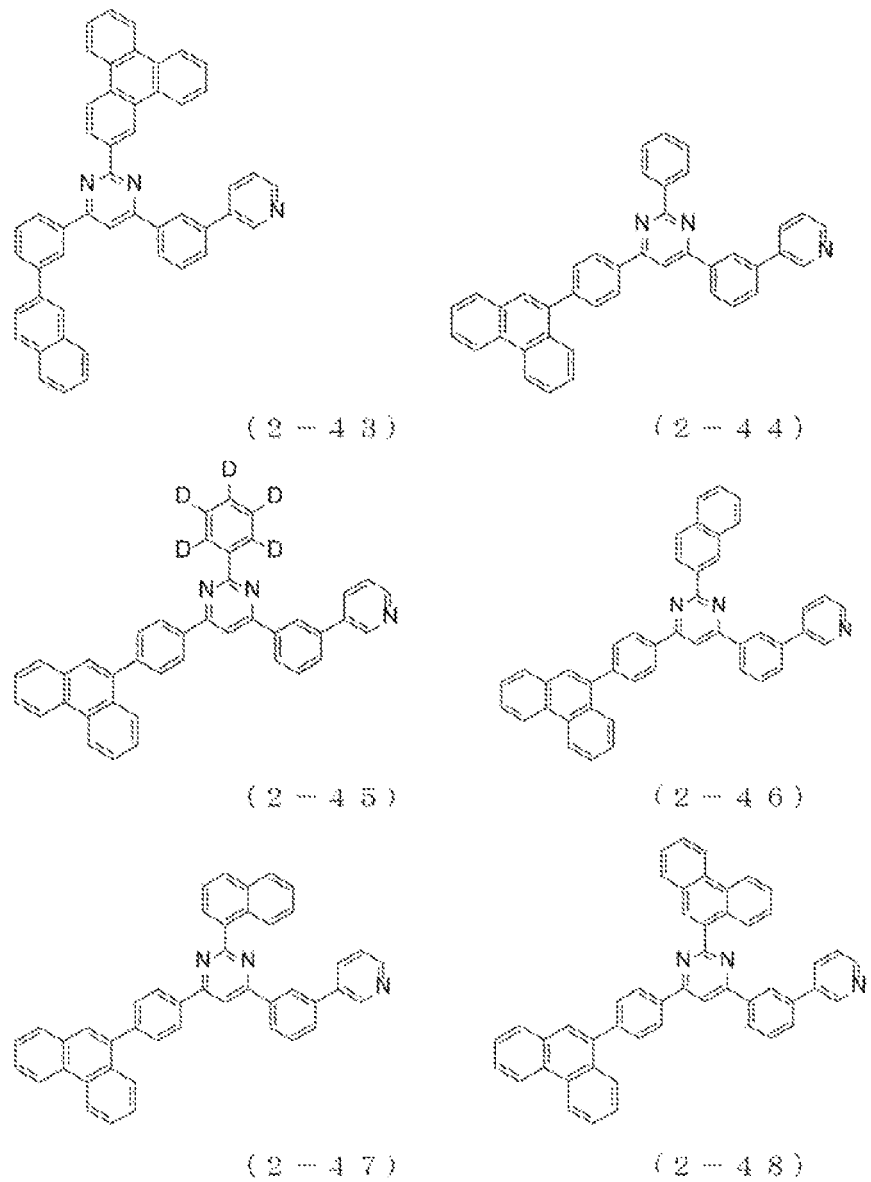
FIG. 33 shows the structural formulae of compounds 2-43 to 2-48, which are pyrimidine derivatives II.
Figure 34:
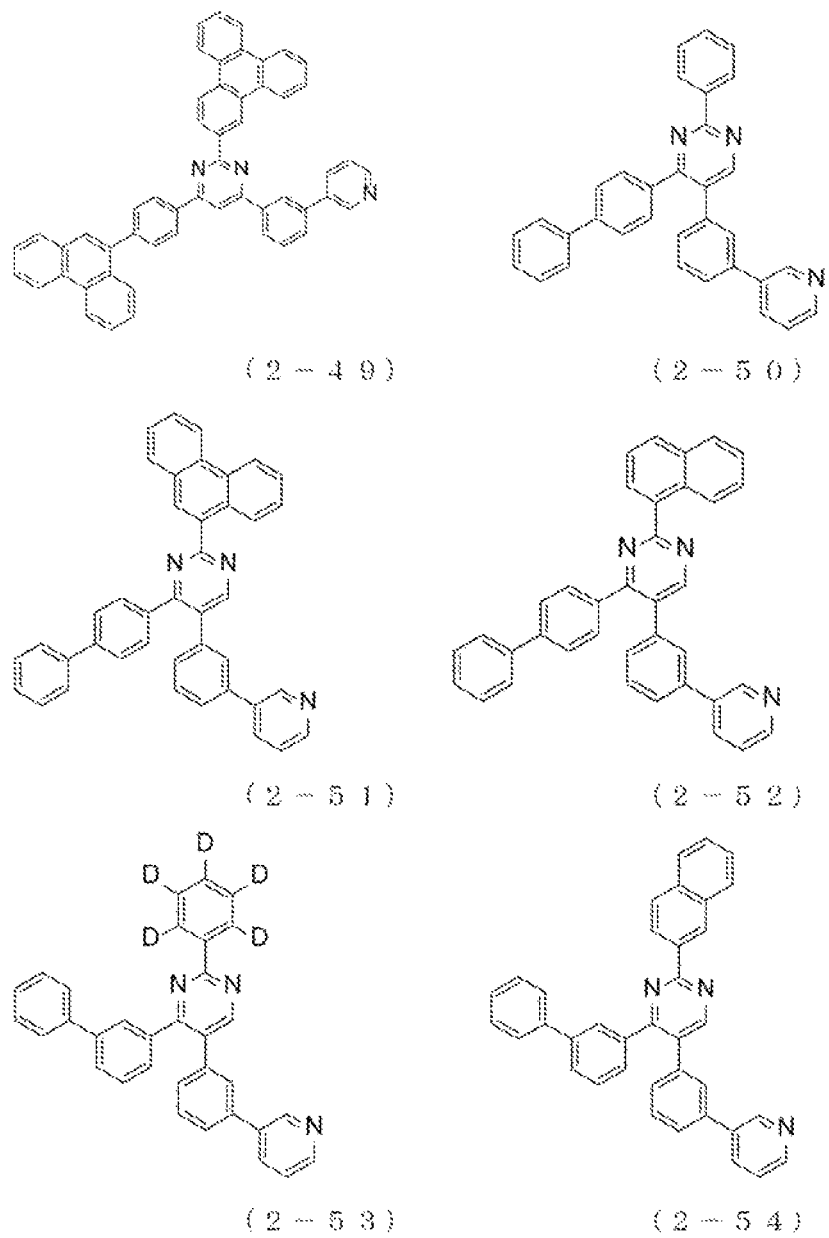
FIG. 34 shows the structural formulae of compounds 2-49 to 2-54, which are pyrimidine derivatives II.
Figure 35:
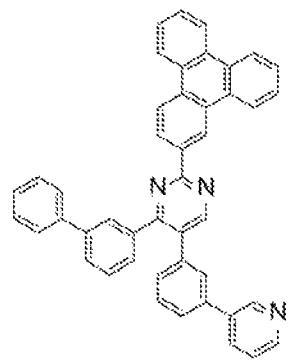
FIG. 35 shows the structural formulae of compounds 2-55 to 2-60, which are pyrimidine derivatives II.
Figure 35:
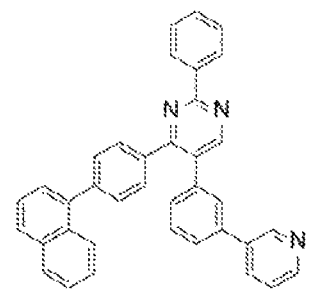
Figure 35:
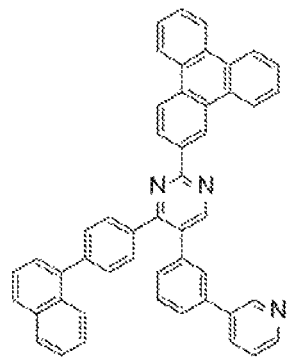
Figure 35:
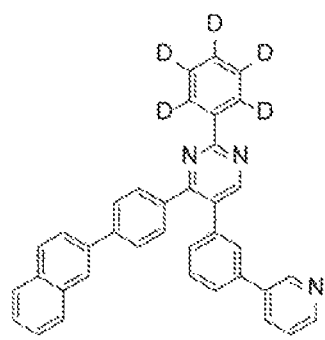
Figure 35:
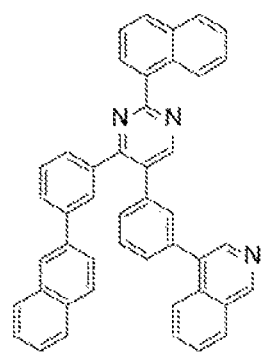
Figure 35:
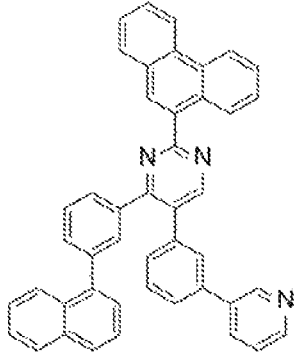
Figure 36:
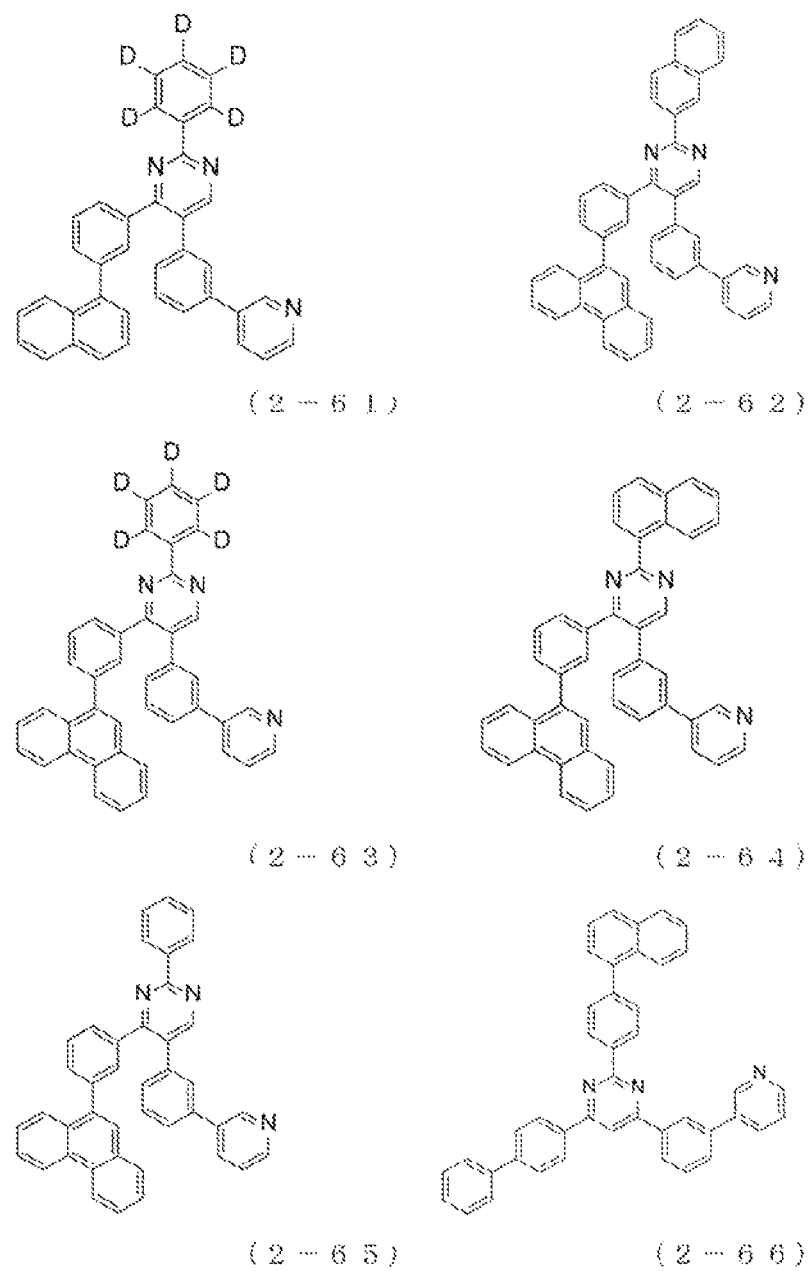
FIG. 36 shows the structural formulae of compounds 2-61 to 2-66, which are pyrimidine derivatives II.
Figure 37:
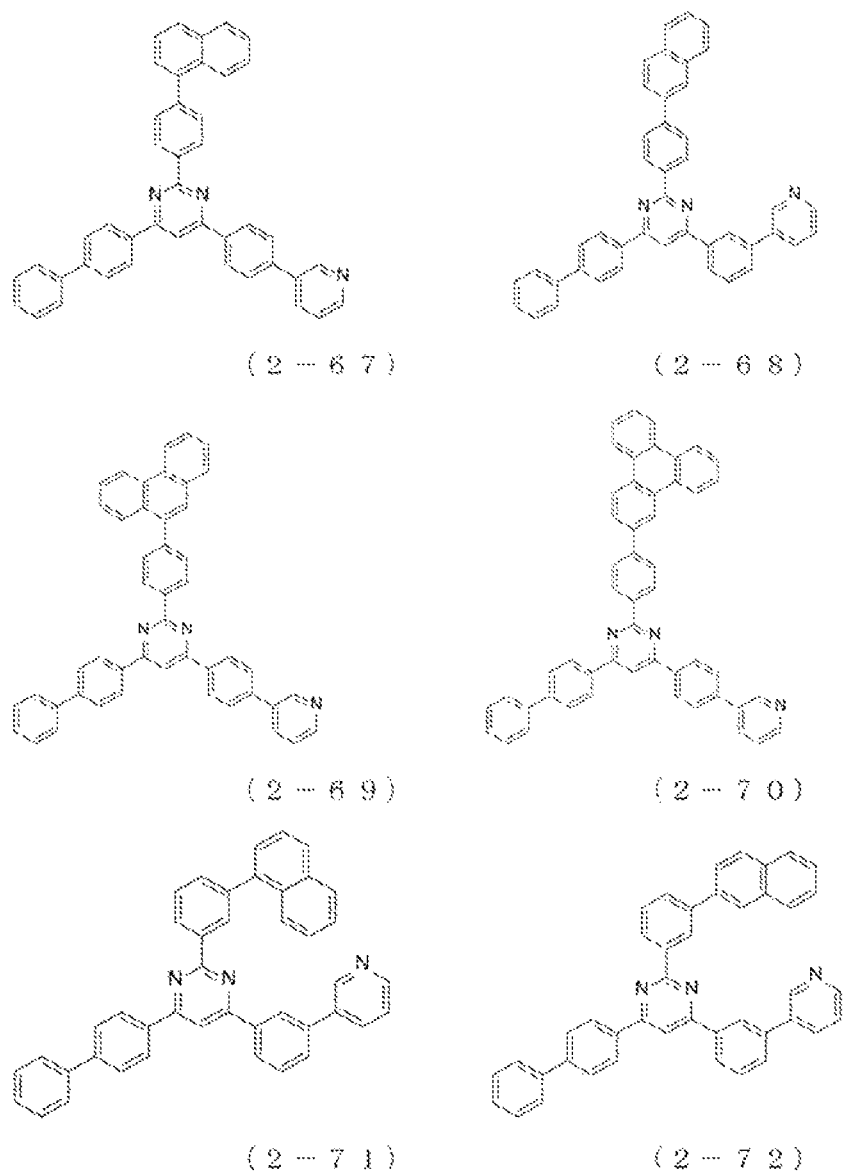
FIG. 37 shows the structural formulae of compounds 2-67 to 2-72, which are pyrimidine derivatives II.
Figure 38:
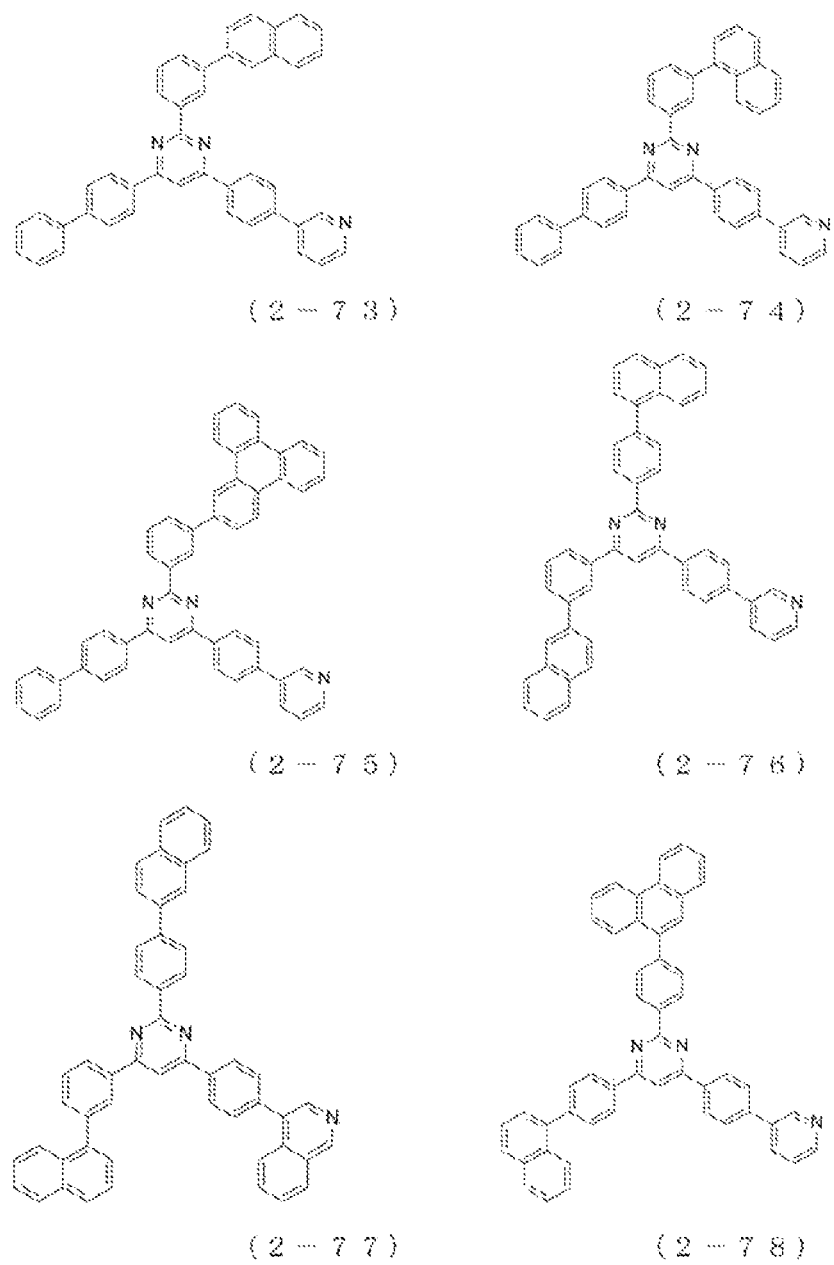
FIG. 38 shows the structural formulae of compounds 2-73 to 2-78, which are pyrimidine derivatives II.
Figure 39:
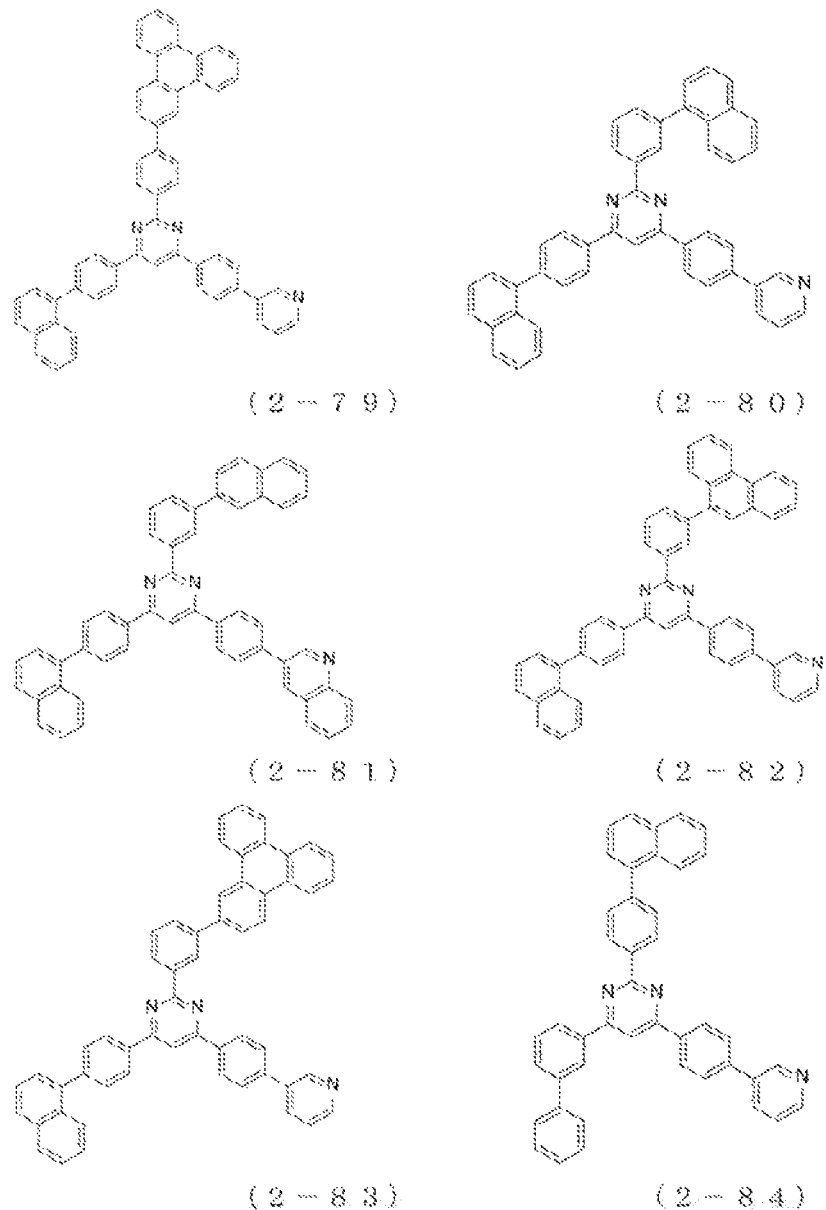
FIG. 39 shows the structural formulae of compounds 2-79 to 2-84, which are pyrimidine derivatives II.
Figure 40:
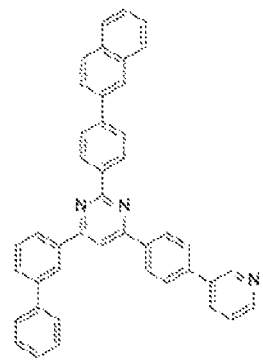
FIG. 40 shows the structural formulae of compounds 2-85 to 2-90, which are pyrimidine derivatives II.
Figure 40:
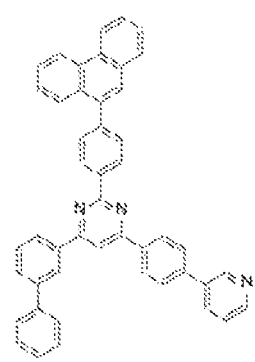
Figure 40:
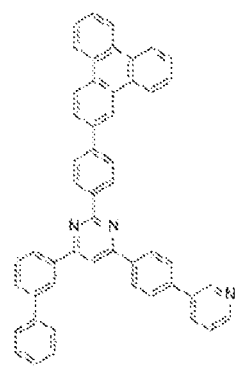
Figure 40:
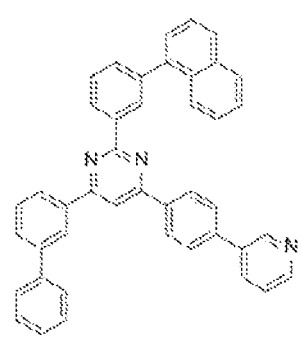
Figure 40:
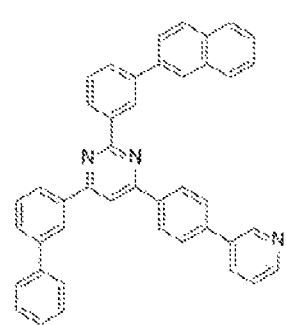
Figure 40:
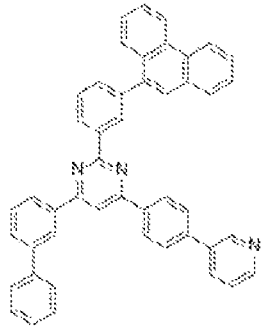
Figure 41:
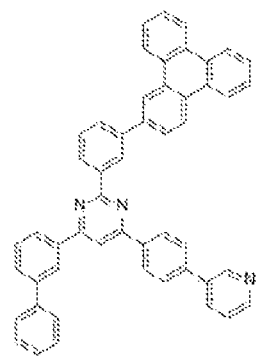
FIG. 41 shows the structural formulae of compounds 2-91 to 2-96, which are pyrimidine derivatives II.
Figure 41:
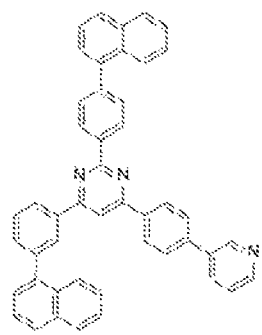
Figure 41:
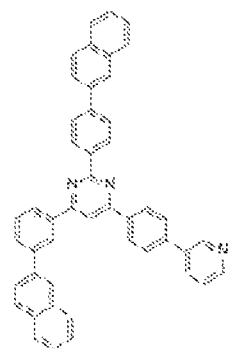
Figure 41:
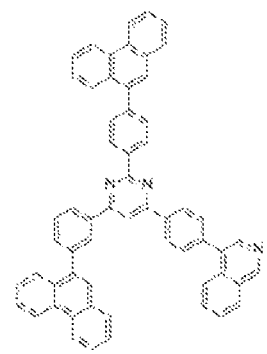
Figure 41:
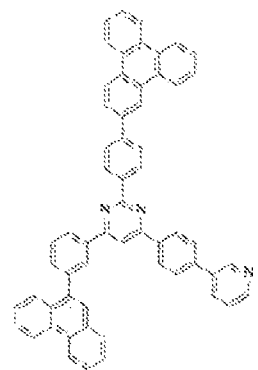
Figure 41:
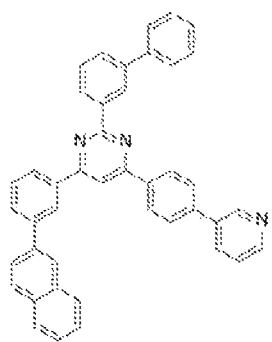
Figure 42:
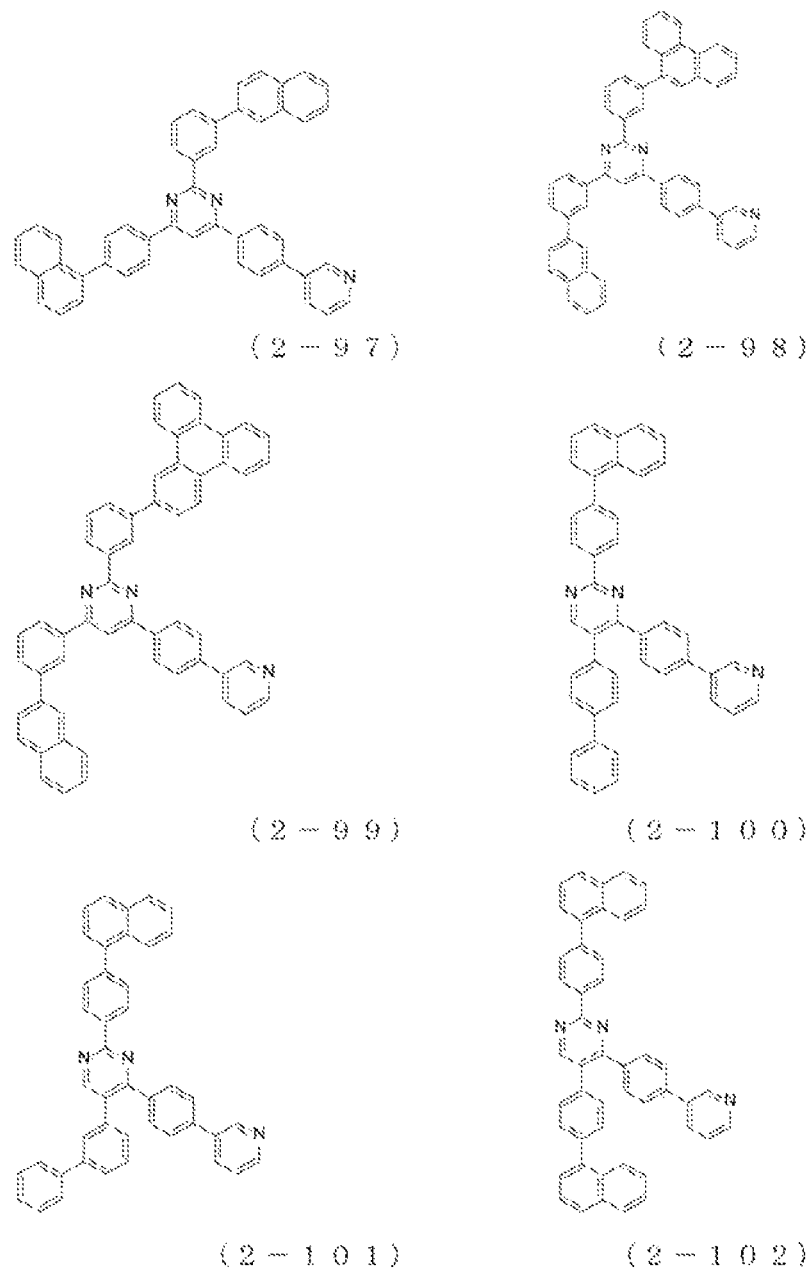
FIG. 42 shows the structural formulae of compounds 2-97 to 2-102, which are pyrimidine derivatives II.
Figure 43:
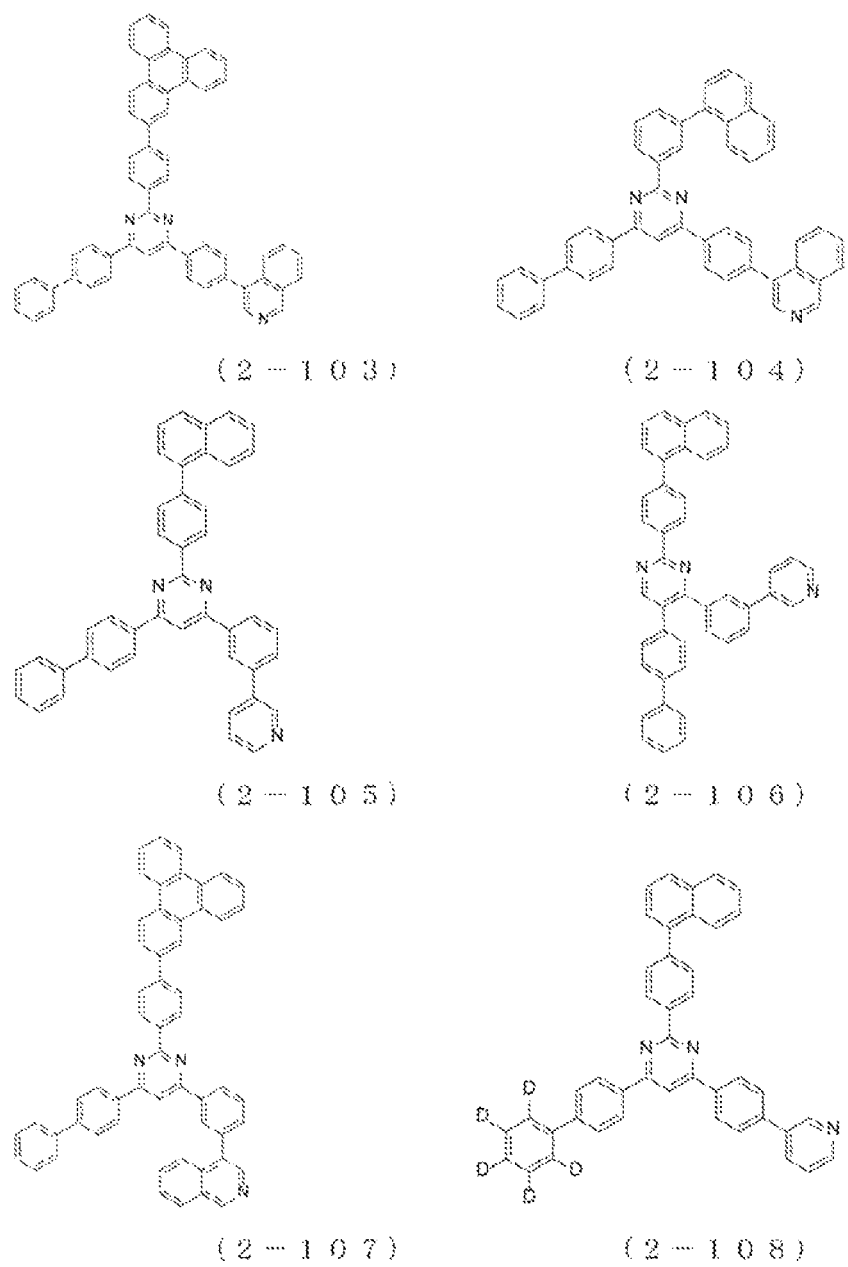
FIG. 43 shows the structural formulae of compounds 2-103 to 2-108, which are pyrimidine derivatives II.
Figure 44:
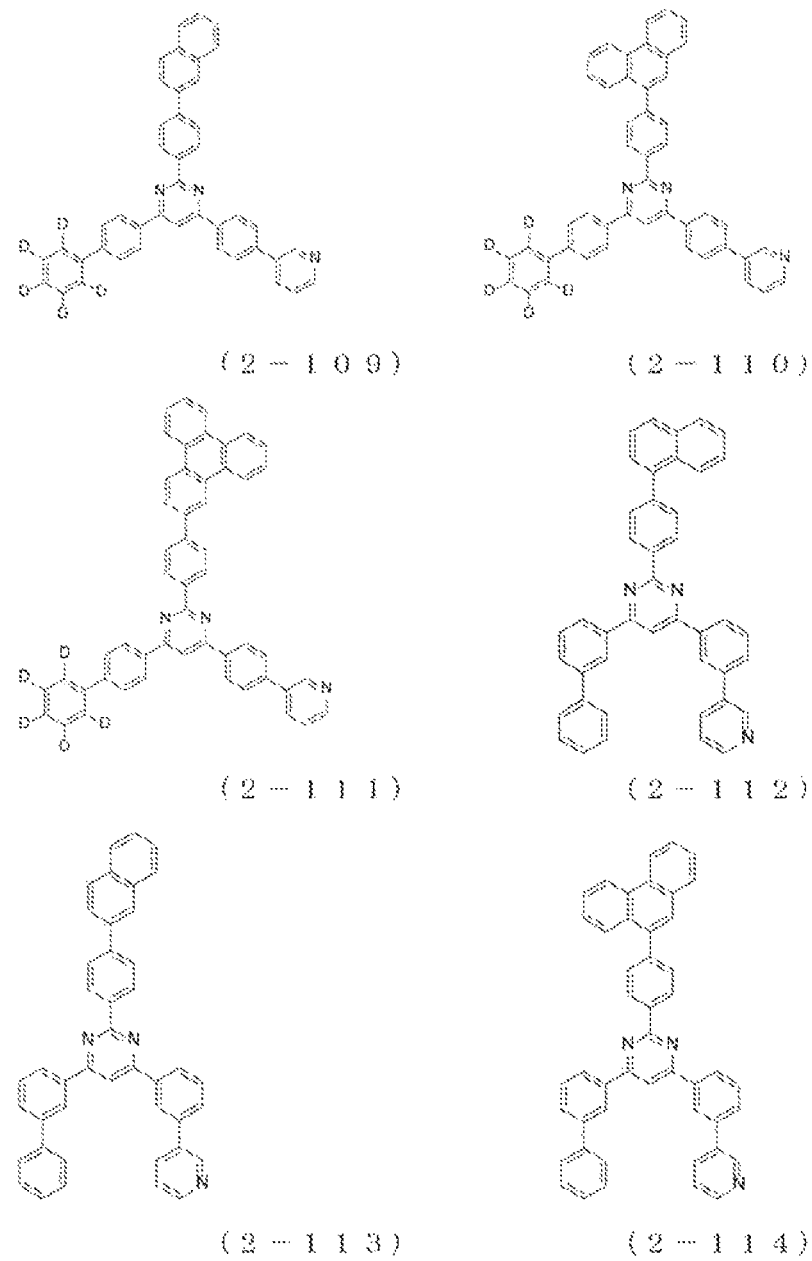
FIG. 44 shows the structural formulae of compounds 2-109 to 2-114, which are pyrimidine derivatives II.
Figure 45:
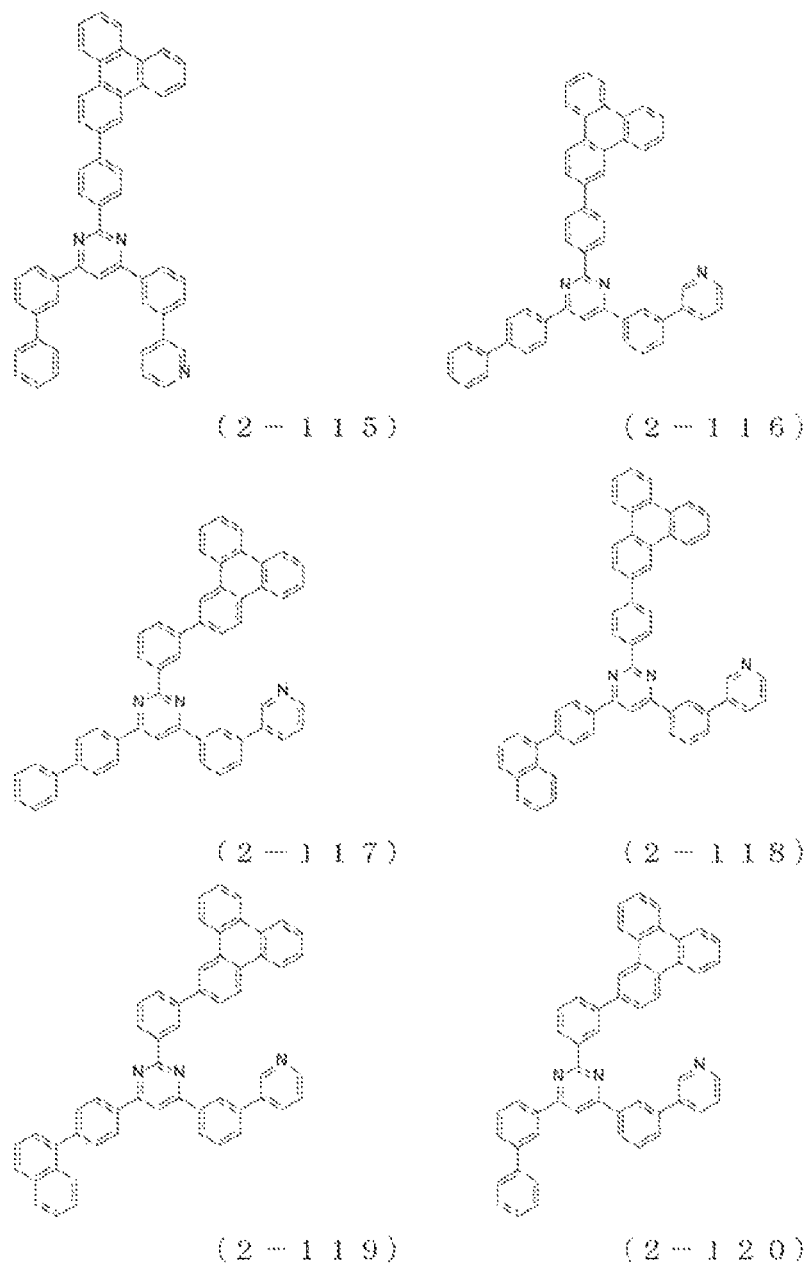
FIG. 45 shows the structural formulae of compounds 2-115 to 2-120, which are pyrimidine derivatives II.
Figure 46:
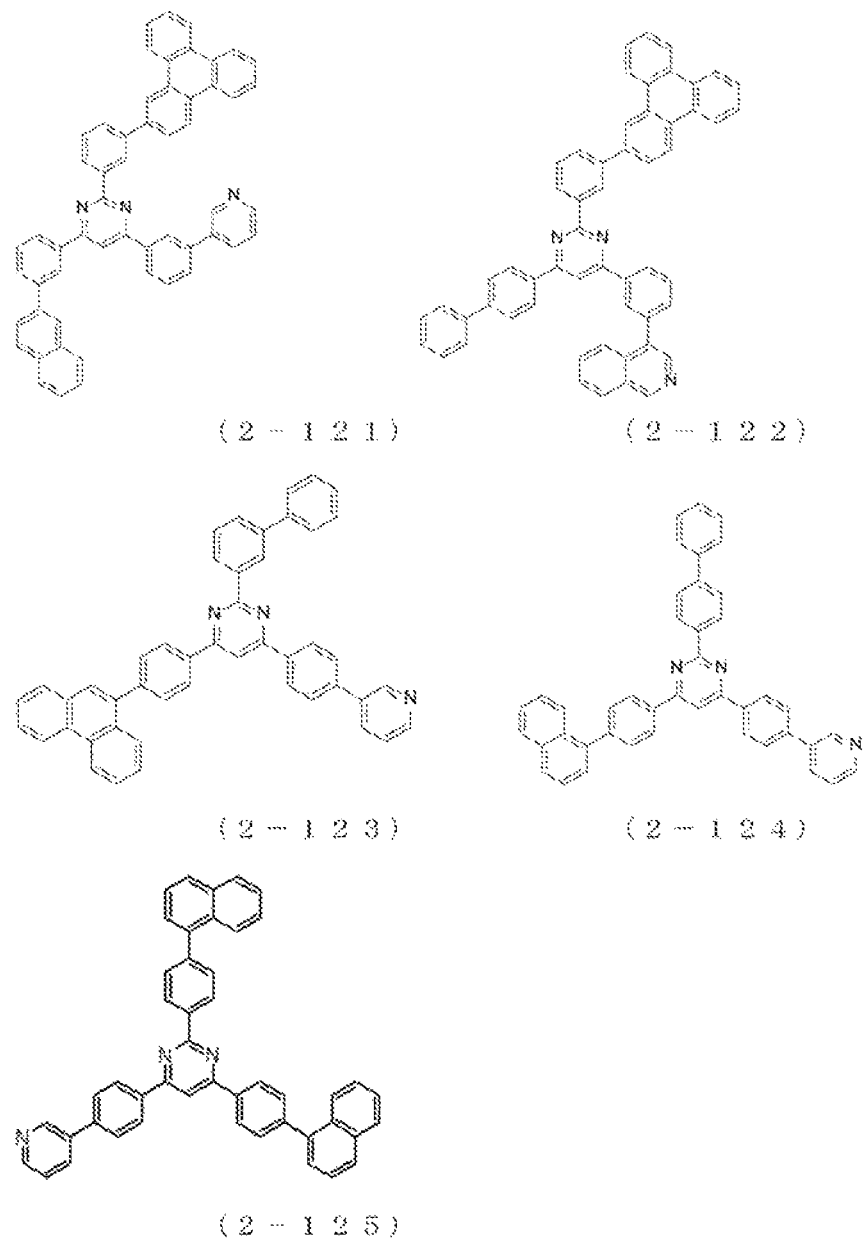
FIG. 46 shows the structural formulae of compounds 2-121 to 2-125, which are pyrimidine derivatives II.

An organic EL element of the present invention has a basic structure in which an anode, a hole injection layer, a first hole transport layer, a second hole transport layer, a light emitting layer, an electron transport layer, and a cathode are provided in this order on a substrate such as a glass substrate or a transparent plastic substrate (e.g., a polyethylene terephthalate substrate).

As long as the organic EL element of the present invention has this basic structure, its layer structure can take various forms. Examples thereof include a form in which an electron blocking layer is provided between the second hole transport layer and the light emitting layer, a form in which a hole blocking layer is provided between the light emitting layer and the electron transport layer, and a form in which an electron injection layer is provided between the electron transport layer and the cathode. In these multilayer structures, some organic layers can be omitted or can be combined into a single layer. For example, a configuration can be adopted in which an organic layer serves as both the electron injection layer and the electron transport layer.

Although detailed descriptions of the various layers will be given later, important features of the present invention are that the second hole transport layer contains an arylamine compound (hereinafter also referred to as "arylamine compound I") represented by the general formula (1), and furthermore, the electron transport layer contains a pyrimidine derivative (hereinafter also referred to as "pyrimidine derivative II") represented by the general formula (2). Hereinafter, the arylamine compound I and the pyrimidine derivative II will be described.

<Arylamine Compound I>

The arylamine compound I contained in the second hole transport layer has a structure represented by the following general formula (1):

[Chem. 11]

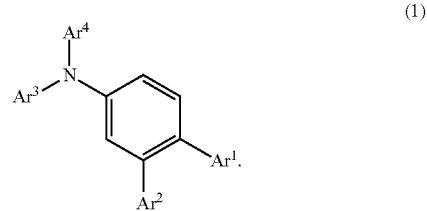

(1)

($Ar^1$ to $Ar^4$)

$Ar^1$ to $Ar^4$ may be the same or different, and represent an aromatic hydrocarbon group, an aromatic heterocyclic group, or a condensed polycyclic aromatic group.

Specific examples of the aromatic hydrocarbon group, the aromatic heterocyclic group, or the condensed polycyclic aromatic group represented by $Ar^1$ to $Ar^4$ include a phenyl group, a biphenylyl group, a terphenylyl group, a naphthyl group, an anthryl group, a phenanthryl group, a fluorenyl group, a spirobifluorenyl group, an indenyl group, a pyrenyl group, a perylenyl group, a fluoranthenyl group, a triphenylenyl group, a pyridyl group, a pyrimidyl group, a triazyl group, a furyl group, a pyrrolyl group, a thienyl group, a quinolyl group, an isoquinolyl group, a benzofuranyl group, a benzothienyl group, an indolyl group, a carbazolyl group, a benzooxazolyl group, a benzothiazolyl group, a quinoxalyl group, a benzimidazolyl group, a pyrazolyl group, a dibenzofuranyl group, a dibenzothienyl group, a naphthyridinyl group, a phenanthrolinyl group, an acridinyl group, a carbolinyl group, and the like.

The aromatic hydrocarbon group, the aromatic heterocyclic group, or the condensed polycyclic aromatic group represented by $Ar^1$ to $Ar^4$ may be unsubstituted or may have a substituent. Examples of the substituent include a heavy hydrogen atom, a cyano group, and a nitro group, as well as the following groups:

halogen atoms, for example, a fluorine atom, a chlorine atom, a bromine atom, and an iodine atom;

alkyl groups having 1 to 6 carbon atoms, for example, a methyl group, an ethyl group, an n-propyl group, an i-propyl group, an n-butyl group, a 2-methylpropyl group, a t-butyl group, an n-pentyl group, a 3-methylbutyl group, a tert-pentyl group, an n-hexyl group, an iso-hexyl group, and a tert-hexyl group;

alkyloxy groups having 1 to 6 carbon atoms, for example, a methyloxy group, an ethyloxy group, and a propyloxy group;

alkenyl groups, for example, a vinyl group and an allyl group;

aryloxy groups, for example, a phenyloxy group and a tolyloxy group;

arylalkyloxy groups, for example, a benzyloxy group and a phenethyloxy group;

aromatic hydrocarbon groups or condensed polycyclic aromatic groups, for example, a phenyl group, a biphenylyl group, a terphenylyl group, a naphthyl group, an anthracenyl group, an acenaphthenyl group, a phenanthryl group, a fluorenyl group, a spirobifluorenyl group, an indenyl group, a pyrenyl group, a perylenyl group, a fluoranthenyl group, and a triphenylenyl group; and aromatic heterocyclic groups, for example, a pyridyl group, a thienyl group, a furyl group, a pyrrolyl group, a quinolyl group, an isoquinolyl group, a benzofuranyl group, a benzothienyl group, an indolyl group, a carbazolyl group, a benzooxazolyl group, a benzothiazolyl group, a quinoxalyl group, a benzimidazolyl group, a pyrazolyl group, a dibenzofuranyl group, a dibenzothienyl group, and a carbolinyl group. These substituents may be unsubstituted, or may further be substituted by any of the substituents listed above as examples.

Moreover, these substituents may be present independently of each other without forming a ring, or may be bonded to each other to form a ring via a single bond, a methylene group, an oxygen atom, or a sulfur atom.

(Preferred Forms)

FIGS. 1 to 25 show specific examples of preferred compounds out of the arylamine compounds I, but the arylamine compound I is not limited to these compounds. Note that compound numbers 1-7, 1-14, 1-137, and 1-138 are skipped.

Of the specific examples, compounds 1-108 to 1-144 have a plurality of "phenyl groups having two substituents selected from an aromatic hydrocarbon group, an aromatic heterocyclic group, and a condensed polycyclic aromatic group", and the rightmost phenyl group, of the plurality of phenyl groups shown on the sheet corresponds to a phenyl group substituted by $Ar^1$ and $Ar^2$ in the general formula (1).

$Ar^1$ is preferably an aromatic hydrocarbon group or a condensed polycyclic aromatic group, and more preferably a phenyl group, a biphenylyl group, a terphenylyl group, a naphthyl group, or a fluorenyl group.

When the group represented by $Ar^1$ has a substituent, the substituent is preferably an alkyl group having 1 to 6 carbon atoms or a condensed polycyclic aromatic group, and more preferably an alkyl group having 1 to 6 carbon atoms, a naphthyl group, or a fluorenyl group.

$Ar^2$ is preferably an aromatic hydrocarbon group or a condensed polycyclic aromatic group, more preferably an aromatic hydrocarbon group, and even more preferably a phenyl group.

When the group represented by $Ar^2$ has a substituent, the substituent is preferably an alkyl group having 1 to 6 carbon atoms or a condensed polycyclic aromatic group.

$Ar^3$ is preferably an aromatic hydrocarbon group or a condensed polycyclic aromatic group, and more preferably a biphenylyl group or a fluorenyl group.

When $Ar^3$ is a phenyl group, and this phenyl group has, as a substituent, an aromatic hydrocarbon group, an aromatic heterocyclic group, or a condensed polycyclic aromatic group, it is preferable that the number of substituents is one.

When the group represented by $Ar^3$ has a substituent, the type of the substituent is preferably an alkyl group having 1 to 6 carbon atoms, an aromatic hydrocarbon group, an aromatic heterocyclic group, or a condensed polycyclic aromatic group, and more preferably an alkyl group having 1 to 6 carbon atoms or an aromatic hydrocarbon group.

$Ar^4$ is preferably an aromatic hydrocarbon group or a condensed polycyclic aromatic group.

When $Ar^4$ is a phenyl group, and this phenyl group has, as a substituent, an aromatic hydrocarbon group, an aromatic heterocyclic group, or a condensed polycyclic aromatic group, it is preferable that the number of substituents is one.

When the group represented by $Ar^4$ has a substituent, the substituent is preferably an alkyl group having 1 to 6 carbon atoms, an aromatic hydrocarbon group, or a condensed polycyclic aromatic group, and more preferably an alkyl group having 1 to 6 carbon atoms or an aromatic hydrocarbon group.

Alternatively, the substituent which the aromatic hydrocarbon group, the aromatic heterocyclic group, or the condensed polycyclic aromatic group represented by $Ar^1$ to $Ar^4$ may have is preferably a heavy hydrogen atom, an alkyl group having 1 to 6 carbon atoms, an alkenyl group having 2 to 6 carbon atoms, an aromatic hydrocarbon group, or a condensed polycyclic aromatic group, and more preferably a heavy hydrogen atom, a phenyl group, a biphenylyl group, a naphthyl group, or a vinyl group.

A form is also preferable in which these substituents are bonded to each other via a single bond to form a condensed aromatic ring.

The arylamine I can be produced using a known method such as Suzuki coupling.

After being synthesized, the arylamine compound I may be subjected to purification through column chromatography; adsorption purification using silica gel, activated carbon, activated clay, or the like; recrystallization or crystallization using a solvent; or the like. Finally, the arylamine compound I may also be subjected to purification through sublimation purification or the like. Identification of the compound is performed through NMR analysis. The glass transition point (Tg) and work function are measured as physical properties. The glass transition point (Tg) is an indicator of the stability in a thin film state. The work function is an indicator of the hole transportability.

The glass transition point (Tg) can be obtained using a powder and a high-sensitivity differential scanning calorimeter (DSC3100S manufactured by Bruker AXS K.K.).

The work function can be obtained by forming a 100-nm thin film on an ITO substrate and performing the measurement using an ionization potential measuring device (PYS-202 from Sumitomo Heavy Industries, Ltd.).

Compounds (specifically, the pyrimidine derivative II, a triarylamine compound III, a triarylamine compound IV, and the like, which will be described later) that are to be used in the organic EL element of the present invention in addition to the arylamine compound I can also be subjected to purification and various types of measurement using similar methods, after the synthesis.

<Pyrimidine Derivative II>

The pyrimidine derivative II contained in the electron transport layer is represented by the following general formula (2):

[Chem. 12]

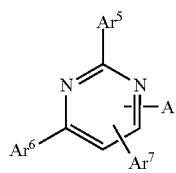

(2)

Pyrimidine derivatives II are broadly divided into the following two forms depending on the positional relationship between —$Ar^7$ and -A:

[Chem. 13]

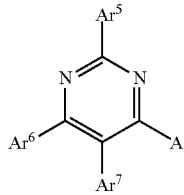

(2a)

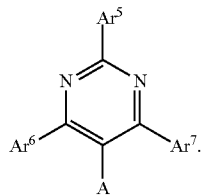

(2b)

($Ar^5$ to $Ar^7$)

$Ar^5$ represents an aromatic hydrocarbon group or a condensed polycyclic aromatic group. $Ar^6$ and $Ar^7$ may be the same or different, and represent a hydrogen atom, an aromatic hydrocarbon group, or a condensed polycyclic aromatic group. $Ar^6$ and $Ar^7$ do not both represent a hydrogen atom.

Specific examples of the aromatic hydrocarbon group or the condensed polycyclic aromatic group represented by $Ar^5$ to $Ar^7$ include a phenyl group, a biphenylyl group, a terphenylyl group, a tetrakisphenyl group, a styryl group, a naphthyl group, an anthracenyl group, an acenaphthenyl group, a phenanthrenyl group, a fluorenyl group, a spirobifluorenyl group, an indenyl group, a pyrenyl group, a perylenyl group, a fluoranthenyl group, a triphenylenyl group, and the like.

The aromatic hydrocarbon group or the condensed polycyclic aromatic group represented by $Ar^5$ to $Ar^7$ may be unsubstituted, or may have a substituent. Examples of the substituent are similar to those listed above as examples of the substituent which the aromatic hydrocarbon group, the aromatic heterocyclic group, or the condensed polycyclic aromatic group represented by $Ar^1$ to $Ar^4$ may have. The same holds true for the forms that the substituent can take.

(A)

A represents a monovalent group represented by the following structural formula (3).

[Chem. 14]

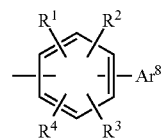

(3)

$Ar^8$ represents an aromatic heterocyclic group. Specific examples of the aromatic heterocyclic group represented by $Ar^8$ include a triazinyl group, a pyridyl group, a pyrimidinyl group, a furyl group, a pyrrolyl group, a thienyl group, a quinolyl group, an isoquinolyl group, a benzofuranyl group, a benzothienyl group, an indolyl group, a carbazolyl group, a benzooxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carbolinyl group, and the like.

The aromatic heterocyclic group represented by $Ar^8$ may be unsubstituted, or may have a substituent. Examples of the substituent are similar to those listed above as examples of the substituent which the aromatic hydrocarbon group, the aromatic heterocyclic group, or the condensed polycyclic aromatic group represented by $Ar^1$ to $Ar^4$ may have. The same holds true for the forms that the substituent can take.

$R^1$ to $R^4$ may be the same or different, and represent a hydrogen atom, a heavy hydrogen atom, a fluorine atom, a chlorine atom, a cyano group, a trifluoromethyl group, an alkyl group having 1 to 6 carbon atoms, an aromatic hydrocarbon group, an aromatic heterocyclic group, or a condensed polycyclic aromatic group. $R^1$ to $R^4$ and $Ar^8$ may be bonded to each other to form a ring via a single bond, a methylene group, an oxygen atom, or a sulfur atom.

Specific examples of the alkyl group having 1 to 6 carbon atoms represented by $R^1$ to $R^4$ include a methyl group, an ethyl group, an n-propyl group, an i-propyl group, an n-butyl group, a 2-methylpropyl group, a t-butyl group, an n-pentyl group, a 3-methylbutyl group, a tert-pentyl group, an n-hexyl group, an iso-hexyl group, a tert-hexyl group, and the like.

Specific examples of the aromatic hydrocarbon group, the aromatic heterocyclic group, or the condensed polycyclic aromatic group represented by $R^1$ to $R^4$ include a phenyl group, a biphenylyl group, a terphenylyl group, a tetrakisphenyl group, a styryl group, a naphthyl group, an anthracenyl group, an acenaphthenyl group, a phenanthrenyl group, a fluorenyl group, a spirobifluorenyl group, an indenyl group, a pyrenyl group, a perylenyl group, a fluoranthenyl group, a triphenylenyl group, a triazinyl group, a pyridyl group, a pyrimidinyl group, a furyl group, a pyrrolyl group, a thienyl group, a quinolyl group, an isoquinolyl group, a benzofuranyl group, a benzothienyl group, an indolyl group, a carbazolyl group, a benzooxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carbolinyl group, and the like.

The alkyl group having 1 to 6 carbon atoms, the aromatic hydrocarbon group, the aromatic heterocyclic group, or the condensed polycyclic aromatic group represented by $R^1$ to $R^4$ may be unsubstituted, or may have a substituent. Examples of the substituent are similar to those listed above as examples of the substituent which the aromatic hydrocarbon group, the aromatic heterocyclic group, or the condensed polycyclic aromatic group represented by $Ar^1$ to $Ar^4$ may have. The same holds true for the forms that the substituent can take.

The pyrimidine derivative II can be synthesized using a method that is known per se (see Patent Literatures 6 and 7). (Preferred Forms)

FIGS. 26 to 46 show specific examples of preferred compounds out of the pyrimidine derivatives II, but the pyrimidine derivative II is not limited to these compounds. Note that D represents heavy hydrogen.

It is preferable that the pyrimidine derivative II is represented by the general formula (2a) above.

Of the specific examples shown in FIGS. 26 to 46, compounds 2-1 to 2-49, 2-66 to 2-99, 2-103 to 2-105, and 2-107 to 2-125 correspond to the general formula (2a).

Moreover, $Ar^5$ in the general formula (2) is preferably a phenyl group, a biphenylyl group, a naphthyl group, an anthracenyl group, an acenaphthenyl group, a phenanthrenyl group, a fluorenyl group, a spirobifluorenyl group, an indenyl group, a pyrenyl group, a perylenyl group, a fluoranthenyl group, or a triphenylenyl group, and more preferably a phenyl group, a biphenylyl group, a naphthyl group, an anthracenyl group, a phenanthrenyl group, a pyrenyl group, a fluoranthenyl group, or a triphenylenyl group.

When the group represented by $Ar^5$ has a substituent, the substituent is preferably a deuterium atom or a condensed polycyclic aromatic group, and more preferably a deuterium atom, a naphthyl group, an anthracenyl group, a phenanthrenyl group, a pyrenyl group, a fluoranthenyl group, or a triphenylenyl group.

$Ar^6$ is preferably an aromatic hydrocarbon group or a condensed polycyclic aromatic group that may be unsubstituted or may have, as a substituent, a group other than an aromatic heterocyclic group. In particular, a phenyl group having a substituent other than an aromatic heterocyclic group is preferable. In this case, the substituent is preferably an aromatic hydrocarbon group such as a phenyl group, a biphenylyl group, or a terphenyl group; or a condensed polycyclic aromatic group such as a naphthyl group, an anthracenyl group, an acenaphthenyl group, a phenanthrenyl group, a fluorenyl group, a spirobifluorenyl group, an indenyl group, a pyrenyl group, a perylenyl group, a fluoranthenyl group, or a triphenylenyl group, and more preferably a phenyl group, a naphthyl group, an anthracenyl group, a phenanthrenyl group, a pyrenyl group, a fluoranthenyl group, or a triphenylenyl group.

$Ar^7$ is preferably a hydrogen atom.

$Ar^8$ in the structural formula (3) is preferably a nitrogen-containing heterocyclic group, for example, a triazinyl group, a pyridyl group, a pyrimidinyl group, a pyrrolyl group, a quinolyl group, an isoquinolyl group, an indolyl group, a carbazolyl group, a benzooxazolyl group, a benzothiazolyl group, a quinoxalinyl group, a benzimidazolyl group, a pyrazolyl group, a naphthyridinyl group, a phenanthrolinyl group, an acridinyl group, a carbolinyl group, or the like, more preferably a triazinyl group, a pyridyl group, a pyrimidinyl group, a quinolyl group, an isoquinolyl group, an indolyl group, a quinoxalinyl group, a benzimidazolyl group, a naphthyridinyl group, a phenanthrolinyl group, or an acridinyl group, and even more preferably a pyridyl group, a pyrimidinyl group, a quinolyl group, an isoquinolyl group, an indolyl group, a quinoxalinyl group, a benzimidazolyl group, a phenanthrolinyl group, or an acridinyl group.

It is preferable that the nitrogen-containing heterocyclic group is unsubstituted.

$R^1$ to $R^4$ preferably represent a hydrogen atom or a heavy hydrogen atom.

In light of the stability of a thin film, it is preferable that, as shown in the structural formula (3a) below, the binding position of $Ar^8$ in the benzene ring in the structural formula (3) is the meta-position relative to the binding position of the pyrimidine ring shown in the general formula (2):

[Chem. 15]

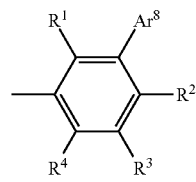

(3a)

where $Ar^8$ and $R^1$ to $R^4$ are as defined in the structural formula (3).

Of the specific examples shown in FIGS. 26 to 46, compounds 2-1 to 2-66, 2-68, 2-71 to 2-72, 2-105 to 2-107, and 2-112 to 2-122 have a group A represented by the structural formula (3a).

Alternatively, in light of ease of synthesis, it is preferable that the binding position of $Ar^8$ in the benzene ring in the structural formula (3) is the para-position relative to the binding position of the pyrimidine ring shown in the general formula (2).

In the general formula (2), in light of the stability of a thin film, it is preferable that $Ar^5$ and $Ar^6$ are not the same.

Here, when $Ar^5$ and $Ar^6$ represent the same group, $Ar^5$ and $Ar^6$ may be substituted by different substituents, or alternatively may be substituted at different positions. The same applies to the case where $Ar^6$ and $Ar^7$ represent the same group.

In the general formula (2), $Ar^6$ and $Ar^7$ may represent the same group, but an improvement in symmetry of the entire molecule may make crystallization more likely to occur, and therefore, it is preferable, in light of the stability of a thin film, that $Ar^6$ and $Ar^7$ are different groups. Moreover, it is preferable that one of $Ar^6$ and $Ar^7$ is a hydrogen atom.

<Organic EL Element>

In the organic EL element of the present invention, the layers can take various forms as long as they fulfill the conditions that the arylamine compound I is contained in the second hole transport layer and the pyrimidine derivative II is contained in the electron transport layer. Hereinafter, the layers will be described in detail with reference to FIG. 56.

(Anode 2)

An electrode material having a high work function, such as ITO or gold, is used as the anode.

(Hole Injection Layer 3)

A hole injection layer 3 is provided between the anode 2 and a first hole transport layer 4. Preferably, the arylamine compound I represented by the general formula (1) above, the triarylamine compound III represented by the general formula (4), which will be described later, or the triarylamine compound IV represented by the general formula (5), which will be described later, is used for the hole injection layer 3, because these compounds have high hole mobility.

Alternatively, a known material can also be used for the hole injection layer 3. As such a known material, for example, materials such as starburst triarylamine derivatives and various triarylamine tetramers; porphyrin compounds typified by copper phthalocyanine; acceptor type heterocyclic compounds such as hexacyanoazatriphenylene; coating type polymer materials; and the like can be used.

Moreover, a material normally used for a hole injection layer can be further P-doped with trisbromophenylamine hexachloroantimony, a radialene derivative (see WO 2014/009310), or the like and used for the hole injection layer 3, or a polymer compound having the structure of a benzidine derivative, such as TPD, in a partial structure thereof, or the like can be used for the hole injection layer 3.

The hole injection layer 3 can be formed by using these materials and performing thin-film formation using a known method such as vapor deposition, spin coating, or inkjet printing. The layers that will be described below can also be obtained in a similar manner, by performing thin-film formation using a known method such as vapor deposition, spin coating, or inkjet printing.

(First Hole Transport Layer 4)

The first hole transport layer 4 is provided between the above-described hole injection layer 3 and a second hole transport layer 5. The first hole transport layer 4 can contain a known material exemplified by the following materials:

benzidine derivatives, for example,
N,N'-diphenyl-N,N'-di(m-tolyl)benzidine (hereinafter referred to simply as TPD),
N,N'-diphenyl-N,N'-di(α-naphthyl)benzidine (hereinafter referred to simply as NPD),
N,N,N',N'-tetrabiphenylyl benzidine, and the like;
1,1-bis[4-(di-4-tolylamino)phenyl]cyclohexane (TAPC); and triarylamine compounds having hole transportability, for example,
a triarylamine compound having three to six triarylamine structures in a molecule, the triarylamine compound having a structure in which the triarylamine structures are linked via a divalent group having no heteroatom or a single bond (hereinafter also referred to simply as "triarylamine compound having three to six triarylamine structures"), and
a triarylamine compound having two triarylamine structures in a molecule, the triarylamine compound having a structure in which the triarylamine structures are linked via a divalent group having no heteroatom or a single bond (hereinafter also referred to simply as "triarylamine compound having two triarylamine structures").

However, when a triarylamine compound having hole transportability is used for the first hole transport layer 4, the composition of the first hole transport layer 4 needs to be different from the composition of the hole injection layer 3.

A triarylamine compound having three to six triarylamine structures or a triarylamine compound having two triarylamine structures is favorably used for the first hole transport layer 4.

Figure 55:
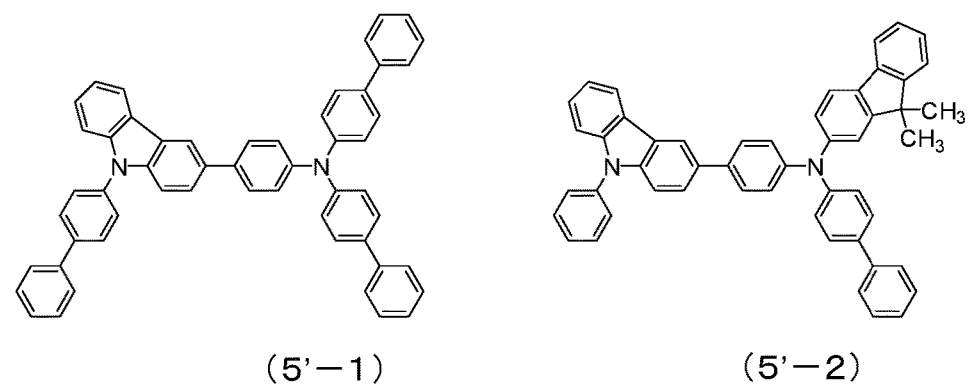
FIG. 55 shows the structural formulae of triarylamine compounds having two triarylamine structures, other than triarylamine compounds IV.

Note that a triarylamine compound as used herein also includes a form in which, as in compounds 5'-1 and 5'-2 in FIG. 55, two benzene rings in a triarylamine structure are bonded to each other via a single bond, that is, a form that has a carbazole ring structure.

The triarylamine compound III represented by the general formula (4), which will be described later, is preferable as the triarylamine compound having three to six triarylamine structures, because, in addition to the hole transportability, the triarylamine compound III has excellent thin film stability and heat resistance, and, furthermore, is easy to synthesize.

The triarylamine compound IV represented by the general formula (5), which will be described later, is preferable as the triarylamine compound having two triarylamine structures, because, in addition to the hole transportability, the triarylamine compound IV has excellent thin film stability and heat resistance, and, furthermore, is easy to synthesize.

Triarylamine Compound III Represented by General Formula (4)

[Chem. 16]

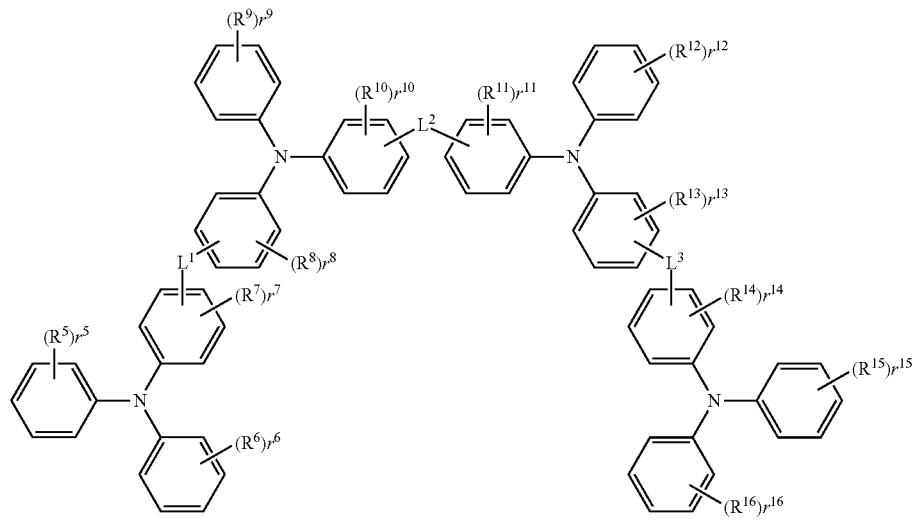

(4)

The triarylamine compound represented by the general formula (4) has four triarylamine structures in a molecule. The triarylamine structures are linked via a divalent group having no heteroatom or a single bond.

($r^5$ to $r^{16}$)

$r^5$ to $R^{16}$ each indicate the number of groups $R^5$ to $R^{16}$ bonded to a benzene ring. $r^5$, $r^6$, $r^9$, $r^{12}$, $r^{15}$, and $r^{16}$ may be the same or different, and represent an integer of 0 to 5, while $r^7$, $r^8$, $r^{10}$, $r^{11}$, $r^{13}$, and $r^{14}$ may be the same or different, and represent an integer of 0 to 4.

When any of $r^5$ to $r^{16}$ is 0, it means that the corresponding one of $R^5$ to $R^{16}$ is not present on the benzene ring, that is, the benzene ring is not substituted by the group represented by the corresponding one of $R^5$ to $R^{16}$.

When $r^5$, $r^6$, $r^9$, $r^{12}$, $r^{15}$, or $r^{16}$ is an integer of 2 to 5, or when $r^7$, $r^8$, $r^{10}$, $r^{11}$, $r^{13}$, or $r^{14}$ is an integer of 2 to 4, a plurality of groups represented by the corresponding one of $R^5$ to $R^{16}$ are bonded to the same benzene ring. In this case, the plurality of groups bonded to the benzene ring may be the same or different. Also, the plurality of groups may be present independently of each other without forming a ring, or may be bonded to each other to form a ring via a single bond, a methylene group, an oxygen atom, or a sulfur atom. For example, in the compound 4-8 in FIG. 48, two groups $R^5$ (two vinyl groups) are bonded together via a single bond to form a naphthalene ring, and two groups $R^{15}$ (two vinyl groups) are also bonded together via a single bond to form a naphthalene ring.

($R^5$ to $R^{16}$)

$R^5$ to $R^{16}$ may be the same or different, and represent a heavy hydrogen atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a condensed polycyclic aromatic group, or an aryloxy group.

Specific examples of the alkyl group having 1 to 6 carbon atoms, the cycloalkyl group having 5 to 10 carbon atoms, or the alkenyl group having 2 to 6 carbon atoms represented by $R^5$ to $R^{16}$ include a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, a 2-butenyl group, and the like.

Specific examples of the alkyloxy group having 1 to 6 carbon atoms or the cycloalkyloxy group having 5 to 10 carbon atoms represented by $R^5$ to $R^{16}$ include a methyloxy group, an ethyloxy group, an n-propyloxy group, an isopropyloxy group, an n-butyloxy group, a tert-butyloxy group, an n-pentyloxy group, an n-hexyloxy group, a cyclopentyloxy group, a cyclohexyloxy group, a cycloheptyloxy group, a cyclooctyloxy group, a 1-adamantyloxy group, a 2-adamantyloxy group, and the like.

Examples of the aromatic hydrocarbon group, the aromatic heterocyclic group, or the condensed polycyclic aromatic group represented by $R^5$ to $R^{16}$ are similar to those listed above as examples of the aromatic hydrocarbon group, the aromatic heterocyclic group, or the condensed polycyclic aromatic group represented by $Ar^1$ to $Ar^4$. The same holds true for the forms that these groups can take.

Specific examples of the aryloxy group represented by $R^5$ to $R^{16}$ include a phenyloxy group, a biphenylyloxy group, a terphenylyloxy group, a naphthyloxy group, an anthracenyloxy group, a phenanthrenyloxy group, a fluorenyloxy group, an indenyloxy group, a pyrenyloxy group, a perylenyloxy group, and the like.

The alkyl group having 1 to 6 carbon atoms, the cycloalkyl group having 5 to 10 carbon atoms, the alkenyl group having 2 to 6 carbon atoms, the alkyloxy group having 1 to 6 carbon atoms, the cycloalkyloxy group having 5 to 10 carbon atoms, the aromatic hydrocarbon group, the aromatic heterocyclic group, the condensed polycyclic aromatic group, or the aryloxy group represented by $R^5$ to $R^{16}$ may be unsubstituted, or may have a substituent. Examples of the substituent are similar to those listed above as examples of the substituent which the aromatic hydrocarbon group, the aromatic heterocyclic group, or the condensed polycyclic aromatic group represented by $Ar^1$ to $Ar^4$ may have. The same holds true for the forms that the substituent can take.

($L^1$ to $L^3$)

$L^1$ to $L^3$ are bridging groups that bond triarylamine structures to each other. $L^1$ to $L^3$ may be the same or different, and represent a divalent group represented by any of the structural formulae (B) to (G) below or a single bond. The divalent group represented by the structural formulae (B) to (G) below may be unsubstituted, or may be substituted by heavy hydrogen. In the structural formula (B) below, n1 represents an integer of 1 to 3.

[Chem. 17]

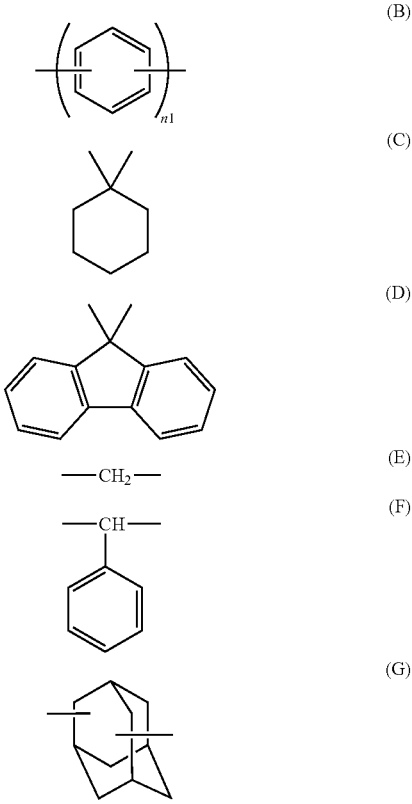

(Preferred Forms)

Figure 47:
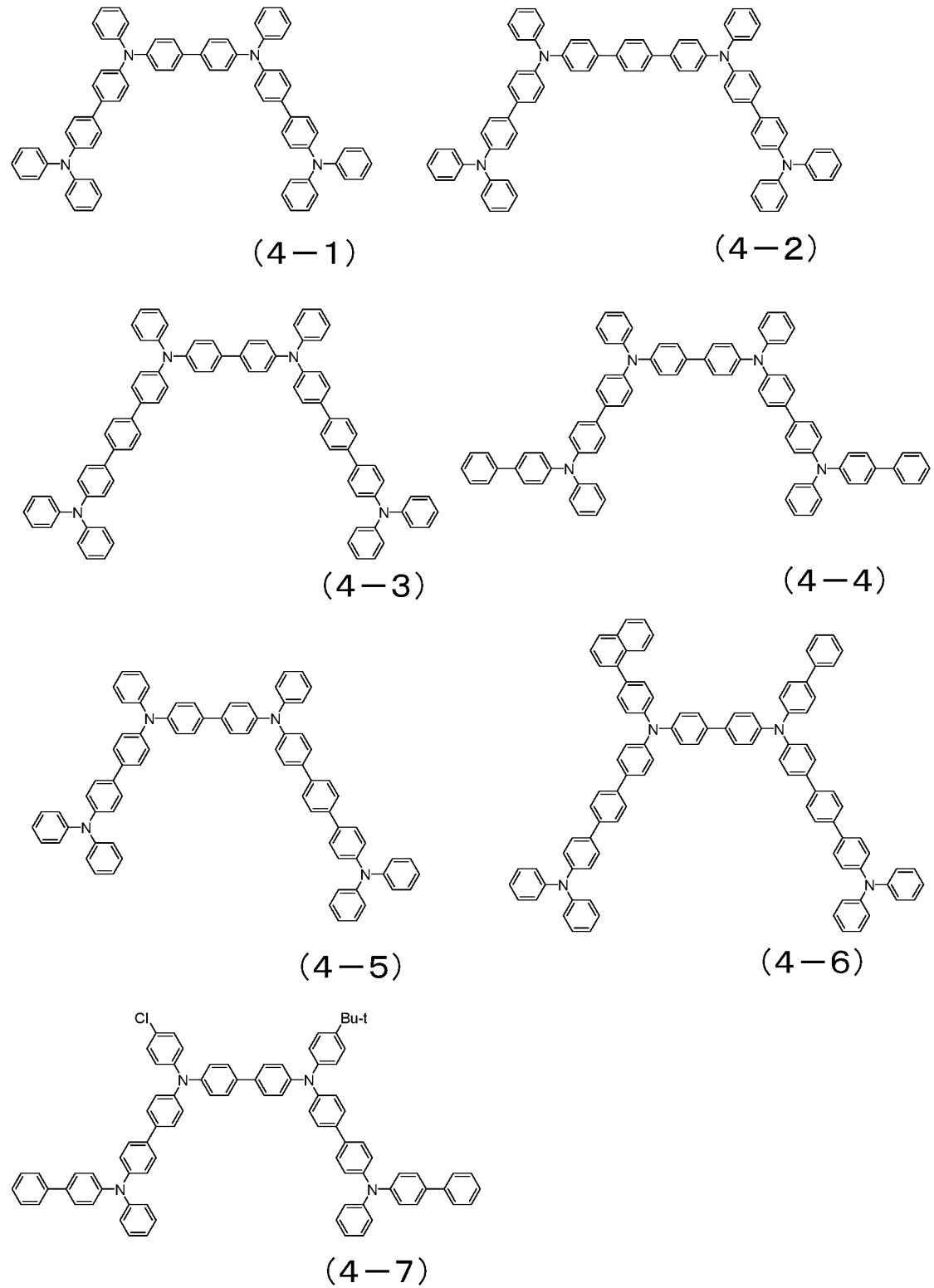
FIG. 47 shows the structural formulae of compounds 4-1 to 4-7, which are triarylamine compounds III.
Figure 48:
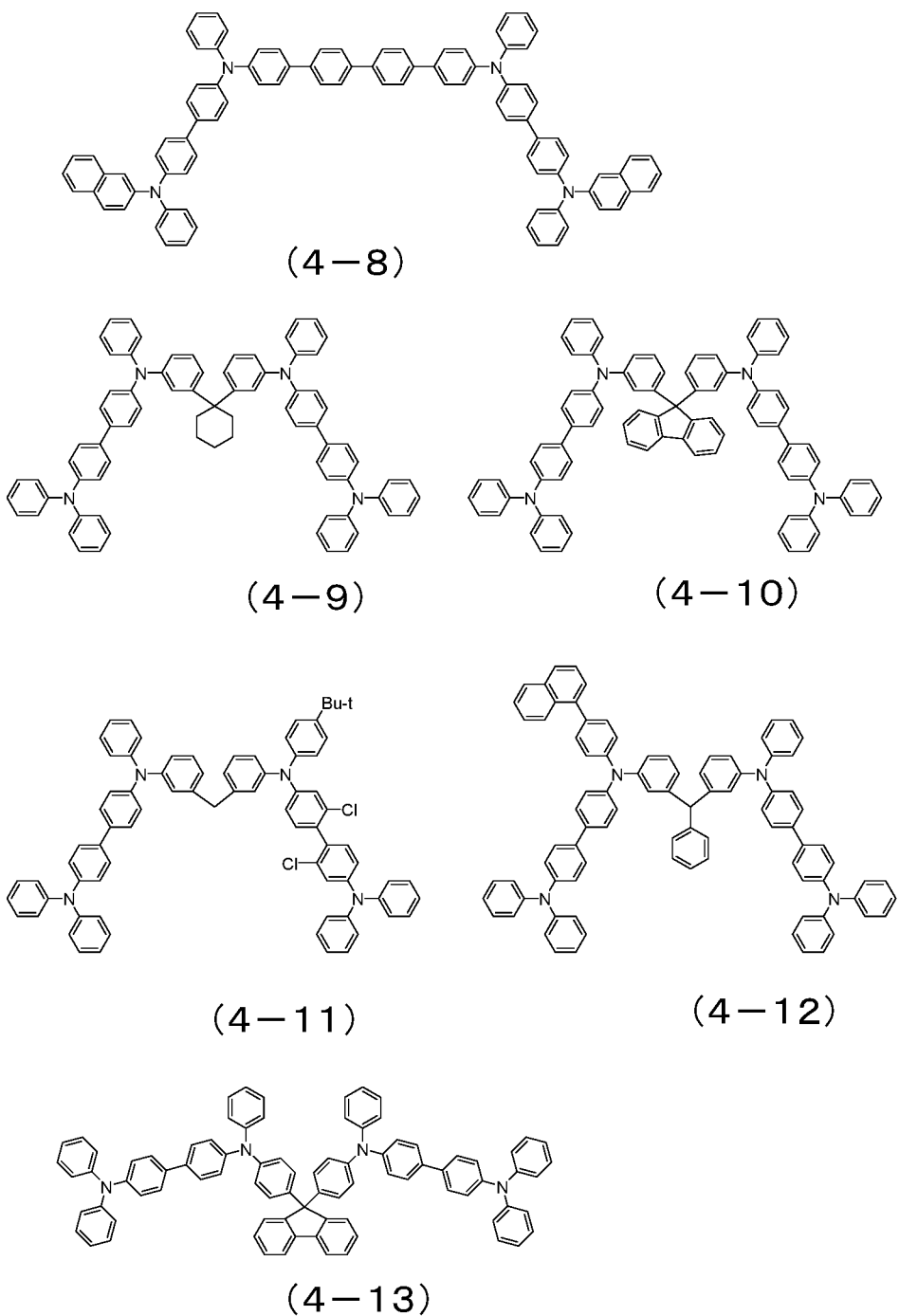
FIG. 48 shows the structural formulae of compounds 4-8 to 4-13, which are triarylamine compounds III.
Figure 49:
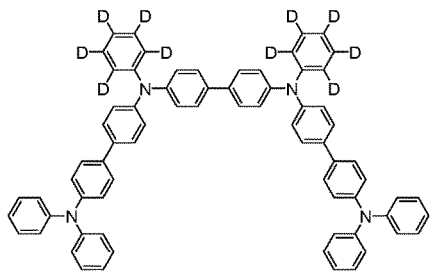
FIG. 49 shows the structural formulae of compounds 4-14 to 4-17, which are triarylamine compounds III.
Figure 49:
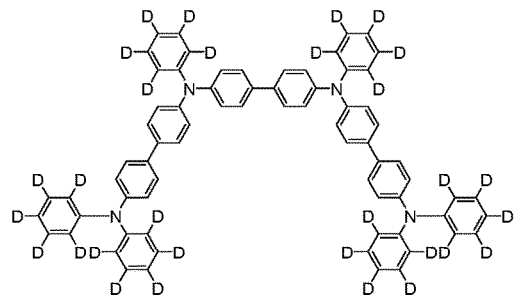
Figure 49:
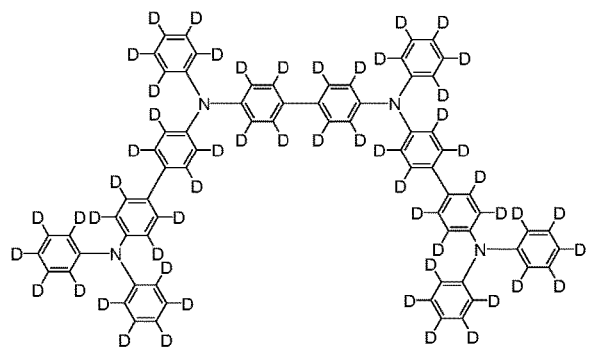
Figure 49:
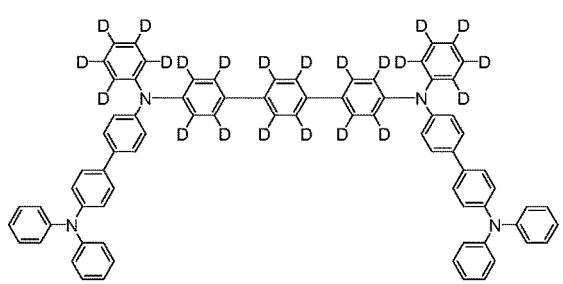

FIGS. 47 to 49 show specific examples of preferred compounds out of the triarylamine compounds III, but the triarylamine compound III is not limited to these compounds.

Figure 50:
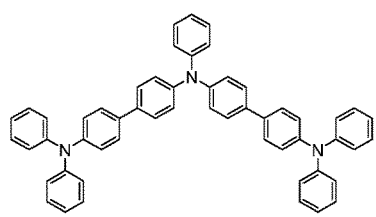
FIG. 50 shows the structural formulae of triarylamine compounds having three to six triarylamine structures, other than triarylamine compounds III.
Figure 50:
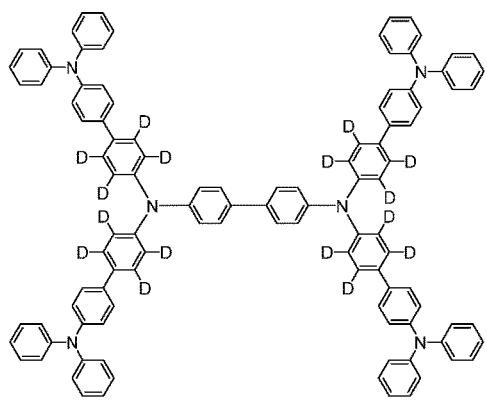
Figure 51:
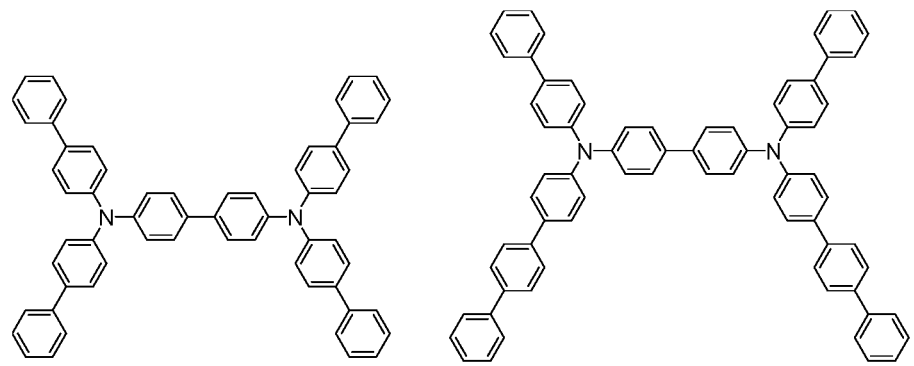
FIG. 51 shows the structural formulae of compounds 5-1 to 5-6, which are triarylamine compounds IV.
Figure 51:
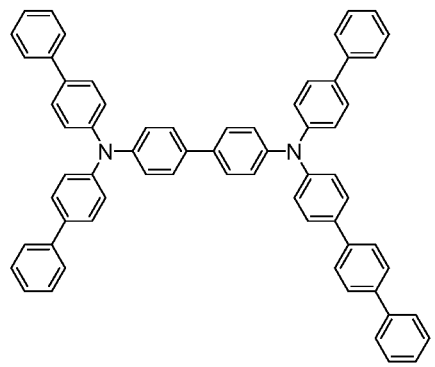
Figure 51:
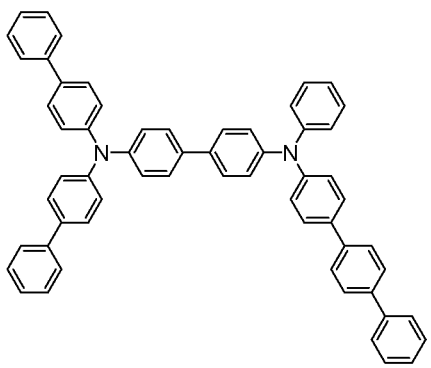
Figure 51:
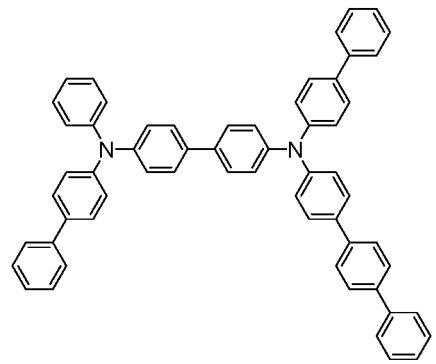
Figure 51:
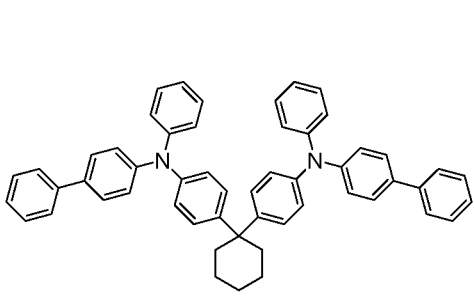
Figure 52:
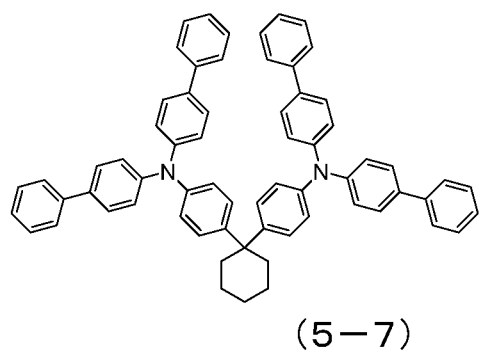
FIG. 52 shows the structural formulae of compounds 5-7 to 5-12, which are triarylamine compounds IV.
Figure 52:
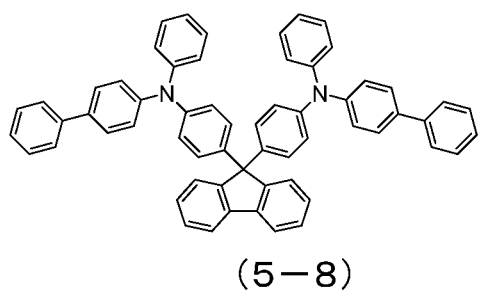
Figure 52:
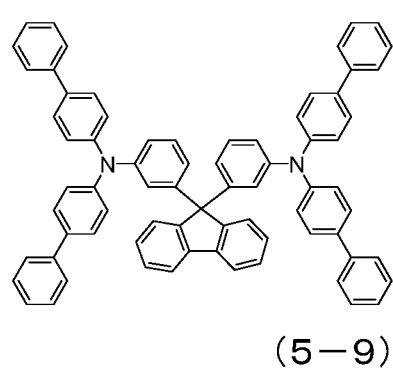
Figure 52:
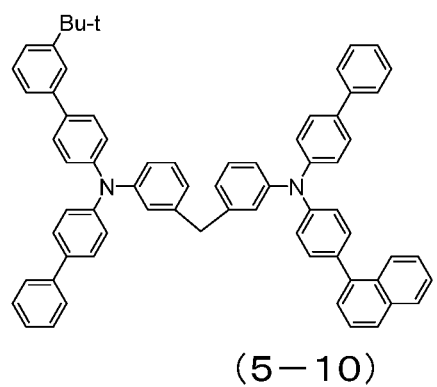
Figure 52:
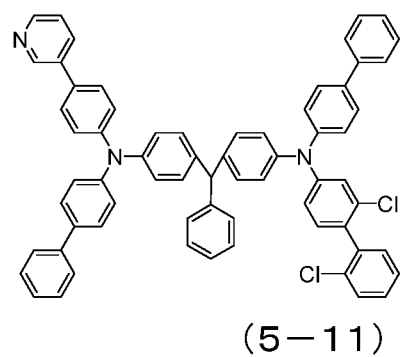
Figure 52:
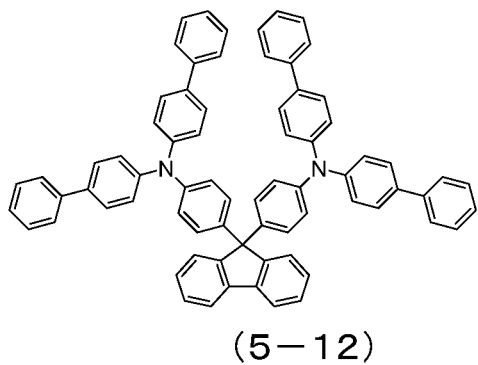

FIG. 50 shows specific examples of preferred compounds out of the above-described triarylamine compounds having three to six triarylamine structures, other than triarylamine compounds III, but the triarylamine compound having three to six triarylamine structures is not limited to these compounds.

Preferably, $R^5$ to $R^{16}$ represent a heavy hydrogen atom, a chlorine atom, an alkyl group having 1 to 6 carbon atoms, an alkenyl group having 2 to 6 carbon atoms, an aromatic hydrocarbon group, or a condensed polycyclic aromatic group.

Preferably, $L^1$ to $L^3$ represent a divalent group represented by any of the structural formulae (B) to (F) above or a single bond.

The triarylamine compound having three to six triarylamine structures can be synthesized using a method that is known per se (see Patent Literatures 1, 8, and 9).

Triarylamine Compound IV Represented by General Formula (5)

[Chem. 18]

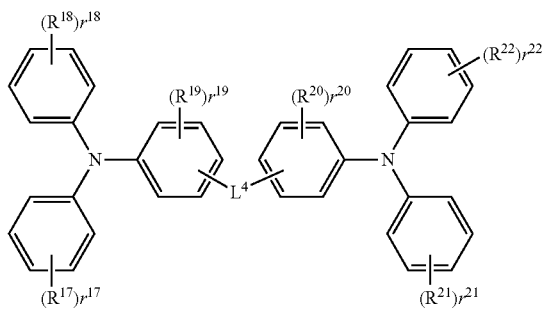

(5)

The triarylamine compound represented by the general formula (5) has two triarylamine structures in a molecule. The triarylamine structures are linked to each other via a divalent group having no heteroatom or a single bond.

($r^{17}$ to $r^{22}$)

$r^{17}$ to $r^{22}$ each indicate the number of groups $R^{17}$ and $R^{22}$ bonded to benzene ring. $r^{17}$, $r^{18}$, $r^{21}$, and $r^{22}$ may be the same or different, and represent an integer of 0 to 5, while $r^{19}$ and $r^{20}$ may be the same or different, and represent an integer of 0 to 4.

When any of $r^{17}$ to $r^{22}$ is 0, it means that the corresponding one of $R^{17}$ to $R^{22}$ is not present on the benzene ring, that is, the benzene ring is not substituted by the group represented by the corresponding one of $R^{17}$ to $R^{22}$.

Figure 53:
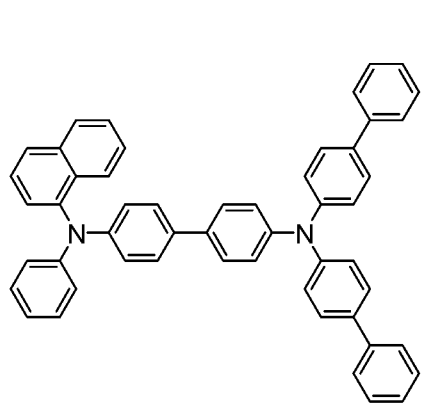
FIG. 53 shows the structural formulae of compounds 5-13 to 5-18, which are triarylamine compounds IV.
Figure 53:
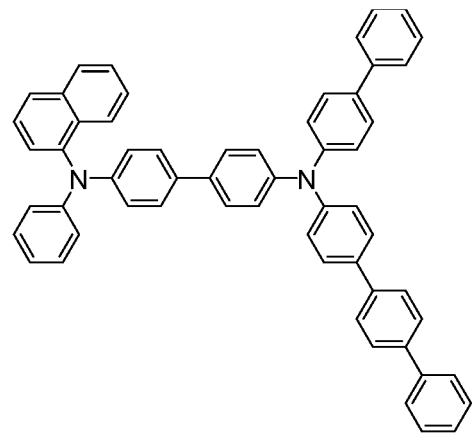
Figure 53:
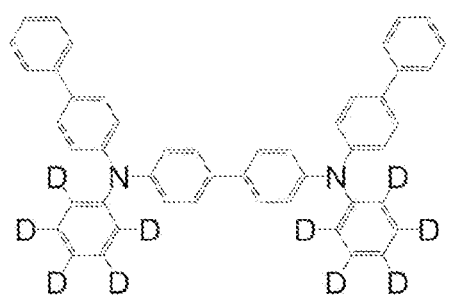
Figure 53:
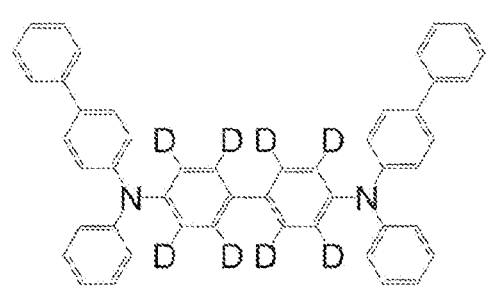
Figure 53:
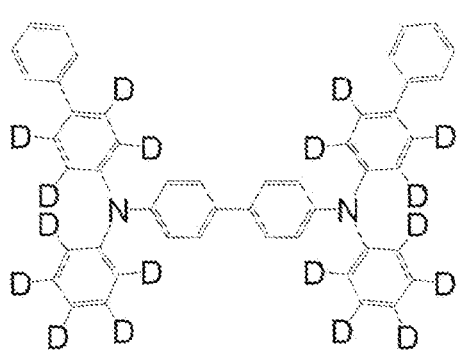
Figure 53:
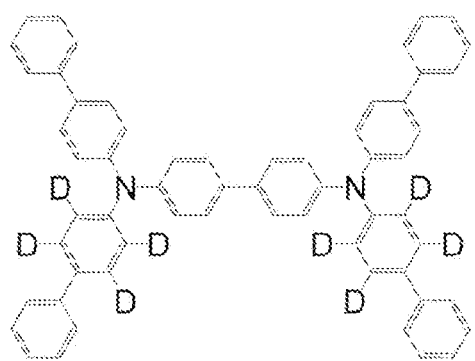
Figure 54:
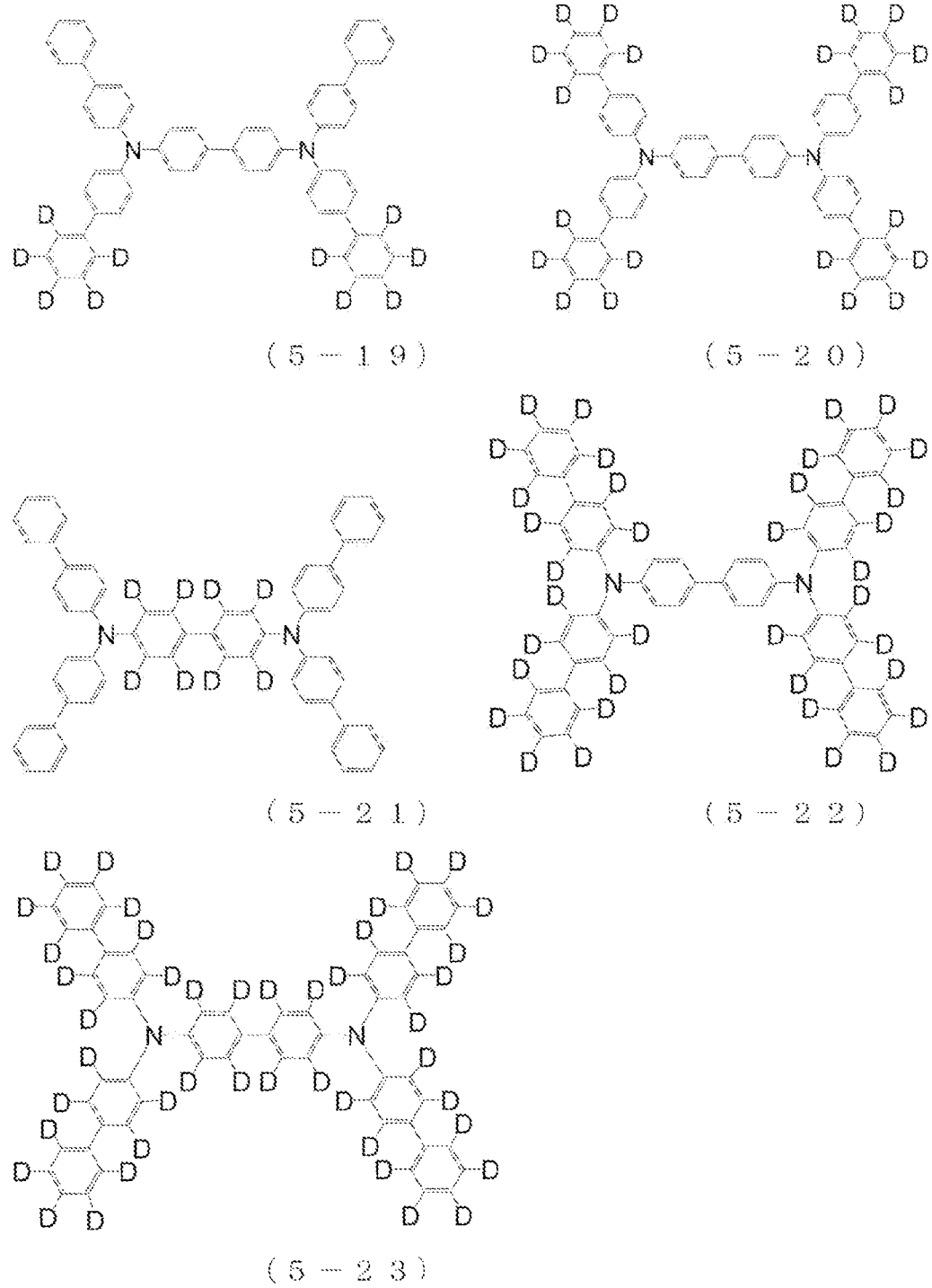
FIG. 54 shows the structural formulae of compounds 5-19 to 5-23, which are triarylamine compounds IV.

When $r^{17}$, $r^{18}$, $r^{21}$, or $r^{22}$ is an integer of 2 to 5, or when $r^{19}$ or $r^{20}$ is an integer of 2 to 4, a plurality of groups represented by the corresponding one of $R^{17}$ to $R^{22}$ are bonded to the same benzene ring. In this case, the plurality of groups bonded to the benzene ring may be the same or different. Moreover, the plurality of groups may be present independently of each other without forming any ring, or may be bonded to each other to form a ring via a single bond, a methylene group, an oxygen atom, or a sulfur atom. For example, in the compound 5-13 in FIG. 53, two groups $R^{18}$ (two vinyl groups) are bonded to each other via a single bond to form a naphthalene ring.

($R^{17}$ to $R^{22}$)

$R^{17}$ to $R^{22}$ may be the same or different, and represent a heavy hydrogen atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a condensed polycyclic aromatic group, or an aryloxy group.

Examples of the alkyl group having 1 to 6 carbon atoms, the cycloalkyl group having 5 to 10 carbon atoms, the alkenyl group having 2 to 6 carbon atoms, the alkyloxy group having 1 to 6 carbon atoms, the cycloalkyloxy group having 5 to 10 carbon atoms, the aromatic hydrocarbon group, the aromatic heterocyclic group, the condensed polycyclic aromatic group, or the aryloxy group represented by $R^{17}$ to $R^{22}$ are similar to those listed in the description of the general formula (4) above as examples of the alkyl group having 1 to 6 carbon atoms, the cycloalkyl group having 5 to 10 carbon atoms, the alkenyl group having 2 to 6 carbon atoms, the alkyloxy group having 1 to 6 carbon atoms, the cycloalkyloxy group having 5 to 10 carbon atoms, the aromatic hydrocarbon group, the aromatic heterocyclic group, the condensed polycyclic aromatic group, or the aryloxy group represented by $R^5$ to $R^{16}$. The same holds true for the forms that these groups can take.

The alkyl group having 1 to 6 carbon atoms, the cycloalkyl group having 5 to 10 carbon atoms, the alkenyl group having 2 to 6 carbon atoms, the alkyloxy group having 1 to 6 carbon atoms, the cycloalkyloxy group having 5 to 10 carbon atoms, the aromatic hydrocarbon group, the aromatic heterocyclic group, the condensed polycyclic aromatic group, or the aryloxy group represented by $R^{17}$ to $R^{22}$ may be unsubstituted, or may have a substituent. Examples of the substituent are similar to those listed above as examples of the substituent which the aromatic hydrocarbon group, the aromatic heterocyclic group, or the condensed polycyclic aromatic group represented by $Ar^1$ to $Ar^4$ may have. The same holds true for the forms that the substituent can take.

($L^4$)

$L^4$ is a bridging group that bonds the two triarylamine structures to each other. $L^4$ represents a divalent group represented by any of the following structural formulae (C) to (G) or a single bond.

[Chem. 19]

(C)

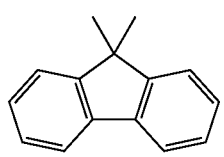

(D)

—CH$_2$— (E)

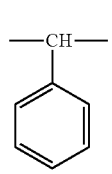

(F)

-continued

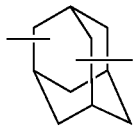

(G)

The above-described triarylamine compound having two triarylamine structures can be synthesized using a method that is known per se (see Patent Literatures 1, 8, and 9).
(Preferred Forms)

FIGS. 51 to 54 show specific examples of preferred compounds out of the triarylamine compounds IV, but the triarylamine compound IV is not limited to these compounds.

FIG. 55 shows specific examples of preferred compounds out of the above-described triarylamine compounds having two triarylamine structures, other than triarylamine compounds IV, but the triarylamine compound having two triarylamine structures is not limited to these compounds.

$R^{17}$ to $R^{22}$ preferably represent a heavy hydrogen atom, an alkenyl group having 2 to 6 carbon atoms, an aromatic hydrocarbon group, an aromatic heterocyclic group, or a condensed polycyclic aromatic group, and more preferably an aromatic hydrocarbon group.

$L^4$ is preferably a divalent group represented by any of the structural formulae (C) to (F) or a single bond, and more preferably a single bond.

The above-described materials for the first hole transport layer may be used alone to form a first hole transport layer, or may be mixed with another material and used to form a first hole transport layer. The first hole transport layer may have a single-layer structure, or may have a structure in which layers that are each formed using a single material are stacked, a structure in which layers that are each formed using a mixture of materials are stacked, or a structure in which a layer that is formed using a single material and a layer that is formed using a mixture of materials are stacked.

A material normally used for a first hole transport layer can be further P-doped with trisbromophenylamine hexachloroantimony, a radialene derivative (see WO 2014/009310), or the like and used for the first hole transport layer, or a polymer compound having the structure of a benzidine derivative, such as TPD, in a partial structure thereof, or the like can be used for the first hole transport layer.

When providing a layer that serves as both the hole injection layer and the first hole transport layer, a coating type polymer material such as poly(3,4-ethylenedioxythiophene) (PEDOT)/poly(styrenesulfonate) (PSS) can be used.
(Second Hole Transport Layer 5)

In the organic EL element of the present invention, the second hole transport layer 5 is provided between the first hole transport layer 4 and a light emitting layer 6, and the arylamine compound I represented by the general formula (1) above is used for this second hole transport layer 5.

In the second hole transport layer 5, a known material that has hole transportability may also be used in combination with the arylamine compound I as long as the material does not impair the effects of the present invention. Examples of the known material that has hole transportability are similar to those described with respect to the first hole transport layer 4. However, the composition of the second hole transport layer 5 needs to be different from the composition of the first hole transport layer 4.

The materials for the second hole transport layer 5 may be used alone to form a second hole transport layer, or may be mixed with another material and used to form a second hole transport layer. The second hole transport layer 5 may have a single-layer structure, or may have a structure in which layers that are each formed using a single material are stacked, a structure in which layers that are each formed using a mixture of materials are stacked, or a structure in which a layer that is formed using a single material and a layer that is formed using a mixture of materials are stacked.
(Electron Blocking Layer)

Figure 56:
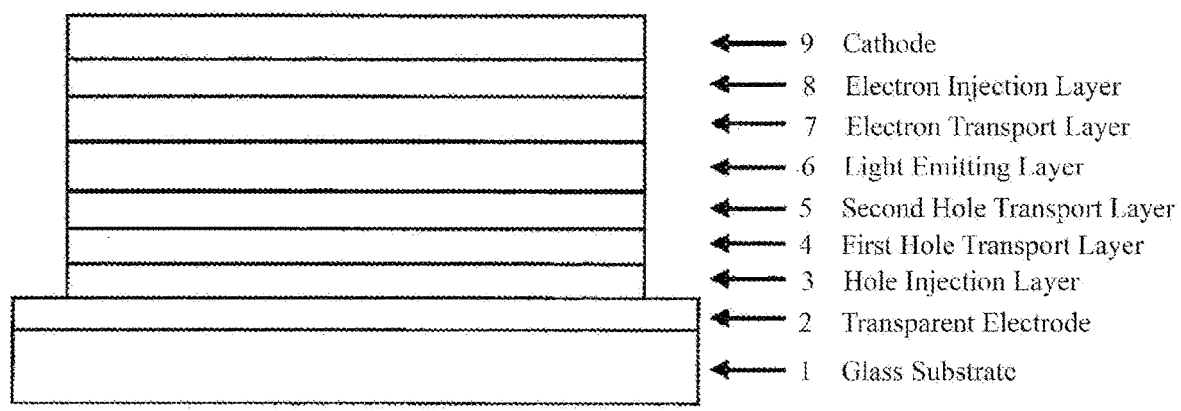
FIG. 56 is a diagram showing the configuration of organic EL elements of Examples 1 to 8 and Comparative Examples 1 to 5.

Although not shown in FIG. 56, an electron blocking layer can be provided between the second hole transport layer and the light emitting layer. The arylamine compound I, the triarylamine compound III, or the triarylamine compound IV can be used for the electron blocking layer in view of their high electron blockability. However, the composition of the electron blocking layer needs to be different from the composition of the above-described second hole transport layer 5.

Moreover, a known compound that has an electron blocking effect can also be used. The following compounds can be used as the known compound that has an electron blocking effect:

carbazole derivatives, for example,
4,4',4"-tri(N-carbazolyl)triphenylamine (TCTA);
9,9-bis[4-(carbazole-9-yl)phenyl]fluorene;
1,3-bis(carbazole-9-yl)benzene (mCP);
2,2-bis(4-carbazole-9-ylphenyl)adamantane (Ad-Cz); and the like, and compounds that have a triphenylsilyl group and a triarylamine structure, for example,
9-[4-(carbazole-9-yl)phenyl]-9-[4-(triphenylsilyl)phenyl]-9H-fluorene.

The above-described materials for the electron blocking layer may be used alone to form an electron blocking layer, or may be mixed with another material and used to form an electron blocking layer. The electron blocking layer may have a single-layer structure, or may have a structure in which layers that are each formed using a single material are stacked, a structure in which layers that are each formed using a mixture of materials are stacked, or a structure in which a layer that is formed using a single material and a layer that is formed using a mixture of materials are stacked.
(Light Emitting Layer 6)

The light emitting layer 6 is formed on the second hole transport layer 5 (or the electron blocking layer). A metal complex of a quinolinol derivative such as $Alq_3$, as well as various types of metal complexes, an anthracene derivative, a bisstyrylbenzene derivative, a pyrene derivative, an oxazole derivative, a poly (p-phenylene vinylene) derivative, and the like can be used for the light emitting layer 6.

Also, the light emitting layer may also be formed using a host material and a dopant material.

As the host material, in addition to the light emitting materials listed above, a thiazole derivative, a benzimidazole derivative, a polydialkylfluorene derivative, and the like can be used.

As the dopant material, quinacridone, coumalin, rubrene, perylene, pyrene, and derivatives thereof; a benzopyran derivative; an indenophenanthrene derivative; a rhodamine derivative; an aminostyryl derivative; and the like can be used.

Moreover, a phosphorescent emitter can also be used as a light emitting material. As the phosphorescent emitter, a phosphorescent emitter of a metal complex such as iridium or platinum can be used. Specifically, the following phosphorescent emitters can be used:

a green phosphorescent emitter such as Ir(ppy)$_3$;
a blue phosphorescent emitter such as FIrpic or FIr$_6$; and
a red phosphorescent emitter such as Btp$_2$Ir (acac).

At this time, as the host material, for example, the following host materials that have hole injectability and transportability can be used:

carbazole derivatives such as, for example, 4,4'-di(N-carbazolyl)biphenyl (CBP), TCTA, and mCP.

Also, the following host materials that have electron transportability can be used:

p-bis(triphenylsilyl)benzene (UGH2), 2,2',2"-(1,3,5-phenylene)-tris(1-phenyl-1H-benzimidazole) (TPBI), and the like.

With a host material such as those described above, a high-performance organic EL element can be produced.

In order to avoid concentration quenching, it is preferable to dope the host material with the phosphorescent emitter through co-deposition in an amount of 1 to 30 wt % relative to the entire light emitting layer.

Also, as the light emitting material, a material that emits delayed fluorescence such as a CDCB derivative, specifically, PIC-TRZ, CC2TA, PXZ-TRZ, 4CzIPN, or the like can also be used.

The materials for the light emitting layer may be used alone to form a light emitting layer, or may be mixed with another material and used to form a light emitting layer. The light emitting layer may have a single-layer structure, or may have a structure in which layers that are each formed using a single material are stacked, a structure in which layers that are each formed using a mixture of materials are stacked, or a structure in which a layer that is formed using a single material and a layer that is formed using a mixture of materials are stacked.

(Hole Blocking Layer)

A hole blocking layer (not shown) can be provided between the light emitting layer and the electron transport layer. A known compound that has a hole blocking effect can be used for the hole blocking layer. Examples of the known compound that has a hole blocking effect include a phenanthroline derivative, such as bathocuproine (BCP); a metal complex of a quinolinol derivative, such as aluminum (III)bis(2-methyl-8-quinolinate)-4-phenylphenolate (hereinafter referred to simply as BAlq); various types of rare-earth complexes; a triazole derivative; a triazine derivative; an oxadiazole derivative; and the like A material for the hole blocking layer may double as a material for the electron transport layer.

The materials for the hole blocking layer may be used alone to form a hole blocking layer, or may be mixed with another material and used to form a hole blocking layer. The hole blocking layer may have a single-layer structure, or may have a structure in which layers that are each formed using a single material are stacked, a structure in which layers that are each formed using a mixture of materials are stacked, or a structure in which a layer that is formed using a single material and a layer that is formed using a mixture of materials are stacked.

(Electron Transport Layer 7)

In the present invention, the above-described pyrimidine derivative II is used for an electron transport layer 7. Furthermore, a known material that has electron transportability may also be used together, as long as the material does not impair the effects of the present invention. As the known material that has electron transportability, metal complexes of quinolinol derivatives such as Alq$_3$ and BAlq; various types of metal complexes; a triazole derivative; a triazine derivative; an oxadiazole derivative; a pyridine derivative; a pyrimidine derivative; a benzimidazole derivative; a thiadiazole derivative; an anthracene derivative; a carbodiimide derivative; a quinoxaline derivative; a pyridoindole derivative; a phenanthroline derivative; a silole derivative; and the like can be used.

The above-described materials for the electron transport layer may be used alone to form an electron transport layer, or may be mixed with another material and used to form an electron transport layer. The electron transport layer may have a single-layer structure, or may have a structure in which layers that are each formed using a single material are stacked, a structure in which layers that are each formed using a mixture of materials are stacked, or a structure in which a layer that is formed using a single material and a layer that is formed using a mixture of materials are stacked.

(Electron Injection Layer 8)

An electron injection layer 8 may be provided on the electron transport layer 7. Alkali metal salts such as lithium fluoride and cesium fluoride, alkaline earth metal salts such as magnesium fluoride, metal oxides such as aluminum oxide, and the like can be used for the electron injection layer. However, if the electron transport layer and the cathode are suitably selected, the electron injection layer can be omitted.

(Cathode 9)

A cathode 9 is formed using an electrode material that has a low work function, such as aluminum, or an alloy that has an even lower work function, such as a magnesium-silver alloy, a magnesium-indium alloy, or an aluminum-magnesium alloy, is used as the electrode material.

EXAMPLES

Hereinafter, embodiments of the present invention will be described in greater detail using examples. However, the present invention is not limited to the examples below.

Synthesis Example 1: Compound 1-2

Synthesis of bis(biphenyl-4-yl)-(6-phenylbiphenyl-3-yl)amine

The following components were placed into a nitrogen-purged reaction vessel:

11.8 g of bis(biphenyl-4-yl)-(6-bromobiphenyl-3-yl)amine;
94 mL of toluene; and
2.7 g of phenylboronic acid, and an aqueous solution obtained by dissolving 5.9 g of potassium carbonate in 36 mL of water beforehand was further added thereto to obtain a mixed liquid. A nitrogen gas was passed through the mixed liquid under ultrasonic irradiation for 30 minutes.

Then, 0.74 g of tetrakis(triphenylphosphine)palladium was added, followed by heating, and stirring was performed at 72° C. for 18 hours. After cooling to room temperature, a separation operation was performed to thereby extract an organic layer. The organic layer was washed using water, and then using a saturated saline solution. After that, the organic layer was dried and concentrated using magnesium sulfate anhydrous. Thus, a crude product was obtained. Subsequently, the crude product was purified using column chromatography. As a result, 8.4 g (with a yield of 72%) of white powder of compound 1-2 was obtained.

[Chem. 20]

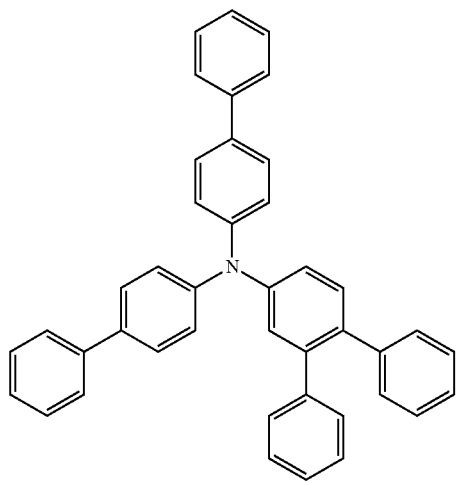

(1-2)

The structure of the obtained white powder was identified using NMR. In $^1$H-NMR (CDCl$_3$), the following signals of 31 hydrogens were detected.
δ (ppm)=7.56-7.68 (7H)
7.45-7.52 (4H)
7.14-7.41 (20H)

Synthesis Example 2: Compound 1-3

Synthesis of bis(biphenyl-4-yl)-{6-(naphthyl-1-yl)biphenyl-3-yl}amine

Reactions were conducted under similar conditions to those of Synthesis Example 1, except that
phenylboronic acid
was replaced with
1-naphthyl boronic acid.
As a result, 9.2 g (with a yield of 61%) of white powder of compound 1-3 was obtained

[Chem. 21]

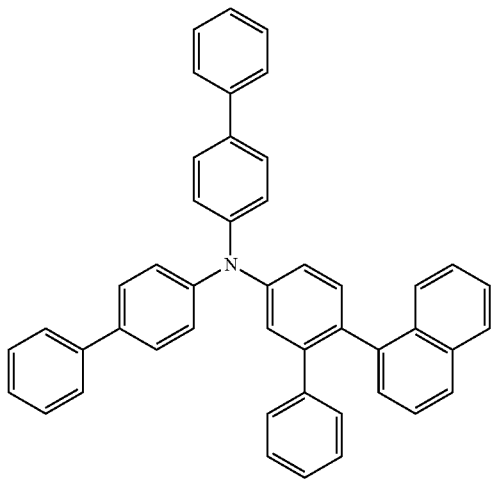

(1-3)

The structure of the obtained white powder was identified using NMR. In $^1$H-NMR (CDCl$_3$), the following signals of 33 hydrogens were detected.
δ (ppm)=7.84-7.87 (3H)
7.67-7.83 (6H)
7.26-7.64 (18H)
7.02-7.04 (6H)

Synthesis Example 3: Compound 1-1

Synthesis of bis(biphenyl-4-yl)-{6-(9,9-dimethyl-fluorene-2-yl)biphenyl-3-yl}amine Reactions were conducted under similar conditions to those of Synthesis Example 1, except that
phenylboronic acid
was replaced with
(9,9-dimethylfluorene-2-yl) boronic acid.
As a result, 9.0 g (with a yield of 57%) of white powder of compound 1-1 was obtained.

[Chem. 22]

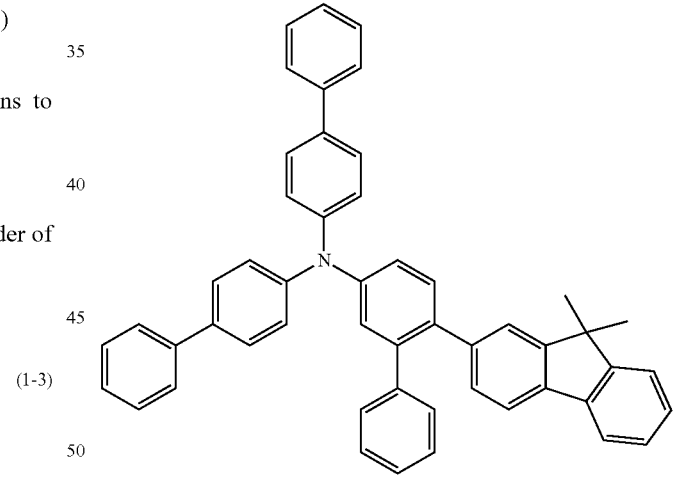

(1-1)

The structure of the obtained white powder was identified using NMR. In $^1$H-NMR (CDCl$_3$), the following signals of 39 hydrogens were detected.
δ (ppm)=7.56-7.64 (10H)
7.26-7.50 (18H)
7.02-7.16 (5H)
1.26 (6H)

Synthesis Example 4: Compound 1-4

Synthesis of bis(biphenyl-4-yl)-{6-(biphenyl-4-yl)biphenyl-3-yl}amine

Reactions were conducted under similar conditions to those of Synthesis Example 1, except that
  phenylboronic acid
was replaced with
  4-biphenylboronic acid.
Thus, 8.6 g (with a yield of 64%) of white powder of compound 1-4 was obtained.

[Chem. 23]

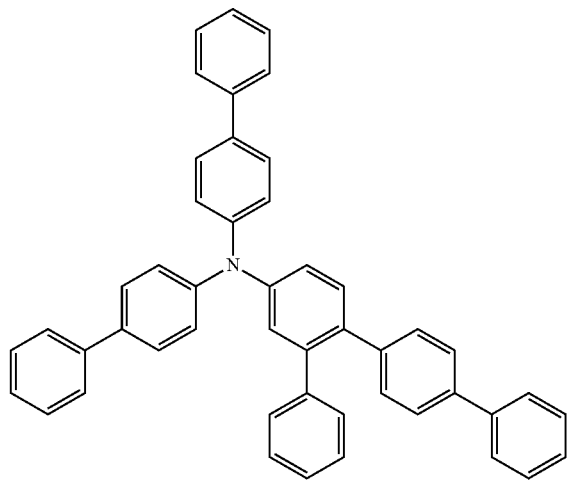

(1-4)

The structure of the obtained white powder was identified using NMR. In ¹H-NMR (CDCl₃), the following signals of 35 hydrogens were detected.
δ (ppm)=7.66-7.53 (8H)
  7.51-7.15 (27H)

Synthesis Example 5: Compound 1-9

Synthesis of bis(biphenyl-4-yl)-{6-(1,1';4',1''-terphenyl-4-yl)biphenyl-3-yl}amine Reactions were conducted under similar conditions to those of Synthesis Example 1, except that
  phenylboronic acid
was replaced with
  4-bromo-1,1';4',1''-terphenyl, and
  bis(biphenyl-4-yl)-(6-bromobiphenyl-3-yl)amine
was replaced with
  bis(biphenyl-4-yl)-{3-phenyl-4-(4,4,5,5-tetramethyl-1,3,2-dioxaborolan-2-yl)phenyl}amine.
As a result, 4.5 g (with a yield of 40%) of white powder of compound 1-9 was obtained.

[Chem. 24]

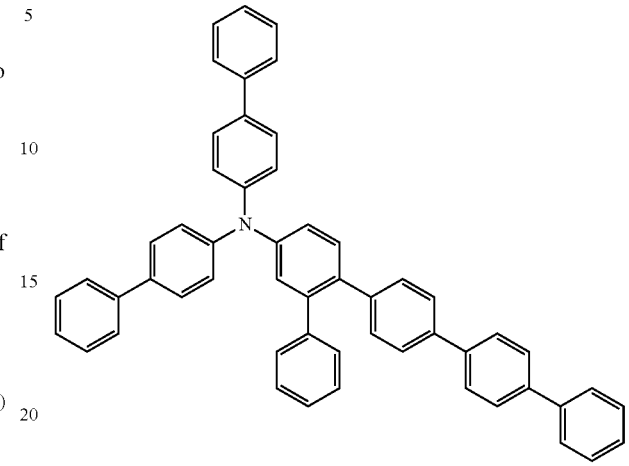

(1-9)

The structure of the obtained white powder was identified using NMR. In ¹H-NMR (THF-d₈), the following signals of 39 hydrogens were detected.
δ (ppm)=7.73-7.58 (15H)
  7.46-7.12 (24H)

Synthesis Example 6: Compound 1-16

Synthesis of bis(biphenyl-4-yl)-[6-{4-(naphthalene-1-yl)phenyl}biphenyl-3-yl]amine Reactions were conducted under similar conditions to those of Synthesis Example 1, except that
  phenylboronic acid
was replaced with
  4-(naphthalene-1-yl)phenylboronic acid.
As a result, 11.6 g (with a yield of 77%) of white powder of compound 1-16 was obtained.

[Chem. 25]

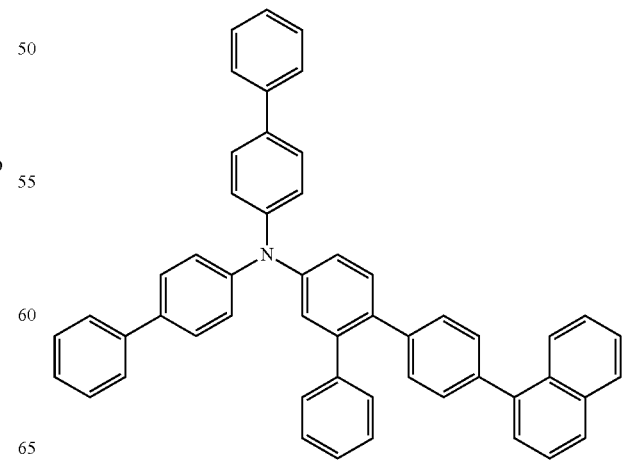

(1-16)

The structure of the obtained white powder was identified using NMR. In ¹H-NMR (CDCl₃), the following signals of 37 hydrogens were detected.
δ (ppm)=7.95-7.84 (3H)
7.67-7.18 (34H)

Synthesis Example 7: Compound 1-20

Synthesis of bis(biphenyl-4-yl)-[6-(9,9-dimethyl-fluorene-2-yl)phenyl)}biphenyl-3-yl]amine Reactions were conducted under similar conditions to those of Synthesis Example 1, except that
phenylboronic acid
was replaced with
4-(9,9-dimethylfluorene-2-yl)phenylboronic acid.
As a result, 13.1 g (with a yield of 81%) of white powder of compound 1-20 was obtained.

[Chem. 26]

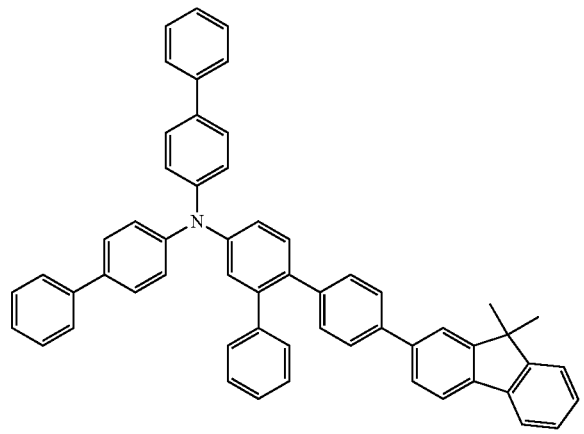

(1-20)

The structure of the obtained white powder was identified using NMR. In ¹H-NMR (CDCl₃), the following signals of 43 hydrogens were detected.
δ (ppm)=7.78 (2H)
7.68-7.15 (35H)
1.55 (6H)

Synthesis Example 8: Compound 1-56

Synthesis of (biphenyl-4-yl)-{6-(biphenyl-4-yl)bi-phenyl-3-yl}-(9,9-dimethylfluorene-2-yl)amine Reactions were conducted under similar conditions to those of Synthesis Example 1, except that
phenylboronic acid
was replaced with
4-biphenylboronic acid, and
bis(biphenyl-4-yl)-(6-bromobiphenyl-3-yl)amine
was replaced with
(biphenyl-4-yl)-(9,9-dimethylfluorene-2-yl)-(6-bromobiphenyl-3-yl)amine.
As a result, 17.8 g (with a yield of 89%) of white powder of compound 1-56 was obtained.

[Chem. 27]

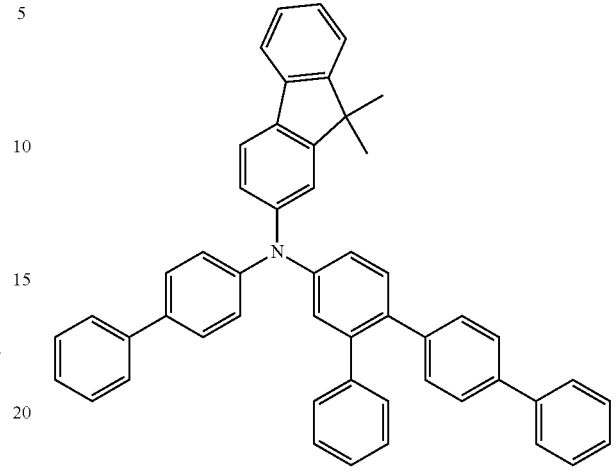

(1-56)

The structure of the obtained white powder was identified using NMR. In ¹H-NMR (CDCl₃), the following signals of 39 hydrogens were detected.
δ (ppm)=7.72-7.57 (7H)
7.52-7.33 (9H)
7.32-7.19 (17H)
1.45 (6H)

Synthesis Example 9: Compound 1-62

Synthesis of bis(9,9-dimethylfluorene-2-yl)-(6-phenylbiphenyl-3-yl)amine

Reactions were conducted under similar conditions to those of Synthesis Example 1, except that
bis(biphenyl-4-yl)-(6-bromobiphenyl-3-yl)amine
was replaced with
bis(9,9-dimethylfluorene-2-yl)-(6-bromobiphenyl-3-yl)amine.
As a result, 11.5 g (with a yield of 57%) of white powder of compound 1-62 was obtained.

[Chem. 28]

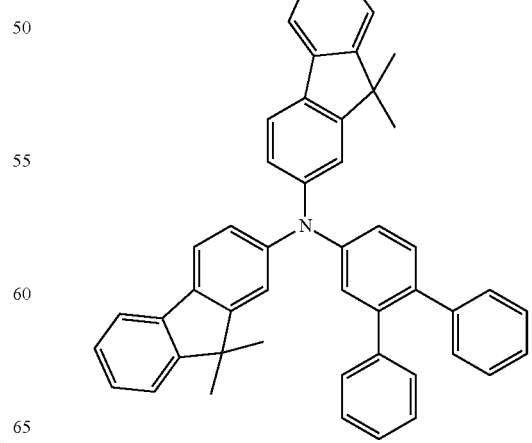

(1-62)

The structure of the obtained white powder was identified using NMR. In $^1$H-NMR (THF-d$_8$), the following signals of 39 hydrogens were detected.

δ (ppm)=7.70-7.63 (3H)
7.44-7.02 (24H)
1.46 (12H)

Synthesis Example 10: Compound 1-108

Synthesis of bis(6-phenylbiphenyl-3-yl)-(biphenyl-4-yl)amine

Reactions were conducted under similar conditions to those of Synthesis Example 1, except that bis(biphenyl-4-yl)-(6-bromobiphenyl-3-yl)amine was replaced with bis(6-bromobiphenyl-3-yl)-(biphenyl-4-yl)amine.

As a result, 10.2 g (with a yield of 73%) of white powder of compound 1-108 was obtained.

[Chem. 29]

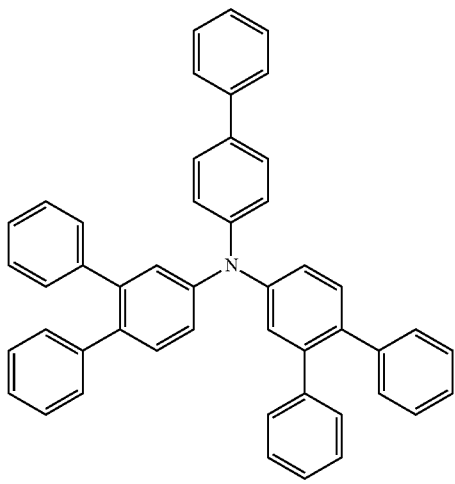

(1-108)

The structure of the obtained white powder was identified using NMR. In $^1$H-NMR (CDCl$_3$), the following signals of 35 hydrogens were detected.

δ (ppm)=7.57-7.66 (4H)
7.10-7.49 (31H)

Synthesis Example 11: Compound 1-143

Synthesis of tris(6-phenylbiphenyl-3-yl)amine

Reactions were conducted under similar conditions to those of Synthesis Example 1, except that bis(biphenyl-4-yl)-(6-bromobiphenyl-3-yl)amine was replaced with tris(6-bromobiphenyl-3-yl)amine.

As a result, 11.1 g (with a yield of 75%) of white powder of compound 1-143 was obtained.

[Chem. 30]

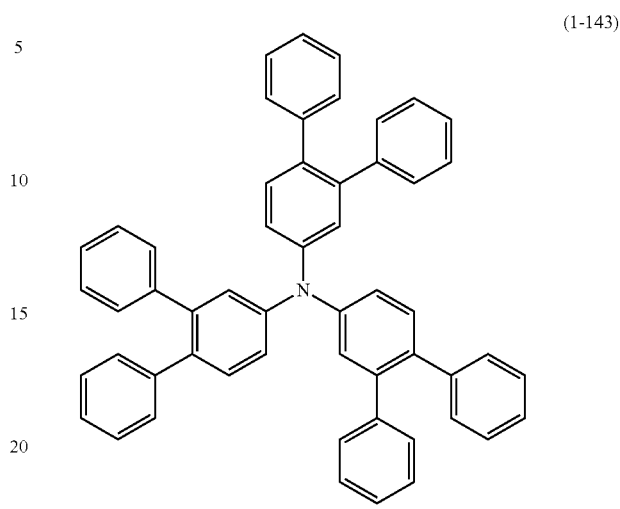

(1-143)

The structure of the obtained white powder was identified using NMR. In $^1$H-NMR (CDCl$_3$), the following signals of 39 hydrogens were detected.

δ (ppm)=7.35-7.42 (6H)
7.15-7.35 (33H)

<Melting Point and Glass Transition Point>

The melting point and the glass transition point of each arylamine compound I were measured using a high-sensitivity differential scanning calorimeter (DSC3100SA manufactured by Bruker AXS K.K.)

| | Melting Point | Glass Transition Point |
|---|---|---|
| Synthesis Example 2: Compound 1-3 | 242° C. | 103° C. |
| Synthesis Example 3: Compound 1-1 | Not observed | 115° C. |
| Synthesis Example 4: Compound 1-4 | Not observed | 104° C. |
| Synthesis Example 5: Compound 1-9 | Not observed | 117° C. |
| Synthesis Example 6: Compound 1-16 | Not observed | 107° C. |
| Synthesis Example 7: Compound 1-20 | 240° C. | 127° C. |
| Synthesis Example 8: Compound 1-56 | Not observed | 116° C. |
| Synthesis Example 9: Compound 1-62 | Not observed | 119° C. |
| Synthesis Example 10: Compound 1-108 | Not observed | 101° C. |
| Synthesis Example 11: Compound 1-143 | Not observed | 112° C. |

The arylamine compounds I had a glass transition point of 100° C. or greater, that is, were stable in a thin film state.

<Work Function>

A vapor-deposited film with a thickness of 100 nm was formed on an ITO substrate by using each arylamine compound I, and the work function was measured using an ionization potential measuring device (PYS-202 from Sumitomo Heavy Industries, Ltd.).

| | Work function |
|---|---|
| Synthesis Example 1: Compound 1-2 | 5.68 eV |
| Synthesis Example 2: Compound 1-3 | 5.72 eV |
| Synthesis Example 3: Compound 1-1 | 5.66 eV |
| Synthesis Example 4: Compound 1-4 | 5.67 eV |

-continued

| | Work function |
|---|---|
| Synthesis Example 5: Compound 1-9 | 5.70 eV |
| Synthesis Example 6: Compound 1-16 | 5.71 eV |
| Synthesis Example 7: Compound 1-20 | 5.66 eV |
| Synthesis Example 8: Compound 1-56 | 5.62 eV |
| Synthesis Example 9: Compound 1-62 | 5.55 eV |
| Synthesis Example 10: Compound 1-108 | 5.72 eV |
| Synthesis Example 11: Compound 1-143 | 5.75 eV |

The arylamine compounds I exhibited favorable energy levels when compared with 5.4 eV, which is the work function of common hole transport materials such as NPD and TPD, that is, had satisfactory hole transportability.

Example 1

An ITO electrode serving as a transparent anode 2 was formed on a glass substrate 1 beforehand, and a hole injection layer 3, a first hole transport layer 4, a second hole transport layer 5, a light emitting layer 6, an electron transport layer 7, an electron injection layer 8, and a cathode (aluminum electrode) 9 were vapor-deposited in this order on the ITO electrode. Thus, an organic EL element shown in FIG. 56 was prepared.

Specifically, a glass substrate 1 on which an ITO film with a thickness of 150 nm was formed was ultrasonically cleaned in isopropyl alcohol for 20 minutes, and then dried for 10 minutes on a hot plate heated to 200° C.

After that, UV/ozone treatment was performed for 15 minutes. Then, the glass substrate with ITO was attached inside a vacuum vapor deposition machine, and the pressure in the vacuum vapor deposition machine was reduced to 0.001 Pa or less.

Subsequently, a compound 6 having the structural formula below was vapor-deposited so as to cover the transparent anode 2, and thus, a hole injection layer 3 with a thickness of 5 nm was formed.

[Chem. 31]

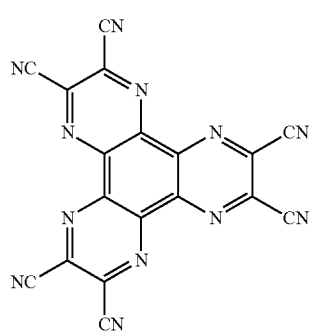

(6)

A compound 5-1 having the structural formula below was vapor-deposited on the hole injection layer 3 to thereby form a first hole transport layer 4 with a thickness of 60 nm.

[Chem. 32]

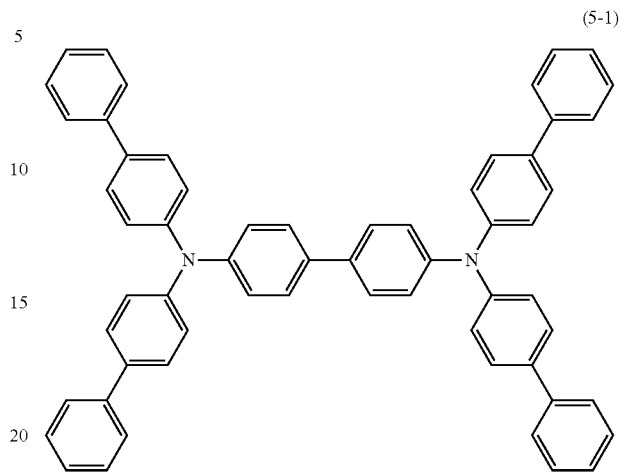

(5-1)

The compound 1-4 of Synthesis Example 4 was vapor-deposited on the first hole transport layer 4 to thereby form a second hole transport layer 5 with a thickness of 5 nm.

[Chem. 33]

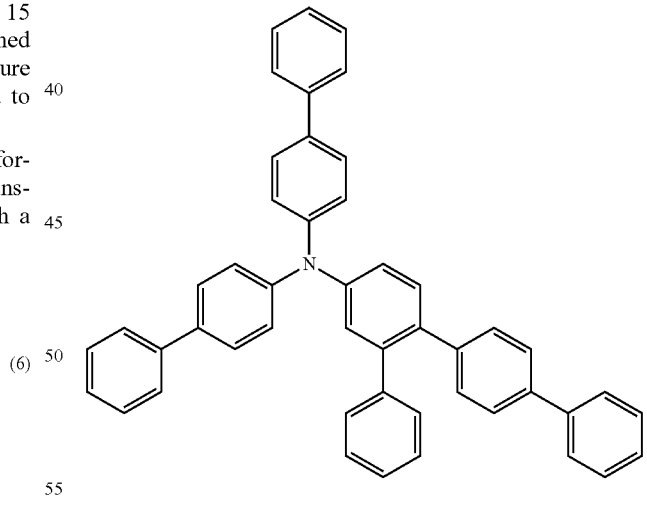

(1-4)

A compound 7-A having the structural formula below and a compound 8-A having the structural formula below were vapor-deposited on the second hole transport layer 5 through binary vapor deposition at such rates that the ratio of the vapor deposition rate of the compound 7-A to the vapor deposition rate of the compound 8-A was 5:95, and thus, a light emitting layer 6 with a thickness of 20 nm was formed.

[Chem. 34]

(7-A)

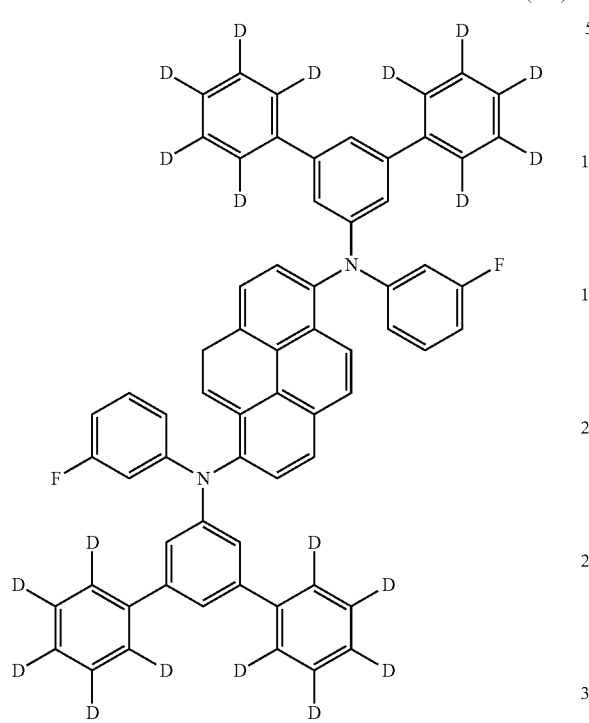

[Chem. 35]

(2-92)

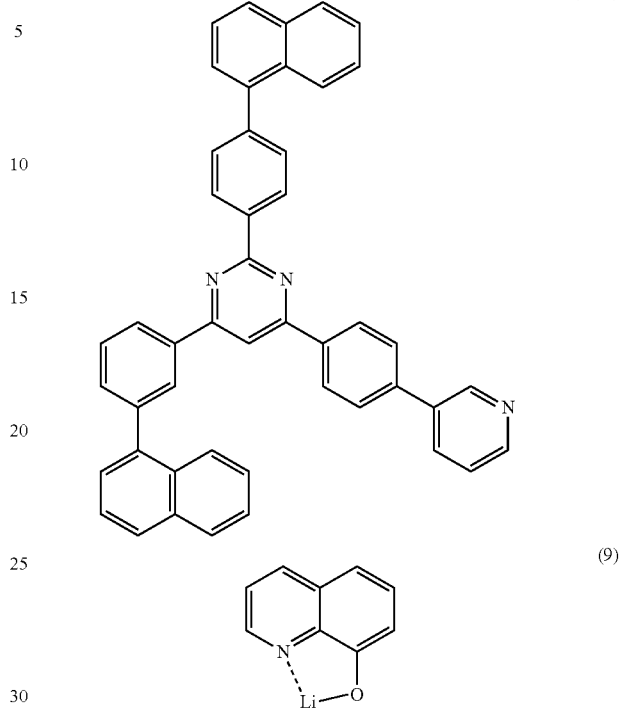

(9)

Lithium fluoride was vapor-deposited on the electron transport layer 7 to thereby form an electron injection layer 8 with a thickness of 1 nm.

Finally, aluminum was vapor-deposited to a thickness of 100 nm to thereby form a cathode 9.

Example 2

An organic EL element was prepared under similar conditions to those of Example 1, except that the compound 1-4 of Synthesis Example 4 serving as the material of the second hole transport layer 5 was replaced with the compound 1-9 of Synthesis Example 5.

[Chem. 36]

(1-9)

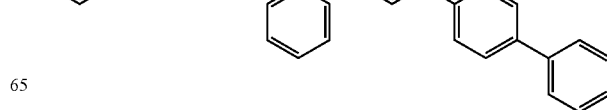

(8-A)

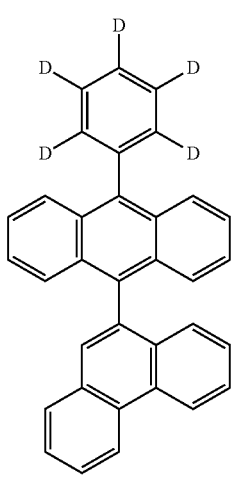

A compound 2-92 having the structural formula below and a compound 9 having the structural formula below were vapor-deposited on the light emitting layer 6 through binary vapor deposition at such rates that the ratio of the vapor deposition rate of the compound 2-92 to the vapor deposition rate of the compound 9 was 50:50, and thus, an electron transport layer 7 with a thickness of 30 nm was formed.

Example 3

An organic EL element was prepared under similar conditions to those of Example 1, except that the compound 2-92 serving as the material of the electron transport layer 7 was replaced with a compound 2-123 having the following structural formula.

[Chem. 37]

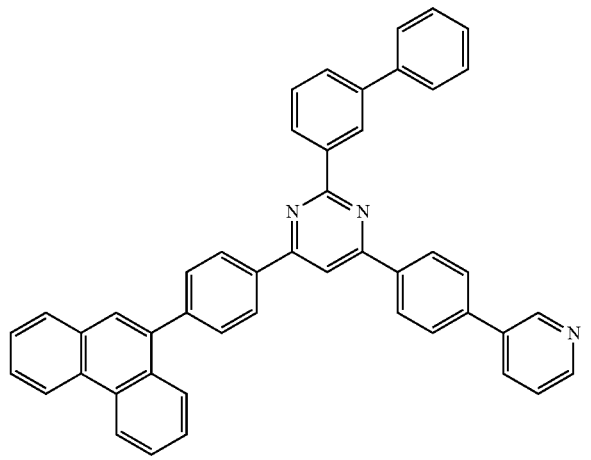

(2-123)

Example 4

An organic EL element was prepared under similar conditions to those of Example 3, except that the compound 1-4 of Synthesis Example 4 serving as the material of the second hole transport layer 5 was replaced with the compound 1-9 of Synthesis Example 5.

Example 5

An organic EL element was prepared under similar conditions to those of Example 1, except that the compound 2-92 serving as the material of the electron transport layer 7 was replaced with a compound 2-124 having the following structural formula.

[Chem. 38]

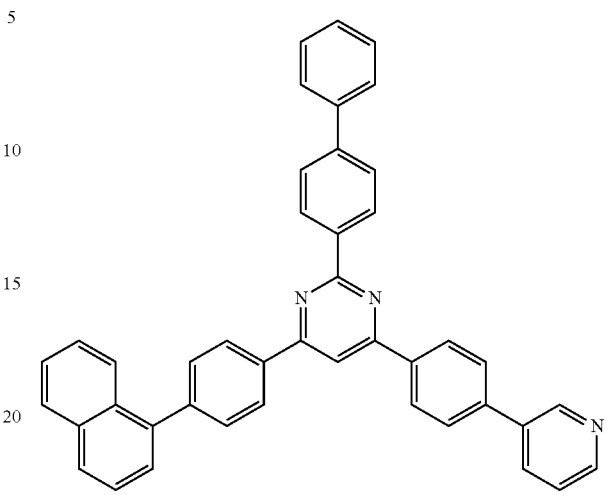

(2-124)

Example 6

An organic EL element was prepared under similar conditions to those of Example 5, except that the compound 1-4 of Synthesis Example 4 serving as the material of the second hole transport layer 5 was replaced with the compound 1-9 of Synthesis Example 5.

Example 7

An organic EL element was prepared under similar conditions to those of Example 1, except that the compound 2-92 serving as the material of the electron transport layer 7 was replaced with a compound 2-125 having the following structural formula.

[Chem. 39]

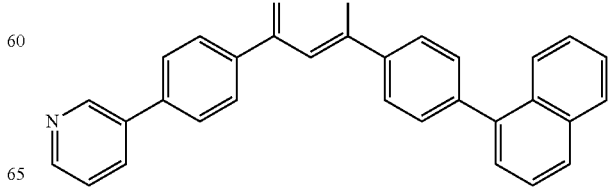

(2-125)

Example 8

An organic EL element was prepared under similar conditions to those of Example 7, except that the compound 1-4 of Synthesis Example 4 serving as the material of the second hole transport layer 5 was replaced with the compound 1-9 of Synthesis Example 5.

Comparative Example 1

An organic EL element was prepared under similar conditions to those of Example 1, except that the compound 1-4 of Synthesis Example 4 serving as the material of the second hole transport layer 5 was replaced with the compound 5-1. In this case, the first hole transport layer 4 and the second hole transport layer 5 functioned as an integrated hole transport layer (with a thickness of 65 nm).

Comparative Example 2

An organic EL element was prepared under similar conditions to those of
Example 3, except that the compound 1-4 of Synthesis Example 4 serving as the material of the second hole transport layer 5 was replaced with the compound 5-1. In this case, the first hole transport layer 4 and the second hole transport layer 5 functioned as an integrated hole transport layer (with a thickness of 65 nm).

Comparative Example 3

An organic EL element was prepared under similar conditions to those of Example 5, except that the compound 1-4 of Synthesis Example 4 serving as the material of the second hole transport layer 5 was replaced with the compound 5-1. In this case, the first hole transport layer 4 and the second hole transport layer 5 functioned as an integrated hole transport layer (with a thickness of 65 nm).

Comparative Example 4

An organic EL element was prepared under similar conditions to those of Example 7, except that the compound 1-4 of Synthesis Example 4 serving as the material of the second hole transport layer 5 was replaced with the compound 5-1. In this case, the first hole transport layer 4 and the second hole transport layer 5 functioned as an integrated hole transport layer (with a thickness of 65 nm).

Comparative Example 5

An organic EL element was prepared under similar conditions to those of Example 1, except that the compound 1-4 of Synthesis Example 4 serving as the material of the second hole transport layer 5 was replaced with the compound 5-1, and the compound 2-92 serving as the material of the electron transport layer 7 was replaced with ETM-1 (see WO 2003/060956) having the structural formula below. In this case, the first hole transport layer 4 and the second hole transport layer 5 functioned as an integrated hole transport layer (with a thickness of 65 nm).

[Chem. 40]

(ETM-1)

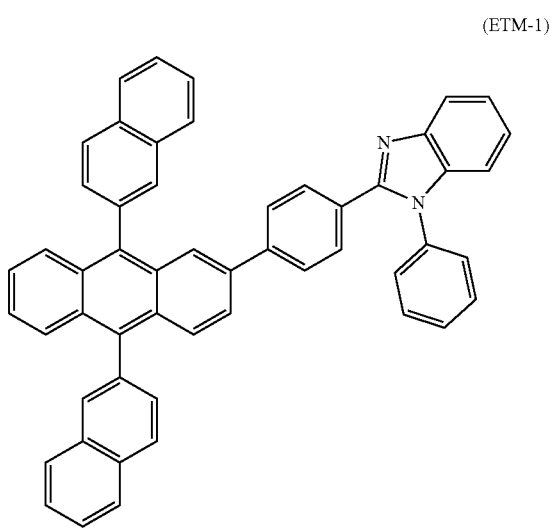

The characteristics of the organic EL elements prepared in Examples 1 to 8 and Comparative Examples 1 to 5 were measured in an atmosphere at normal temperature. Light emission characteristics were measured by applying a DC voltage to the prepared organic EL elements. Table 1 shows the results.

Also, the element lifespan was measured. Table 1 shows the results. The element lifespan was defined as the time taken for light emission luminance to decay to 1,900 cd/m$^2$ (corresponding to 95% of the initial luminance being set to 100%: at a decay of 95%) when constant current driving is performed, with the light emission luminance (initial luminance) when light emission started being set to 2,000 cd/m$^2$.

TABLE 1

| | First hole transport layer | Second hole transport layer | Electron transport layer | Voltage [V] (@ 10 mA/cm$^2$) | Luminance [cd/m$^2$] (@ 10 mA/cm$^2$) | Light emission efficiency [cd/A] (@ 10 mA/cm$^2$) | Power efficiency [lm/W] (@ 10 mA/cm$^2$) | Element lifespan at a decay of 95% |
|---|---|---|---|---|---|---|---|---|
| Ex. 1 | Compound 5-1 | Compound 1-4 | Compound 2-92/ Compound 9 | 3.86 | 958 | 9.55 | 7.77 | 180 hr |
| Ex. 2 | Compound 5-1 | Compound 1-9 | Compound 2-92/ Compound 9 | 3.86 | 945 | 9.42 | 7.67 | 215 hr |
| Ex. 3 | Compound 5-1 | Compound 1-4 | Compound 2-123/ Compound 9 | 3.87 | 964 | 9.61 | 7.80 | 267 hr |
| Ex. 4 | Compound 5-1 | Compound 1-9 | Compound 2-123/ Compound 9 | 3.87 | 940 | 9.36 | 7.60 | 221 hr |
| Ex. 5 | Compound 5-1 | Compound 1-4 | Compound 2-124/ Compound 9 | 3.85 | 945 | 9.42 | 7.69 | 180 hr |
| Ex. 6 | Compound 5-1 | Compound 1-9 | Compound 2-124/ Compound 9 | 3.86 | 910 | 9.09 | 7.40 | 150 hr |
| Ex. 7 | Compound 5-1 | Compound 1-4 | Compound 2-125/ Compound 9 | 3.84 | 975 | 9.81 | 8.03 | 301 hr |

TABLE 1-continued

| | First hole transport layer | Second hole transport layer | Electron transport layer | Voltage [V] (@ 10 mA/cm$^2$) | Luminance [cd/m$^2$] (@ 10 mA/cm$^2$) | Light emission efficiency [cd/A] (@ 10 mA/cm$^2$) | Power efficiency [lm/W] (@ 10 mA/cm$^2$) | Element lifespan at a decay of 95% |
|---|---|---|---|---|---|---|---|---|
| Ex. 8 | Compound 5-1 | Compound 1-9 | Compound 2-125/ Compound 9 | 3.84 | 980 | 9.85 | 8.06 | 255 hr |
| Com. Ex. 1 | Compound 5-1 | Compound 5-1 | Compound 2-92/ Compound 9 | 3.76 | 795 | 7.95 | 6.65 | 83 hr |
| Com. Ex. 2 | Compound 5-1 | Compound 5-1 | Compound 2-123/ Compound 9 | 3.69 | 796 | 7.96 | 6.78 | 87 hr |
| Com. Ex. 3 | Compound 5-1 | Compound 5-1 | Compound 2-124/ Compound 9 | 3.72 | 770 | 7.73 | 6.54 | 88 hr |
| Com. Ex. 4 | Compound 5-1 | Compound 5-1 | Compound 2-125/ Compound 9 | 3.72 | 795 | 7.99 | 6.75 | 95 hr |
| Com. Ex. 5 | Compound 5-1 | Compound 5-1 | ETM-1/ Compound 9 | 3.84 | 635 | 6.35 | 5.20 | 55 hr |

With regard to the light emission efficiency at an electric current density of 10 mA/cm$^2$, Examples 1 to 8 exhibited higher efficiency than Comparative Examples 1 to 5.

With regard to the power efficiency as well, Examples 1 to 8 exhibited higher efficiency than Comparative Examples 1 to 5.

With regard to the element lifespan (at a decay of 95%) as well, Examples 1 to 8 exhibited significant increases in lifespan compared with Comparative Examples 1 to 5.

According to the present invention, an organic EL element having high light emission efficiency and a long lifespan is realized by combining a specific arylamine compound and a specific pyrimidine derivative such that holes and electrons can be efficiently injected and transported to a light emitting layer. Furthermore, according to a preferred embodiment, a combination of the material of a first hole transport layer and the material of a second hole transport layer, the combination having better carrier balance so that holes can be more efficiently injected and transported to the light emitting layer, is obtained by using a specific triarylamine compound as the material of the first hole transport layer. Therefore, an organic EL element having high light emission efficiency and an even longer lifespan can be realized.

INDUSTRIAL APPLICABILITY

An organic EL element of the present invention, in which a specific arylamine compound and a specific pyrimidine derivative are combined, and preferably a specific triarylamine compound is further combined therewith, has increased light emission efficiency and significantly improved durability. Therefore, the organic EL element of the present invention can be applied to, for example, home electric appliances and lighting equipment.

LIST OF REFERENCE NUMERALS

1 Glass Substrate
2 Transparent Anode
3 Hole Injection Layer
4 First Hole Transport Layer
5 Second Hole Transport Layer
6 Light Emitting Layer
7 Electron Transport Layer
8 Electron Injection Layer
9 Cathode

The invention claimed is:

1. An organic electroluminescent element having at least an anode, a hole injection layer, a first hole transport layer, a second hole transport layer, a light emitting layer, an electron transport layer, and a cathode, in this order,
wherein the second hole transport layer contains an arylamine compound represented by the general formula (1) below, and
the electron transport layer contains a pyrimidine derivative represented by formula (2-125) below:

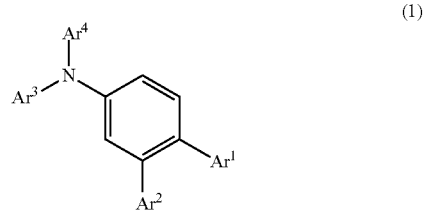

where $Ar^1$ to $Ar^4$ may be the same or different, and represent an aromatic hydrocarbon group, an aromatic heterocyclic group, or a condensed polycyclic aromatic group; and

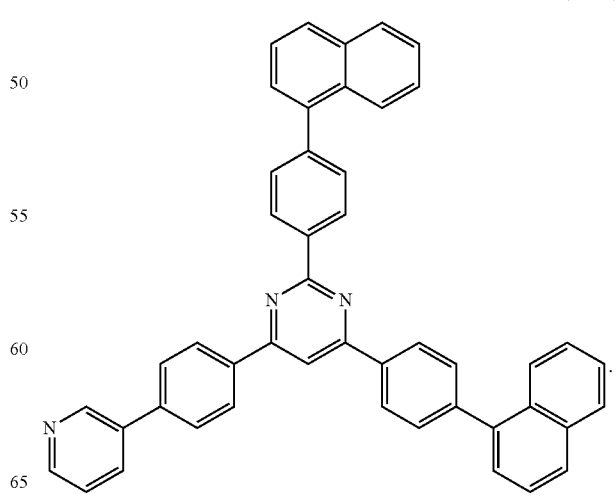

2. The organic electroluminescent element according to claim 1,
wherein the first hole transport layer contains a triarylamine compound having three to six triarylamine structures in a molecule, the triarylamine structures being linked via a divalent group having no heteroatom or a single bond.

3. The organic electroluminescent element according to claim 2,
wherein the triarylamine compound represented by the following general formula (4), is a triarylamine compound that has four triarylamine structures in a molecule:

[Chem. 4]

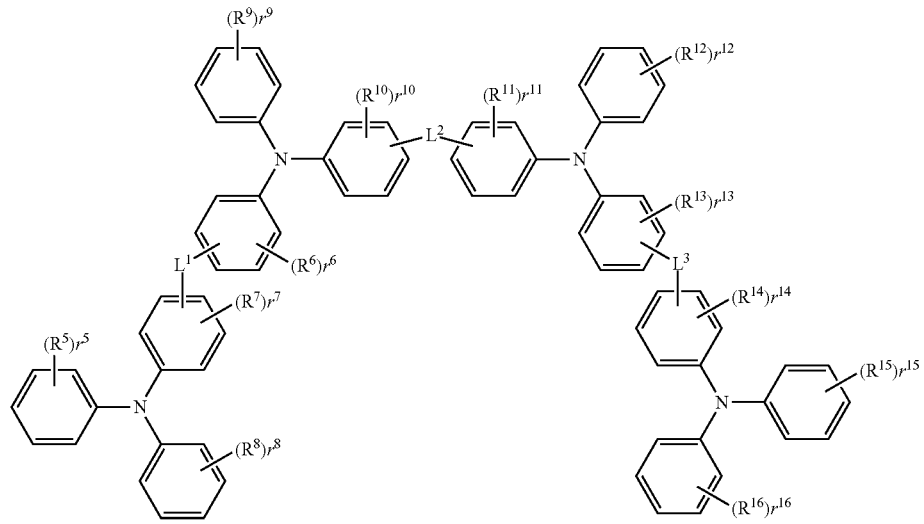

(4)

where $R^5$ to $R^{16}$ may be the same or different, and represent a heavy hydrogen atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a condensed polycyclic aromatic group, or an aryloxy group, $r^5, r^6, r^9, r^{12}, r^{15}$, and $r^{16}$ may be the same or different, and represent an integer of 0 to 5, $r^7, r^8, r^{10}, r^{11}, r^{13}$, and $r^{14}$ may be the same or different, and represent an integer of 0 to 4, when $r^5, r^6, r^9, r^{12}, r^{15}$, or $r^{16}$ is an integer of 2 to 5, or when $r^7, r^8, r^{10}, r^{11}, r^{13}$, or $r^{14}$ is an integer of 2 to 4, the plurality of atoms or groups represented by the corresponding one of $R^5$ to $R^{16}$ which are bonded to the same benzene ring, may be the same or different, and may be bonded to each other to form a ring via a single bond, a methylene group, an oxygen atom, or a sulfur atom, and $L^1$ to $L^3$ may be the same or different, and represent a divalent group represented by any of the following structural formulae (B) to (G) or a single bond:

[Chem. 5]

(B)

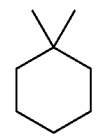
(C)

-continued

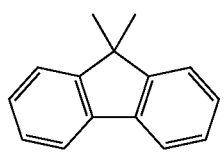
(D)

—CH$_2$— (E)

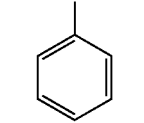
(F)

(G)

where n1 represents an integer of 1 to 3.

4. The organic electroluminescent element according to claim 1,
wherein the first hole transport layer contains a triarylamine compound having two triarylamine structures in a molecule, the triarylamine structures being linked via a divalent group having no heteroatom or a single bond.

5. The organic electroluminescent element according to claim 4,
wherein the triarylamine compound is represented by the following general formula (5):

[Chem. 6]

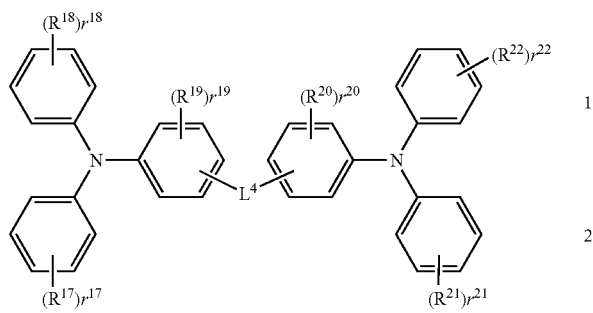
(5)

where $R^{17}$ to $R^{22}$ may be the same or different, and represent a heavy hydrogen atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a condensed polycyclic aromatic group, or an aryloxy group, $r^{17}$, $r^{18}$, $r^{21}$, and $r^{22}$ may be the same or different, and represent an integer of 0 to 5, $r^{19}$ and $r^{20}$ may be the same or different, and represent an integer of 0 to 4, when $r^{17}$, $r^{18}$, $r^{21}$, or $r^{22}$ is an integer of 2 to 5, or when $r^{19}$ or $r^{20}$ is an integer of 2 to 4, the plurality of atoms or groups represented by the corresponding one of $R^{17}$ to $R^{22}$ which are bonded to the same benzene ring, may be the same or different, and may be bonded to each other to form a ring via a single bond, a methylene group, an oxygen atom, or a sulfur atom, and $L^4$ represents a divalent group represented by any of the structural formulae (C) to (G) below or a single bond:

[Chem. 7]

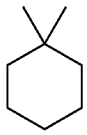
(C)

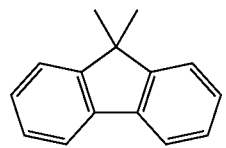
(D)

—CH$_2$— (E)

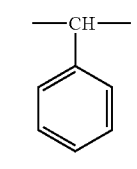
(F)

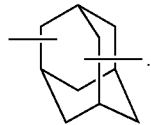
(G)

* * * * *